US012745430B2

(12) United States Patent
Lin et al.

(10) Patent No.: US 12,745,430 B2
(45) Date of Patent: Sep. 22, 2026

(54) THRESHOLD VOLTAGE MODULATION BY GATE HEIGHT VARIATION

(71) Applicant: Taiwan Semiconductor Manufacturing Company, Ltd., Hsinchu (TW)

(72) Inventors: Ta-Chun Lin, Hsinchu (TW); Chih-Pin Tsao, Hsinchu County (TW); Chih-Hao Chang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 783 days.

(21) Appl. No.: 17/899,021

(22) Filed: Aug. 30, 2022

(65) Prior Publication Data

US 2024/0014256 A1 Jan. 11, 2024

Related U.S. Application Data

(60) Provisional application No. 63/393,489, filed on Jul. 29, 2022, provisional application No. 63/359,284, filed on Jul. 8, 2022.

(51) Int. Cl.
*H10D 62/10* (2025.01)
*H10D 30/01* (2025.01)
(Continued)

(52) U.S. Cl.
CPC ....... *H10D 62/102* (2025.01); *H10D 30/0227* (2025.01); *H10D 30/6211* (2025.01);
(Continued)

(58) Field of Classification Search
CPC ....... H10D 30/019; H10D 30/501–509; H10D 30/673–6739; H10D 64/017;
(Continued)

(56) References Cited

U.S. PATENT DOCUMENTS

2005/0142767 A1 6/2005 Jin
2012/0146154 A1* 6/2012 Itou ...................... H10D 84/038 257/369

(Continued)

FOREIGN PATENT DOCUMENTS

CN 113257898 A * 8/2021 ............. H10D 30/62
DE 102019212543 A1 2/2020

(Continued)

OTHER PUBLICATIONS

Erben, Elke et. al "Work Function Setting in high-k Metal Gate Devices". https://www.intechopen.com/chapters/61888 (Year: 2018).*

*Primary Examiner* — Britt Hanley
*Assistant Examiner* — Jason James Greaving
(74) *Attorney, Agent, or Firm* — HAYNES AND BOONE, LLP

(57) ABSTRACT

Semiconductor devices and methods of forming the same are provided. A semiconductor structure includes a substrate, a first active region, a second active region and a third active region over the substrate, a first gate structure over a channel region of the first active region, a second gate structure over a channel region of the second active region, a third gate structure over a channel region of the third active region, a first cap layer over the first gate structure, a second cap layer over the second gate structure, and a third cap layer over the third gate structure. A height of the second gate structure is smaller than a height of the first gate structure or a height of the third gate structure.

20 Claims, 43 Drawing Sheets

(51) Int. Cl.
*H10D 30/62* (2025.01)
*H10D 64/01* (2025.01)
*H10D 84/01* (2026.01)

(52) U.S. Cl.
CPC ......... *H10D 64/021* (2025.01); *H10D 64/027* (2025.01); *H10D 84/014* (2025.01); *H10D 84/0142* (2025.01)

(58) Field of Classification Search
CPC ........... H10D 84/0179; H10D 84/0142; H10D 30/014; H10D 30/43; H10D 64/025–027; H10D 64/015; H10D 64/517–518
See application file for complete search history.

(56) References Cited

U.S. PATENT DOCUMENTS

2014/0256135 A1 9/2014 Javorka
2015/0206876 A1* 7/2015 Alptekin .............. H10D 30/751 257/192
2015/0311206 A1 10/2015 Hong
2016/0240624 A1 8/2016 Zhu
2017/0309625 A1* 10/2017 Kim ..................... H10D 84/038
2018/0174915 A1 6/2018 Tsai
2019/0165123 A1* 5/2019 Lo ........................ H10D 84/834
2020/0020541 A1* 1/2020 Chang ............... H01L 21/76823
2020/0411387 A1 12/2020 Chiang
2020/0411662 A1* 12/2020 Lin .................... H10D 30/0415
2022/0238373 A1 7/2022 Chuang

FOREIGN PATENT DOCUMENTS

KR 20120089357 A 8/2012
TW 201735178 A 10/2017
TW 202217977 A 5/2022

* cited by examiner

THRESHOLD VOLTAGE MODULATION BY GATE HEIGHT VARIATION

PRIORITY DATA

This application claims priority to U.S. Provisional Patent Application No. 63/359,284, filed on Jul. 8, 2022, and U.S. Provisional Patent Application No. 63/393,489, filed on Jul. 29, 2022, the entire disclosures of which are hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

Gate replacement processes may be used to fabricate a multi-gate transistor such as a fin-type field effect transistor (FinFET) or a multi-bridge-channel (MBC) transistor. Taking fabrication of a FinFET as an example, a dummy gate is first formed over a channel region of a semiconductor fin structure and a gate spacer is formed along sidewalls of the dummy gate. The dummy gate is subsequently removed and replaced with a metal gate structure that includes a gate dielectric layer and work function layers. In some processes, the metal gate structure is recessed to make room for a dielectric cap layer to protect the metal gate structure during subsequent self-aligned contact formation processes. While existing multi-gate transistors and processes for forming them are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
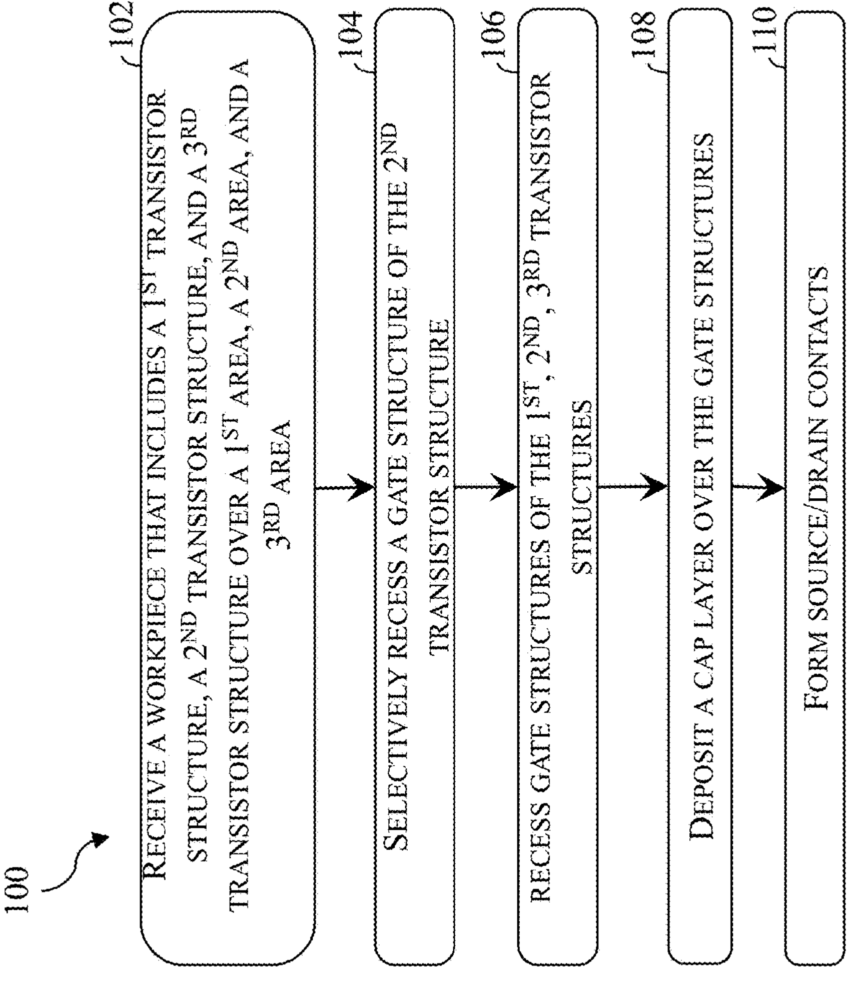
FIG. 1 is a flowchart of a method for fabricating transistors having different threshold voltages, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As integrated circuit (IC) technologies progress towards smaller technology nodes, multi-gate metal-oxide-semiconductor field effect transistor (multi-gate MO SFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Self-aligned contact technology is helpful in forming contacts to ever-smaller multi-gate transistor structures. To allow for self-aligned formation of contact structures, self-aligned capping layers may be formed over a metal gate structure of a multi-gate device. The formation of such self-aligned capping layers includes recessing the metal gate structure to form a recess and depositing a dielectric cap in the recess. The present disclosure provides processes and structures to form transistors of different threshold voltages. It has been observed that the gate recess process may consume certain threshold-voltage-determining species, such as aluminum. For example, consumption of aluminum during the gate recess processes may have opposite effects on n-type and p-type transistors when it comes to threshold voltage modulation. Embodiments of the present disclosure include different approaches to recess gate structures differently to achieve different threshold voltages for different transistors.

The various aspects of the present disclosure will now be described in more detail with reference to the figures. FIGS. 1, 8, 12, 17, 24, and 31 are flowcharts of methods 100, 300, 400, 500, 600, and 700 for fabricating semiconductor devices of different threshold voltages. Each of methods 100, 300, 400, 500, 600, and 700 is merely an example and is not intended to limit the present disclosure to what is explicitly illustrated in such method. Additional steps can be provided before, during, and after method 100, 300, 400, 500, 600, or 700, and some of the steps described can be moved, replaced, or eliminated for additional embodiments. Not all steps are described herein in detail for reasons of simplicity. Method 100 will be described below in conjunction with the fragmentary cross-sectional views of a workpiece 200 shown in FIGS. 2-7. Method 300 will be described below in conjunction with the fragmentary cross-sectional views of a workpiece 200 shown in FIGS. 9-11. Method 400 will be described below in conjunction with the fragmentary cross-sectional views of a workpiece 200 shown in FIGS. 13-16. Method 500 will be described below in conjunction with the fragmentary cross-sectional views of a workpiece 200 shown in FIGS. 18-23. Method 600 will be described below in conjunction with the fragmentary cross-sectional views of a workpiece 200 shown in FIGS. 25-30. Method 700 will be described below in conjunction with the fragmentary cross-sectional views of a workpiece 200 shown in FIGS. 32-40. Because a semiconductor device will be formed from the workpiece 200, the workpiece 200 may be referred to as semiconductor device 200 as the context requires. Additionally, throughout the present disclosure, like reference numerals denote like features, unless otherwise described.

Figure 2:
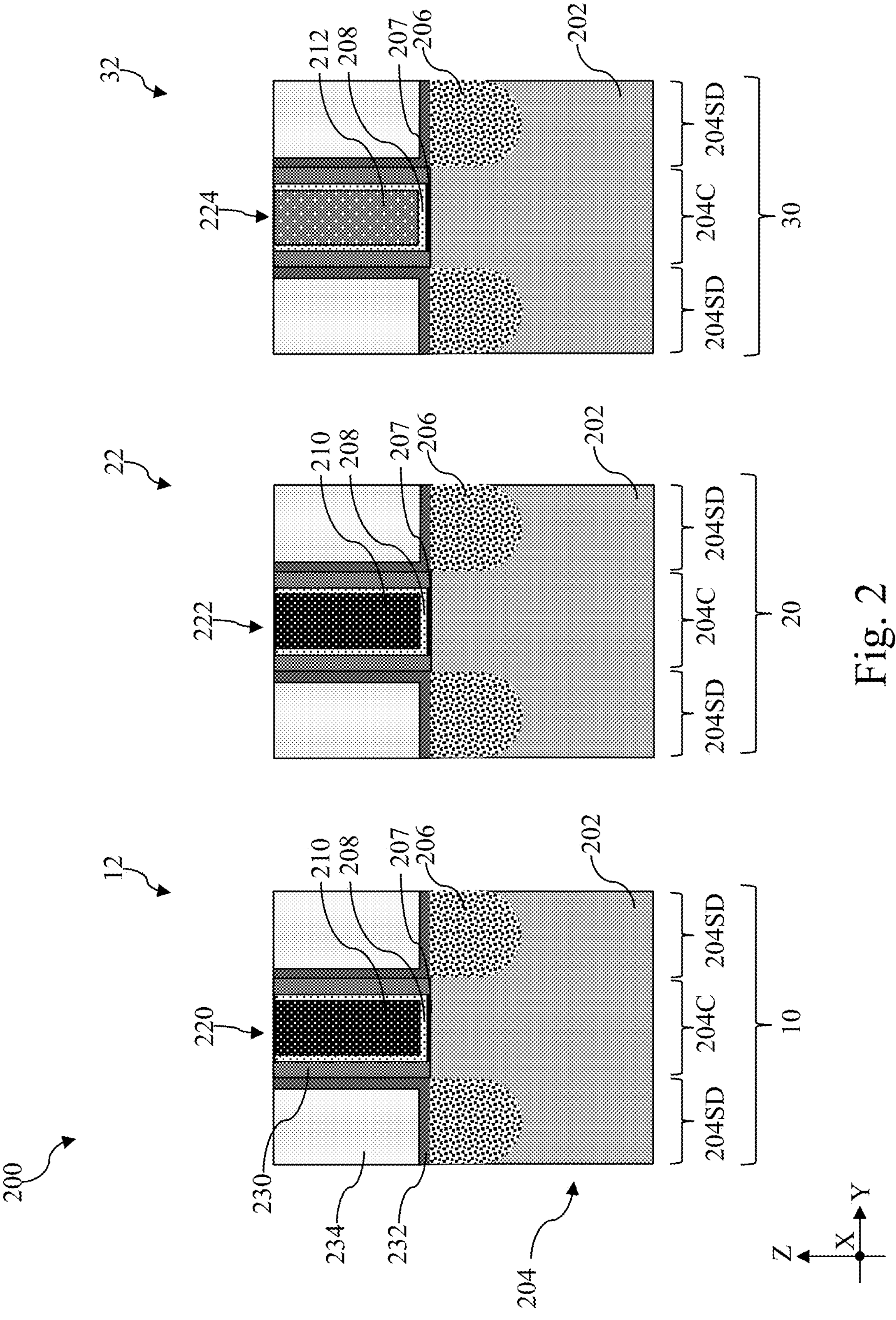
FIGS. 2-7 are fragmentary schematic cross-sectional views of a workpiece at various fabrication stages, such as those associated with the method in FIG. 1, according to various aspects of the present disclosure.

Referring to FIGS. 1 and 2, method 100 includes a block 102 where a workpiece 200 that includes a first transistor structure 12 over a first area 10, a second transistor structure 22 over a second area 20, and a third transistor structure 32 over a third area 30. The workpiece 200 includes a substrate 202. In the depicted embodiment, substrate 202 is a bulk substrate that includes silicon (Si). Alternatively, in some implementations, substrate 202 includes a bulk substrate (including, for example, silicon) and one or more material layers disposed over the bulk substrate. For example, the one or more material layers can include a semiconductor layer stack having various semiconductor layers (such as a heterostructure) disposed over the bulk substrate, where the semiconductor layer stack is subsequently patterned to form fins. The semiconductor layers can include any suitable semiconductor materials, such as silicon (Si), germanium (Ge), silicon germanium (SiGe), other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. Alternatively or additionally, the bulk substrate 202 and/or the one or more material layers include another elementary semiconductor, such as germanium (Ge); a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GalnAs), gallium indium phosphide (GalnP), and/or gallium indium arsenic phosphide (GalnAsP); other group III-V materials; other group II-V materials; or combinations thereof. Alternatively, substrate 202 is a semiconductor-oninsulator substrate, such as a silicon-on-insulator (SOI) substrate or a germanium-on-insulator (GeOI) substrate. Semiconductor-on-insulator substrates can be fabricated using separation by implantation of oxygen (SIMOX), wafer bonding, and/or other suitable methods. The substrate 202 may include different areas designated for formation of different devices. In the depicted embodiments, the substrate 202 includes a first area 10, a second area 20, and a third area 30. Although not explicitly shown in the figures, the first area 10, the second area 20 and the third area 30 may be disposed side-by-side or adjacent to one another on the substrate 202.

As shown in FIG. 2, the workpiece 200 also includes a first transistor structure 12 over the first area 10, a second transistor structure 22 over the second area 20, and a third transistor structure 32 over the third area 30. In the depicted embodiments, the first transistor structure 12, the second transistor structure 22 and the third transistor structure 32 are FinFET structures. For ease of illustration, each of the first transistor structure 12, the second transistor structure 22 and the third transistor structure 32 is formed over a fin 204 that is formed from the substrate 202 or semiconductor layers deposited over the substrate 202. Over each of the first area 10, the second area 20 and the third area 30, the fin 204 includes a channel region 204C sandwiched between two source/drain regions 204S/D. In the first area 10, the first transistor structure 12 includes a first gate structure 220 wrapping over the channel region 204C and the channel region 204C is disposed between two source/drain features 206 formed over the source/drain regions 204S/D. In the second area 20, the second transistor structure 22 includes a second gate structure 222 wrapping over the channel region 204C and the channel region 204C is disposed between two source/drain features 206 formed over the source/drain regions 204S/D. In the third area 30, the third transistor structure 32 includes a third gate structure 224 wrapping over the channel region 204C and the channel region 204C is disposed between two source/drain features 206 formed over the source/drain regions 204S/D. Each of the first gate structure 220, the second gate structure 222, and the third gate structure 224 is defined between two gate spacer layers 230. Each of the first transistor structure 12, the second transistor structure 22 and the third transistor structure 32 also includes a contact etch stop layer (CESL) 232 and an interlayer dielectric (ILD) layer 234 disposed over the source/drain features 206.

The fin 204, as well as other similar fins over the substrate 202, may be formed using one or more photolithography processes and one or more etching processes. In some implementations, the fin 204 may be formed using a single patterning process or a multiple-patterning process. Examples of multiple-patterning processes include a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. To form the fin 204, a fin top hard mask layer is deposited over the substrate 202 and then patterned to form a patterned fin top hard mask layer. The patterned fin-top hard mask layer is then applied as an etch mask to etch the substrate 202 (or a semiconductor layer stack thereon) to form the fin 204. The fin top hard mask layer may be a single layer or a multi-layer. In some instances, the fin top hard mask layer may include silicon nitride, silicon oxynitride, silicon carbonitride, silicon oxide or other suitable dielectric material.

In some embodiments, a gate replacement process may be adopted to form the first transistor structure 12, the second transistor structure 22, and the third transistor structure 32. In an example gate replacement process, dummy gate stacks are formed over the channel regions 204C in the first area 10, the second area 20 and the third area 30. The dummy gate stacks serve as a placeholder to undergo various processes and are to be removed and replaced by the first gate structure 220, the second gate structure 222, and the third gate structure 224. The dummy gate stack may include a dummy dielectric layer and a dummy electrode layer over the dummy dielectric layer. In some embodiments, the dummy dielectric layer may include silicon oxide and the dummy electrode layer may include polysilicon (poly Si). The dummy dielectric layer may be formed on the fin 204 using a chemical vapor deposition (CVD) process, an ALD process, an oxygen plasma oxidation process, a thermal oxidation process, or other suitable processes. The dummy electrode layer may be deposited over the dummy dielectric layer using a CVD process, an ALD process, or other suitable processes. To pattern the dummy dielectric layer and the dummy electrode layer into the dummy gate stack, a gate-top hard mask layer may be deposited on the dummy electrode layer using a CVD process, an ALD process, or other suitable processes. The gate-top hard mask layer is then patterned to serve as an etch mask to etch the dummy electrode layer and the dummy dielectric layer to form the dummy gate stack.

The gate spacer layers 230 may be deposited using ALD, CVD, or other suitable methods. In some implementations, the gate spacer layers 230 may include silicon oxycarbonitride, carbon doped silicon oxide, silicon nitride, silicon oxynitride, or a combination thereof. The source/drain features 206 may be epitaxially and selectively formed from surfaces of source/drain recesses formed in the source/drain regions 204S/D. Suitable epitaxial processes may include vapor-phase epitaxy (VPE), ultra-high vacuum CVD (UHV-CVD), molecular beam epitaxy (MBE), and/or other suitable processes. The epitaxial growth process for the source/drain features 206 may use gaseous precursors, which interact with the composition of the substrate 202 and the fin 204. Depending on the conductivity type of the transistor structures, the source/drain feature 206 may have different compositions. When the transistor structure in the semiconductor device 200 is n-type, the source/drain features 206 may include silicon (Si) and may be doped with an n-type dopant, such as phosphorus (P) or arsenic (As). When the transistor structure in the semiconductor device 200 is p-type, the source/drain features 206 may include silicon germanium (SiGe) and is doped with a p-type dopant, such as boron (B), boron difluoride ($BF_2$), or gallium (Ga). While not explicitly shown in FIG. 2, the source/drain feature 206 may include two or more epitaxial layers. For example, each of the source/drain features 206 may include a first epitaxial layer, a second epitaxial layer, and a third epitaxial layer that are doped with the same type of dopant but at different doping concentrations to reduce defect density and contact resistance. In one embodiment, the source/drain feature 206 may include phosphorus-doped silicon (Si:P) when n-type FinFETs are desired and may include boron-doped silicon germanium (SiGe:B) when p-type FinFETs are desired.

As shown in FIG. 2, the CESL 232 is formed prior to forming the ILD layer 234. In some examples, the CESL 232 includes silicon nitride, silicon oxynitride, and/or other materials known in the art. The CESL 232 may be formed by ALD, plasma-enhanced chemical vapor deposition (PECVD) process and/or other suitable deposition processes. The ILD layer 234 is then deposited over the CESL 232. In some embodiments, the ILD layer 234 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 234 may be deposited by a PECVD process or other suitable deposition technique. In some embodiments, after formation of the ILD layer 234, the workpiece 200 may be annealed to improve integrity of the ILD layer 234.

After the formation of the ILD layer 234, the dummy gate stacks are replaced with the first gate structure 220, the second gate structure 222 and the third gate structure 224. The dummy gate stack is removed from the workpiece 200 by a selective etch process. The removal of the dummy gate stack results in a gate trench over the channel region 204C in the first area 10, the second area 20 and the third area 30. After the removal of the dummy gate stack, the first gate structure 220, the second gate structure 222, and the third gate structure 224 are then deposited over the workpiece 200 to wrap over the channel region 204C in the first area 10, the second area 20 and the third area 30. Each of the first gate structure 220, the second gate structure 222 and the third gate structure 224 includes an interfacial layer 207 over the channel region 204C, a gate dielectric layer 208 over the interfacial layer 207. In some embodiments, the interfacial layer 207 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel region 204C to form the interfacial layer 207. The gate dielectric layer 208 is then deposited over the interfacial layer 207 using ALD, CVD, and/or other suitable methods. In one embodiment, the gate dielectric layer 208 may include hafnium oxide. Alternatively, the gate dielectric layer 208 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HMO), $(Ba,Sr)TiO_3$ (BST), silicon nitride (SiN), silicon oxynitride (SiON), combinations thereof, or other suitable material. After the deposition of the gate dielectric layer 208, work function layers are deposited over the gate dielectric layer 208 in the first area 10, the second area 20 and the third area 30.

Depending on the design, the first gate structure 220, the second gate structure 222 and the third gate structure 224 may include different work function layers. For example, the first gate structure 220 and the second gate structure 222 include n-type work function layer 210 and the third gate structure 224 includes p-type work function layer 212. The n-type work function layer 210 may include titanium aluminum (TiAl), titanium aluminum nitride (TiAlN), tantalum aluminum carbide (TaAlC), titanium aluminum carbide (TiAlC), silicon-doped tantalum aluminum carbide (TaAlC:Si), silicon-doped titanium aluminum carbide (TiAlC:Si) or a combination thereof. The p-type work function layer 212 may include titanium nitride (TiN), tantalum nitride (TaN), tantalum carbonitride (TaCN), tungsten carbonitride (WCN), titanium silicon nitride (TiSiN), tantalum silicon nitride (TaSiN), or tantalum carbide (TaC). While not explicitly shown, each of the first gate structure 220, the second gate structure 222 and the third gate structure 224 may further include a metal fill layer over the n-type work function layer 210 or the p-type work function layer 212. The metal fill layer may include aluminum (Al), tungsten (W), nickel (Ni), titanium (Ti), ruthenium (Ru), cobalt (Co), platinum (Pt), other refractory metals, or other suitable metal materials or a combination thereof.

Figure 3:
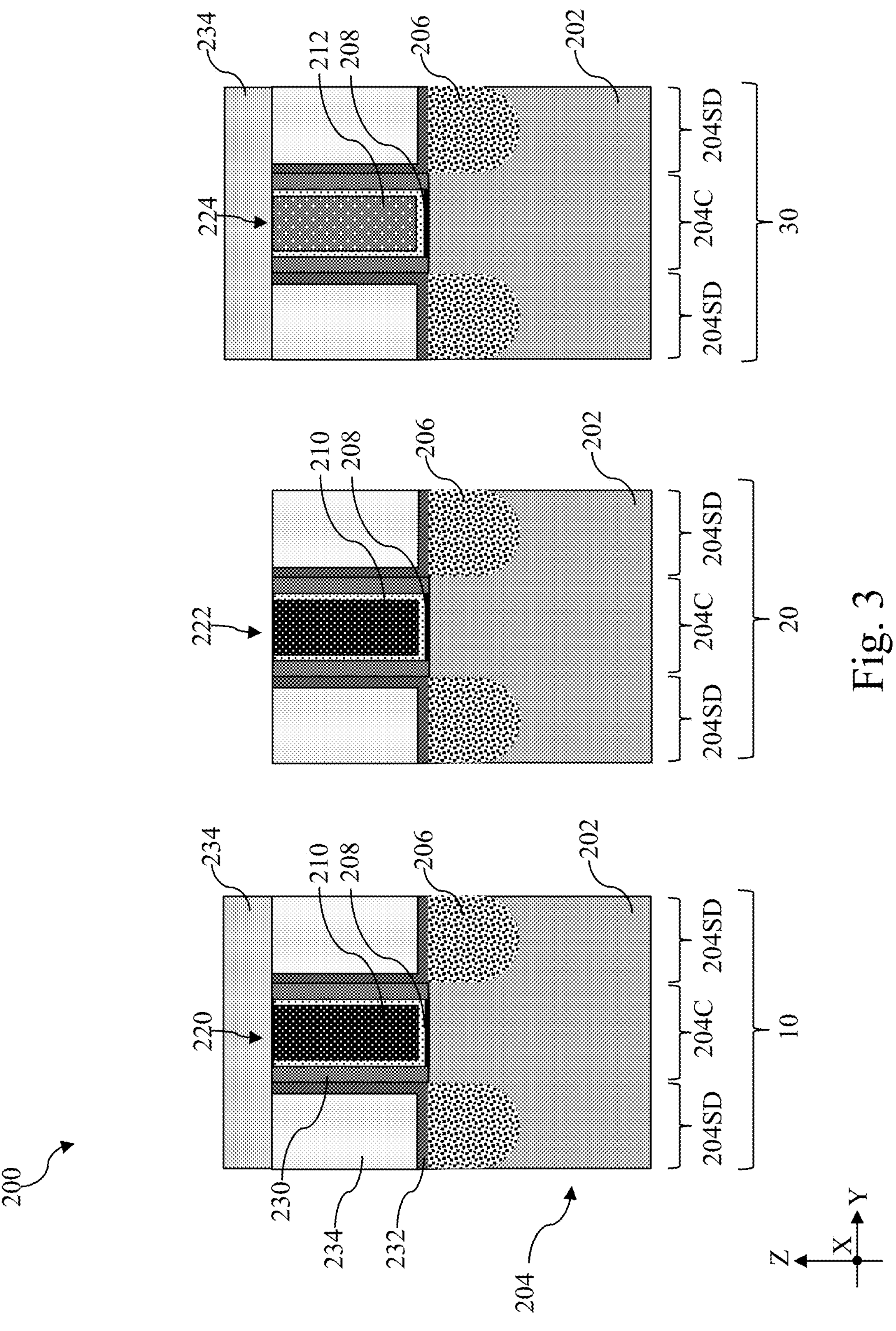
Figure 4:
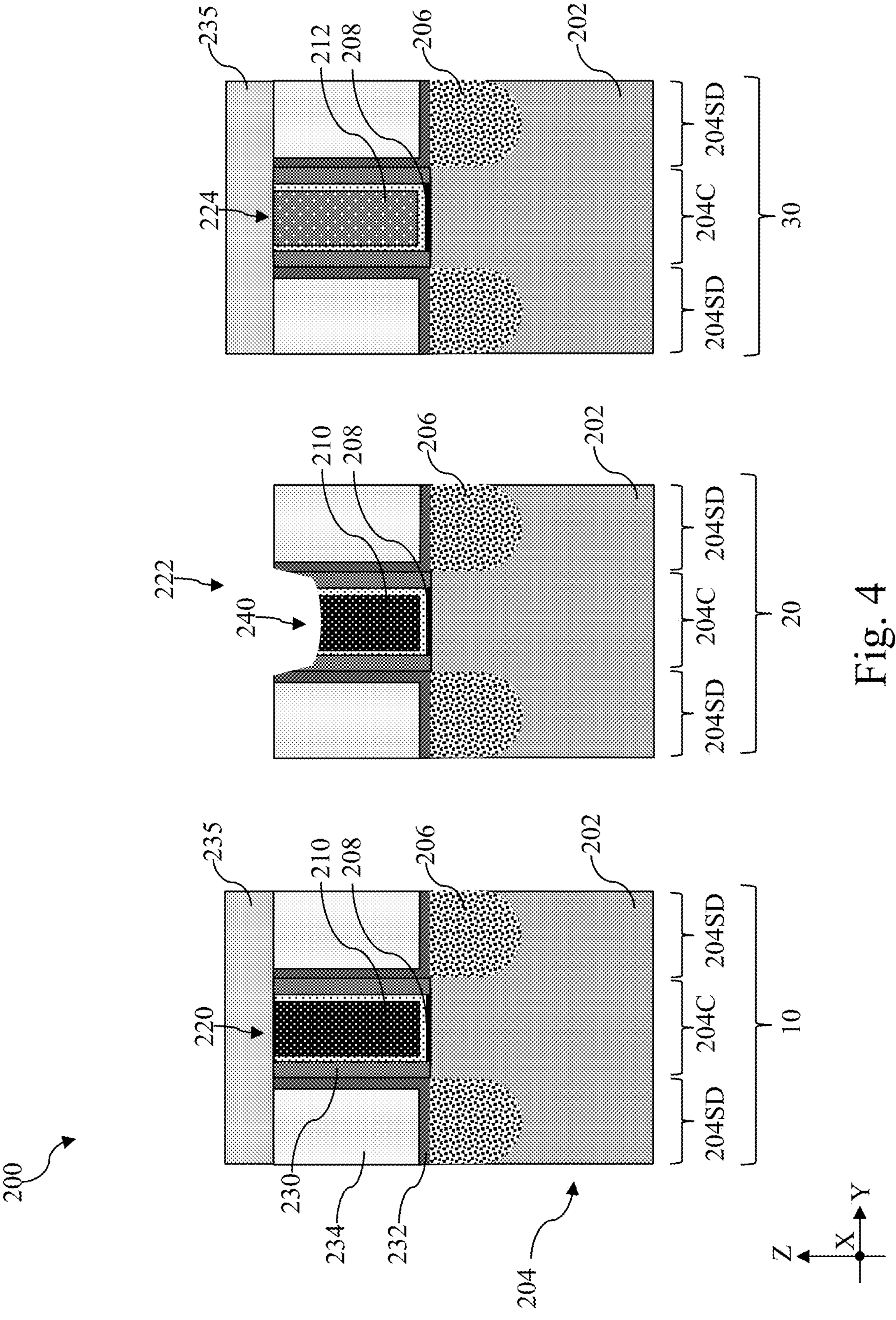

Referring to FIGS. 1, 3 and 4, method 100 includes a block 104 where the second gate structure 222 of the second transistor structure 22 is selectively recessed. The selective recessing at block 104 may include use of photolithography and etching processes. In the embodiments depicted in FIG. 3, a first patterned etch mask 235 is formed over the workpiece 200 to cover the first area 10 and the third area 30 while the second area 20 is exposed. The first patterned etch mask 235 may be a photoresist layer or a combination of a photoresist layer and a hard mask layer. The hard mask layer may include silicon oxide, silicon nitride, or a combination thereof. With the first patterned etch mask 235 in place, the workpiece 200 is subject to a dry etch process that etches the second gate structure 222 faster than it does the gate spacer layers 230, the CESL 232 and the ILD layer 234, as illustrated in FIG. 4 In some implementations, the dry etch process at block 104 may include a chlorine-containing species (e.g., $BCl_3$, $SiCl_4$, $Cl_2$), a fluorine-containing species (e.g., $CF_4$, or $SF_6$), a bromine-containing species (e.g., HBr), oxygen ($O_2$), or nitrogen ($N_2$). In some example dry etch processes, a flow rate for boron trichloride ($BCl_3$) may be between about 0 standard cubic centimeter per minute (SCCM) and about 1000 SCCM, a flow rate for chorine ($Cl_2$) may be between about 0 SCCM and about 1000 SCCM, a flow rate for hydrogen bromide (HBr) may be between about 0 SCCM and about 400 SCCM, a flow rate for silicon tetrachloride ($SiCl_4$) may be between about 0 SCCM and about 100 SCCM, a flow rate for oxygen ($O_2$) may be between about 0 SCCM and about 100 SCCM, a flow rate for nitrogen ($N_2$) may be between about 0 SCCM and about 100 SCCM, a flow rate for carbon tetrafluoride ($CF_4$) may be between about 0 SCCM and about 100 SCCM, and a flow rate for sulfur hexafluoride ($SF_6$) may be between about 0 SCCM and about 50 SCCM. In some implementations, a radio frequency (RF) power for the dry etch process may be between 300 W and about 1800 W and a bias power for the dry etch process may be between about 0 W and about 100 W. As shown in FIG. 4, the recessing at block 104 forms a pilot recess 240 in the second gate structure 222. After the formation of the pilot recess 240, the first patterned etch mask 235 over the first area 10 and the third area 30 is removed by, for example, ashing or selective etching. At this stage, due to the formation of the pilot recess 240, a height of the second gate structure 222 is smaller than that of the first gate structure 220 and the third gate structure 224.

Figure 5:
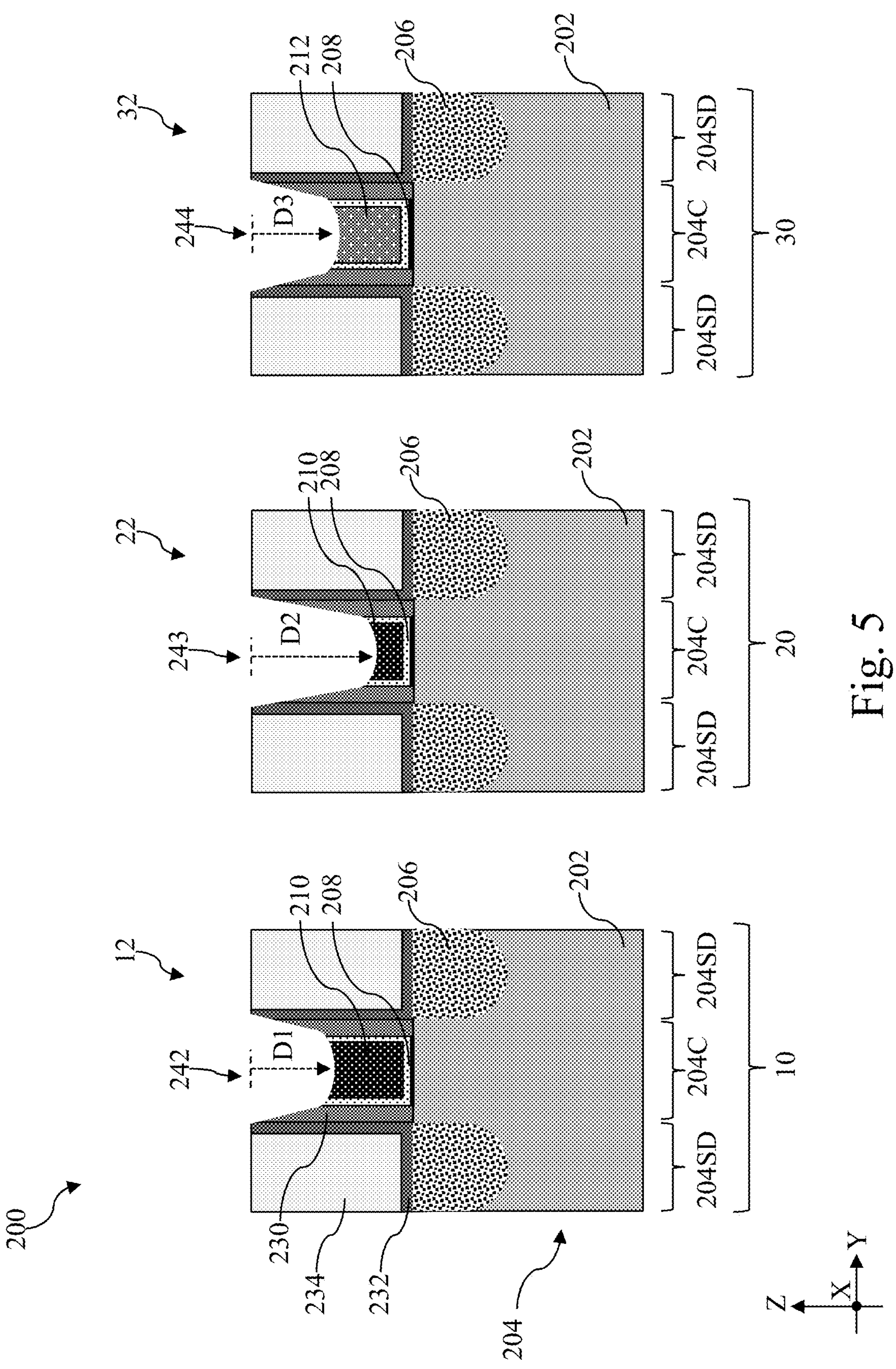

Referring to FIGS. 1 and 5, method 100 includes a block 106 where the first gate structure 220 of the first transistor structure 12, the second gate structure 222 of the second transistor structure 22, and the third gate structure 224 of the third transistor structure 32 are globally recessed to form a first gate recess 242, a second gate recess 243 and a third gate recess 244. After the removal of the first patterned etch mask 235, the first gate structure 220, the second gate structure 222 and the third gate structure 224 are subject to the same global etch process at block 106. The global etch process may include chemicals and conditions similar to the dry etch process at block 104. In other words, operations at blocks 104 and 106 essentially etch the second gate structure 222 twice while etching the first gate structure 220 and the third gate structure 224 once. The global etch at block 106 forms a first gate recess 242 over the first gate structure 220, extends the pilot recess 240 further into the second gate structure 222 to form a second gate recess 243, and forms a third gate recess 244 over the third gate structure 224. As shown in FIG. 5, the first gate recess 242 has a first depth D1, the second gate recess 243 has a second depth D2 and the third gate recess 244 has a third depth D3. In the depicted embodiments, the second depth D2 is greater than the first depth D1 or the third depth D3. The first depth D1 may be very similar to the third depth D3 as the global etch process at block 106 etches the n-type work function layer 210 and the p-type work function layer 212 at substantially the same rate. Conversely, due to the greater second depth D2, a height of the second gate structure 222 is made smaller than a height of the first gate structure 220 or the third gate structure 224. In terms of consumption of work function layer, the second gate structure 222 is subject to additional etching. As a result, a threshold-voltage-determining species in the second gate structure 222, such as aluminum, is consumed more. As between the first transistor structure 12 and the second transistor structure 22, which are both n-type transistor structures, the second transistor structure 22 may have a higher threshold voltage due to the additional consumption of aluminum in the second gate structure 222.

Figure 6:
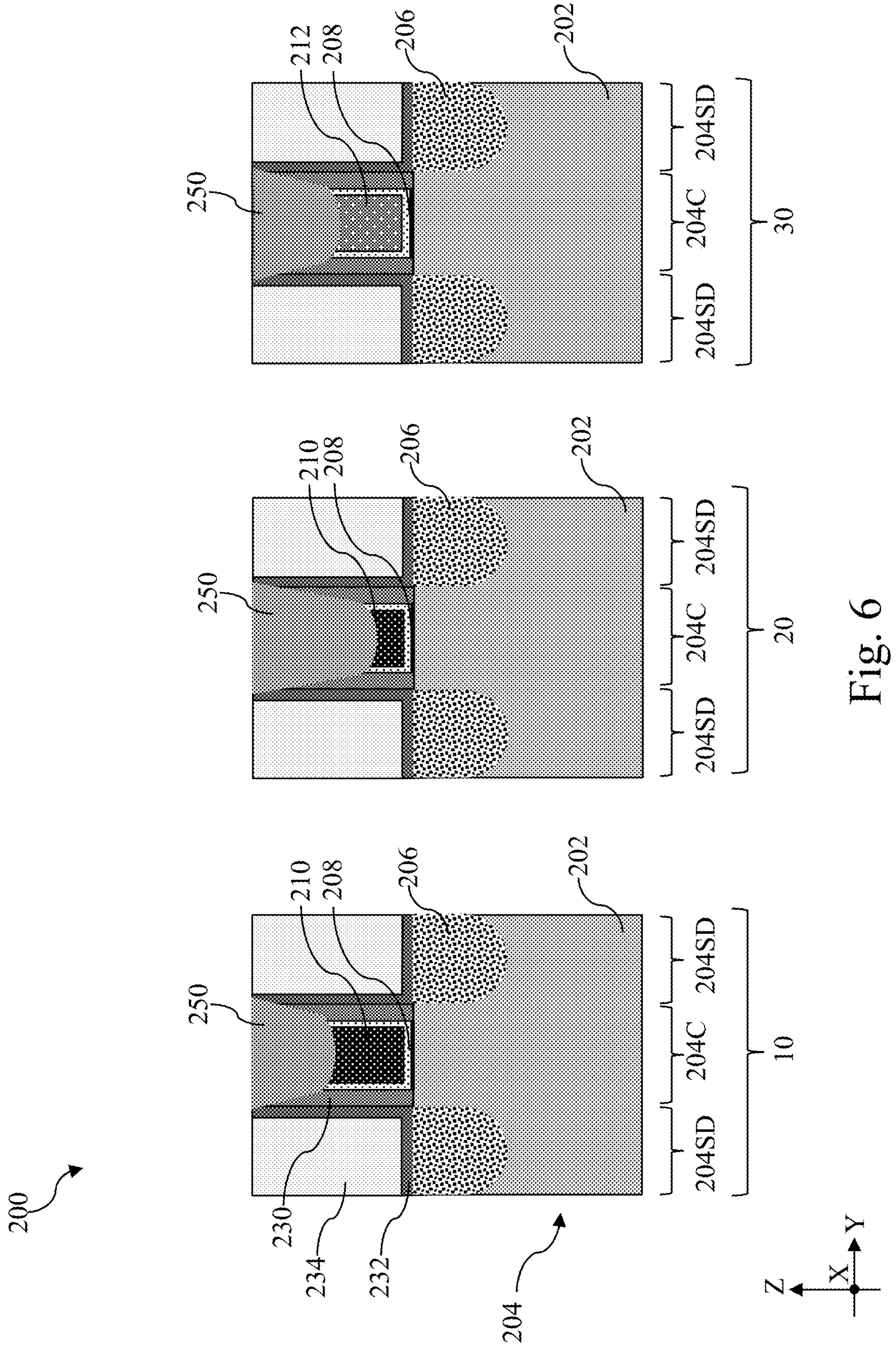

Referring to FIGS. 1 and 6, method 100 includes a block 108 where a cap layer 250 is deposited over the first gate recess 242, the second gate recess 243 and the third gate recess 244. In some embodiments, the cap layer 250 may include silicon oxide, silicon nitride, silicon carbonitride, silicon oxycarbonitride, silicon oxycarbide, aluminum oxide, zirconium silicate ($ZrSiO_4$), hafnium silicate ($HfSiO_4$), hafnium oxide, or zirconium oxide. Because the cap layer 250 functions to protect the gate structures during a self-aligned contact (SAC) formation process. The cap layer 250 may also be referred to as a SAC cap layer 250 or a contact hard mask 250. Afterwards, a planarization process, such as a CMP process, may be performed to remove excess material over the ILD layer 234 such that top surfaces of the cap layer 250, the CESL 232 and the ILD layer 234 are coplanar.

Figure 7:
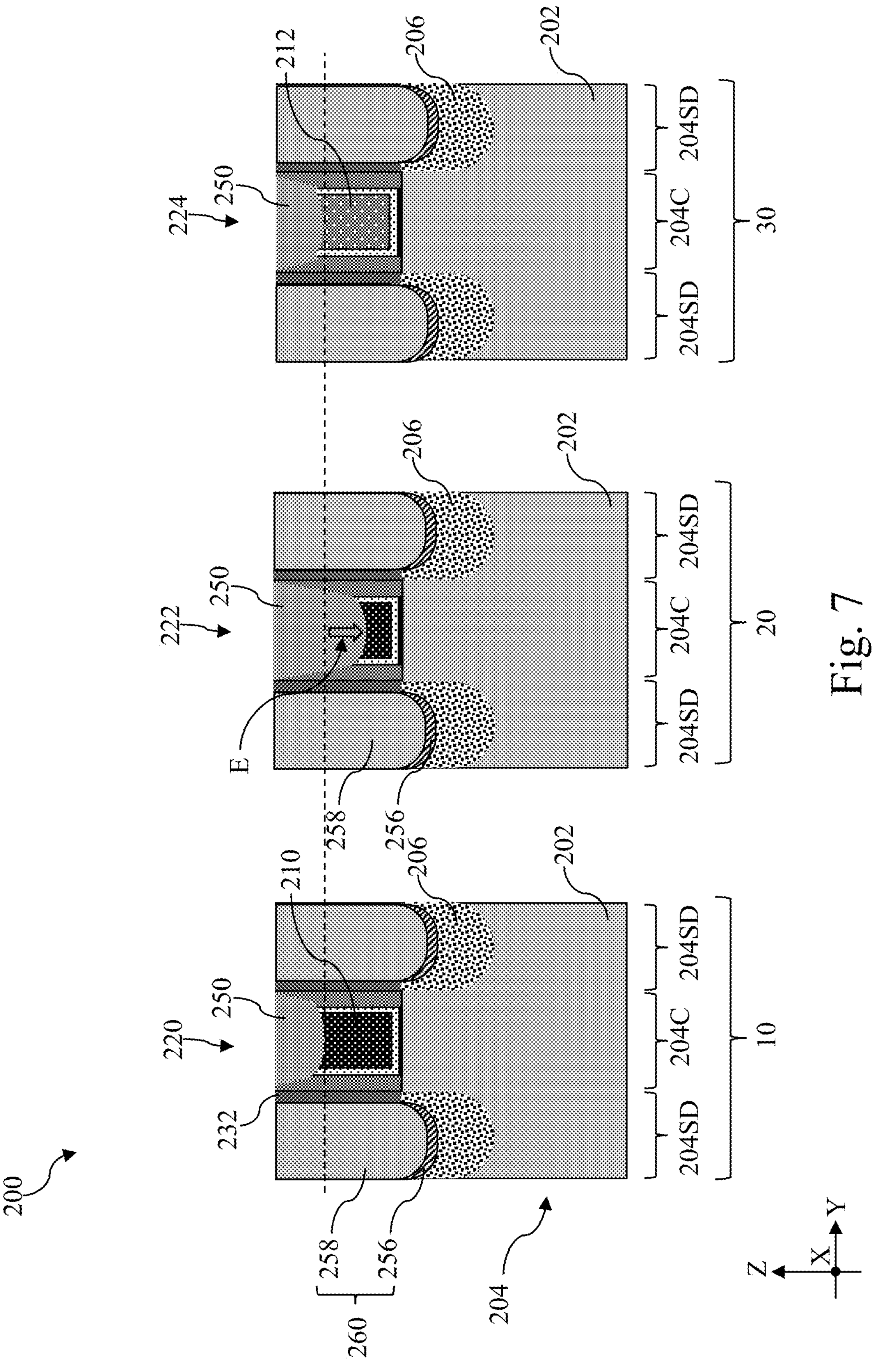

Referring to FIGS. 1 and 7, method 100 includes a block 110 where source/drain contacts 260 are formed. Operations at block 110 may include formation of source/drain contact openings through the ILD layer 234 and the CESL 232, formation of a silicide layer 256 over the source/drain features 206, and formation of source/drain contacts 260 over the silicide layer 256. In some implementations, with the cap layer 250, the gate spacer layers 230 and the CESL 232 protecting the gate structures (i.e., the first gate structure 220, the second gate structure 222 and the third gate structure 224), the workpiece 200 is anisotropically etched to form source/drain contact openings exposing the source/drain features 206 in the first area 10, the second area 20 and the third area 30. Due to the self-alignment nature, photolithography techniques are not used here for operations at block 110. In other words, no photo mask is used at block 110.

In the depicted embodiments, in order to reduce contact resistance, a silicide layer 256 may be formed on the exposed surfaces of the source/drain features 206 by depositing a metal precursor layer over the source/drain features 206 and performing an anneal process to bring about silicidation between the metal precursor layer and the source/drain features 206. Suitable metal precursor layer may include titanium (Ti), tantalum (Ta), nickel (Ni), cobalt (Co), or tungsten (W). The silicide layer 256 may include titanium silicide (TiSi), titanium silicon nitride (TiSiN), tantalum silicide (TaSi), tungsten silicide (WSi), cobalt silicide (CoSi), or nickel silicide (NiSi).

After the formation of the silicide layer 256, a metal fill layer 258 may be deposited into the contact openings to form the source/drain contacts 260. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). As shown in FIG. 7, the silicide layer 256 is disposed between the source/drain features 206 and the metal fill layer 258. The silicide layer 256 and the metal fill layer 258 over a source/drain feature 206 may be collectively referred to as a source/drain contact 260. In the depicted embodiments, sidewalls of the source/drain contacts 260 are in direct contact with the CESL 232. After the deposition of the metal fill layer 258, the workpiece 200 is planarized to remove excess materials such that top surfaces of the source/drain contacts 260, the CESL 232 and the cap layer 250 are coplanar, as shown in FIG. 7.

Reference is still made to FIG. 7. As indicated by the dotted line across the first gate structure 220, the second gate structure 222 and the third gate structure 224, the first gate structure 220 and the third gate structure 224 have gate heights greater than that of the second gate structure 222 by a gate height difference E. In the same token, the cap layer 250 over the second gate structure 222 is also thicker than the cap layer 250 over the first gate structure 220 or the third gate structure 224 by the gate height difference E. In some instances, the gate height difference E may be between about 3 nm and about 14 nm.

Figure 8:
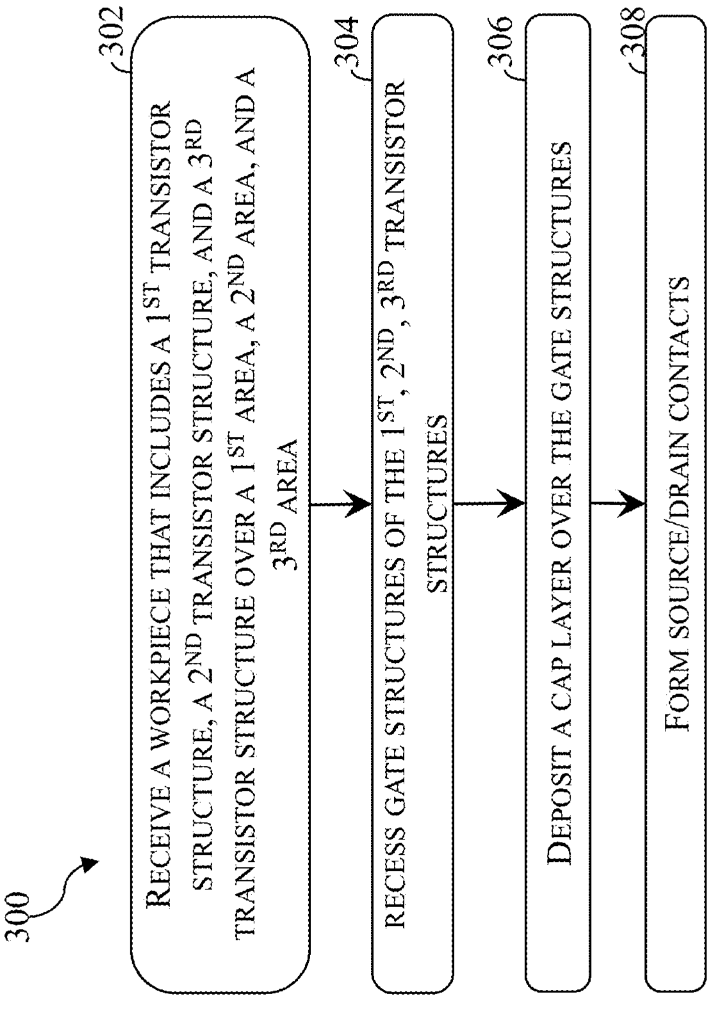
FIG. 8 is a flowchart of a method for fabricating transistors having different threshold voltages, according to various aspects of the present disclosure.

FIG. 8 illustrates a method 300. As will be described below, method 300 differs from method 100 in that method 300 achieves different gate recess depths through differential gate recess rates of different gate structures, not by photolithography.

Referring to FIGS. 8 and 2, method 300 includes a block 302 where a workpiece 200 that includes a first transistor structure 12 over a first area 10, a second transistor structure 22 over a second area 20, and a third transistor structure over a third area 30. Operations at block 302 are substantially similar to those at block 102, which was described in conjunction with FIG. 2. For that reason, detailed description of operations at block 302 is omitted for brevity.

Figure 9:
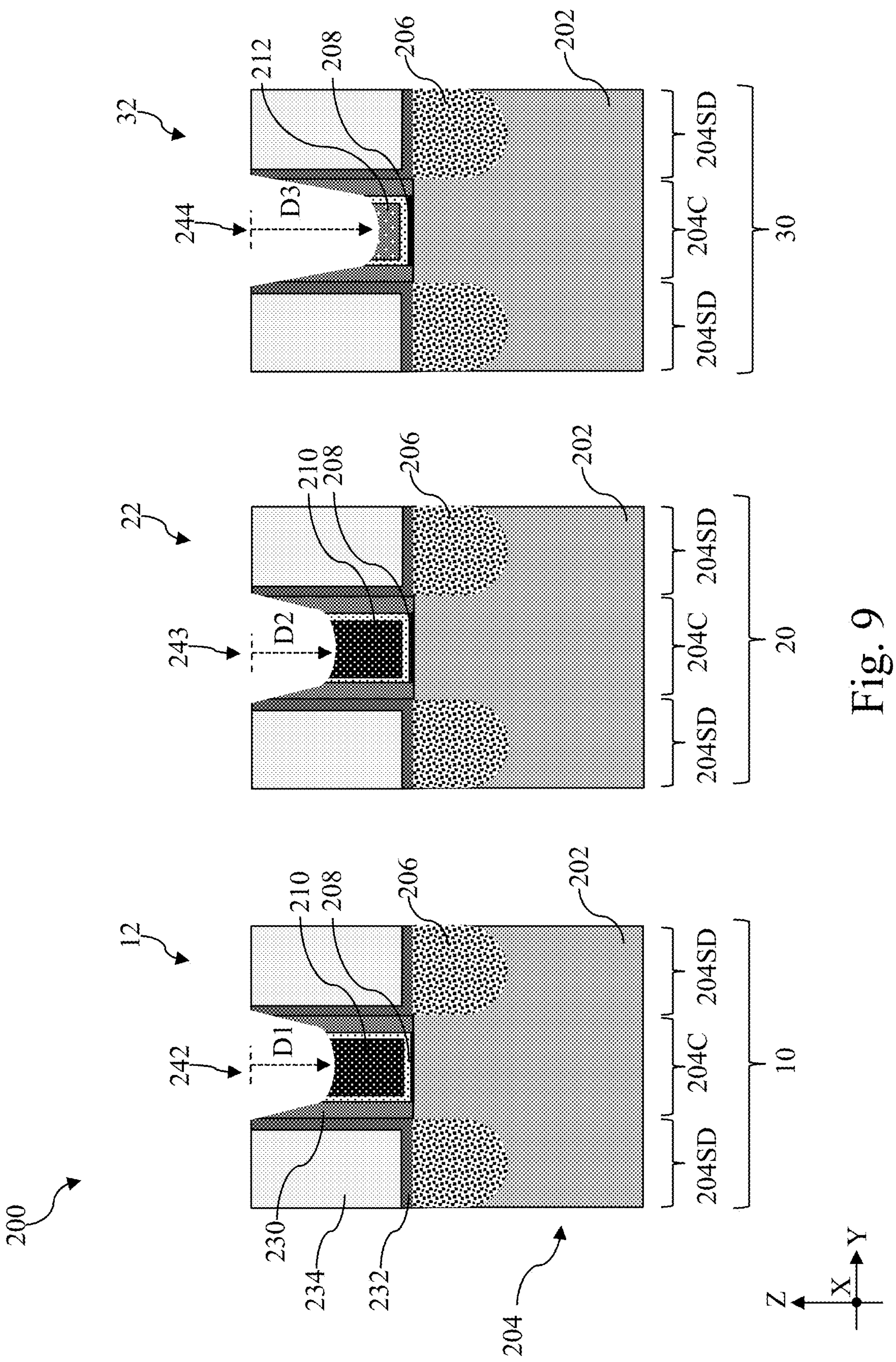
FIGS. 9-11 are fragmentary schematic cross-sectional views of a workpiece at various fabrication stages, such as those associated with the method in FIG. 8, according to various aspects of the present disclosure.

Referring to FIGS. 8 and 9, method 300 includes a block 304 where the first gate structure 220 of the first transistor structure 12, the second gate structure 222 of the second transistor structure 22, and the third gate structure 224 of the third transistor structure 32 are globally recessed to form a first gate recess 242, a second gate recess 243 and a third gate recess 244. In some embodiments, the global etch process at block 304 may include chemicals similar to the dry etch process at block 104 but may implement a lower RF power as well as a weaker bias to boost etching selectivity. In some alternative embodiments, the global etch process at block 304 is configured to etch n-type work function layer 210 and p-type work function layer 212 at different rates. For example, as the p-type work function layer 212 tends to include metal nitride, the global etch process at block 304 may be made to etch metal nitride at a greater rate or a smaller rate. In the embodiments represented in FIG. 9, the global etch process at block 304 may etch p-type work function layer 212 faster than n-type work function layer. As a result, the third gate recess 244 may be deeper than the first gate recess 242 or the second gate recess 243. As shown in FIG. 9, the first gate recess 242 has a first depth D1, the second gate recess 243 has a second depth D2 and the third gate recess 244 has a third depth D3. In the depicted embodiments, the first depth D1 and the second depth D2 are substantially the same or the same while the third depth D3 is greater than the first depth D1 or the second depth D2. In some alternative embodiments where the global etch process etches the n-type work function layer 210, the third depth D3 would be smallest among the three. In terms of consumption of materials in work function layers, the greater depth of the third gate recess D3 may lower the threshold voltage of the third transistor structure 32.

Figure 10:
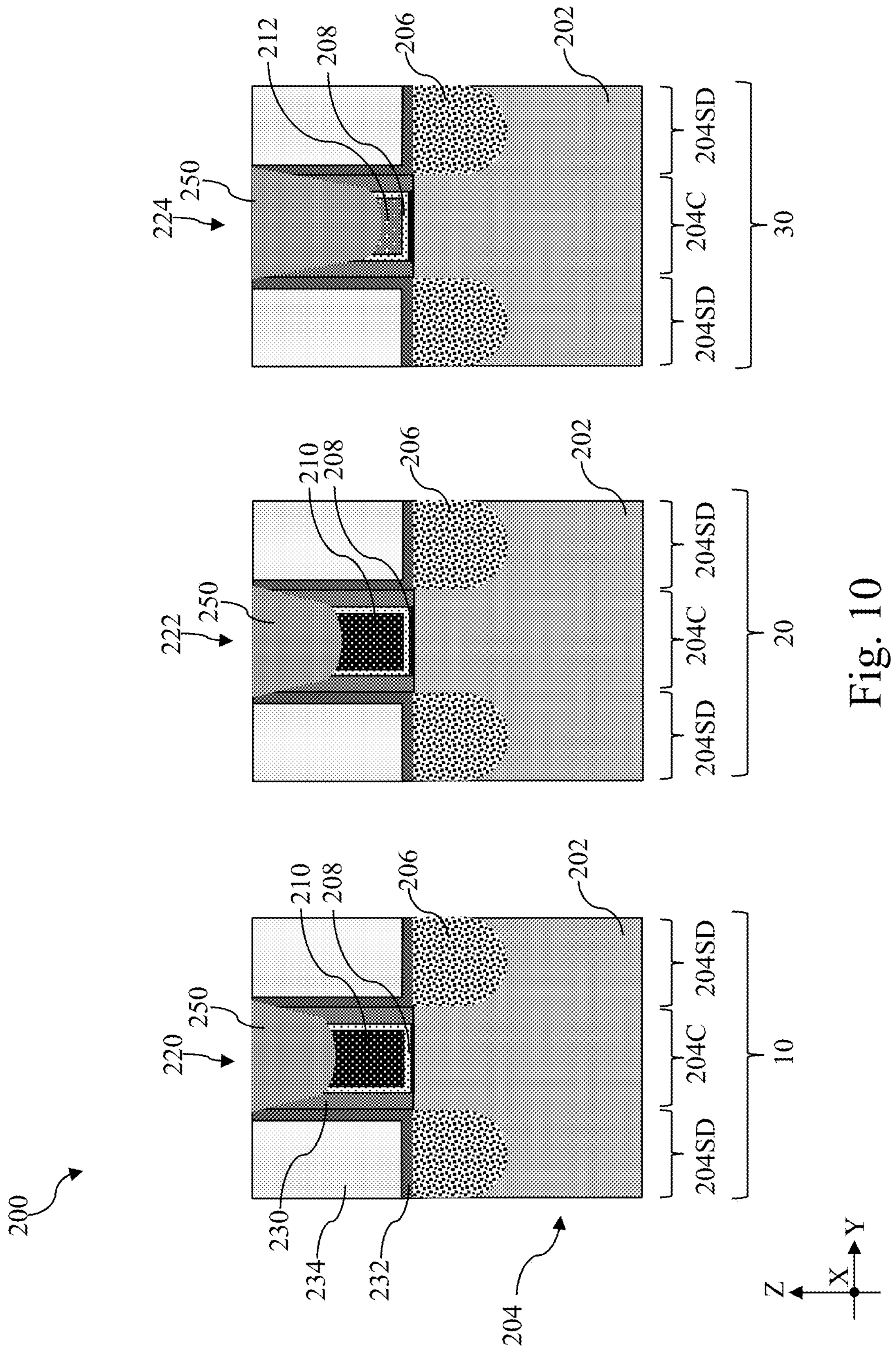

Referring to FIGS. 8 and 10, method 300 includes a block 306 where a cap layer 250 is deposited over the first gate recess 242, the second gate recess 243 and the third gate recess 244. Operations at block 306 are substantially similar to those at block 108, which was described in conjunction with FIG. 6. For that reason, detailed description of operations at block 306 is omitted for brevity. It is noted, however, after the planarization, the cap layer 250 over the third gate structure 224 is the thickest while the cap layer 250 over the first gate structure 220 and the second gate structure 222 are of the same thickness.

Figure 11:
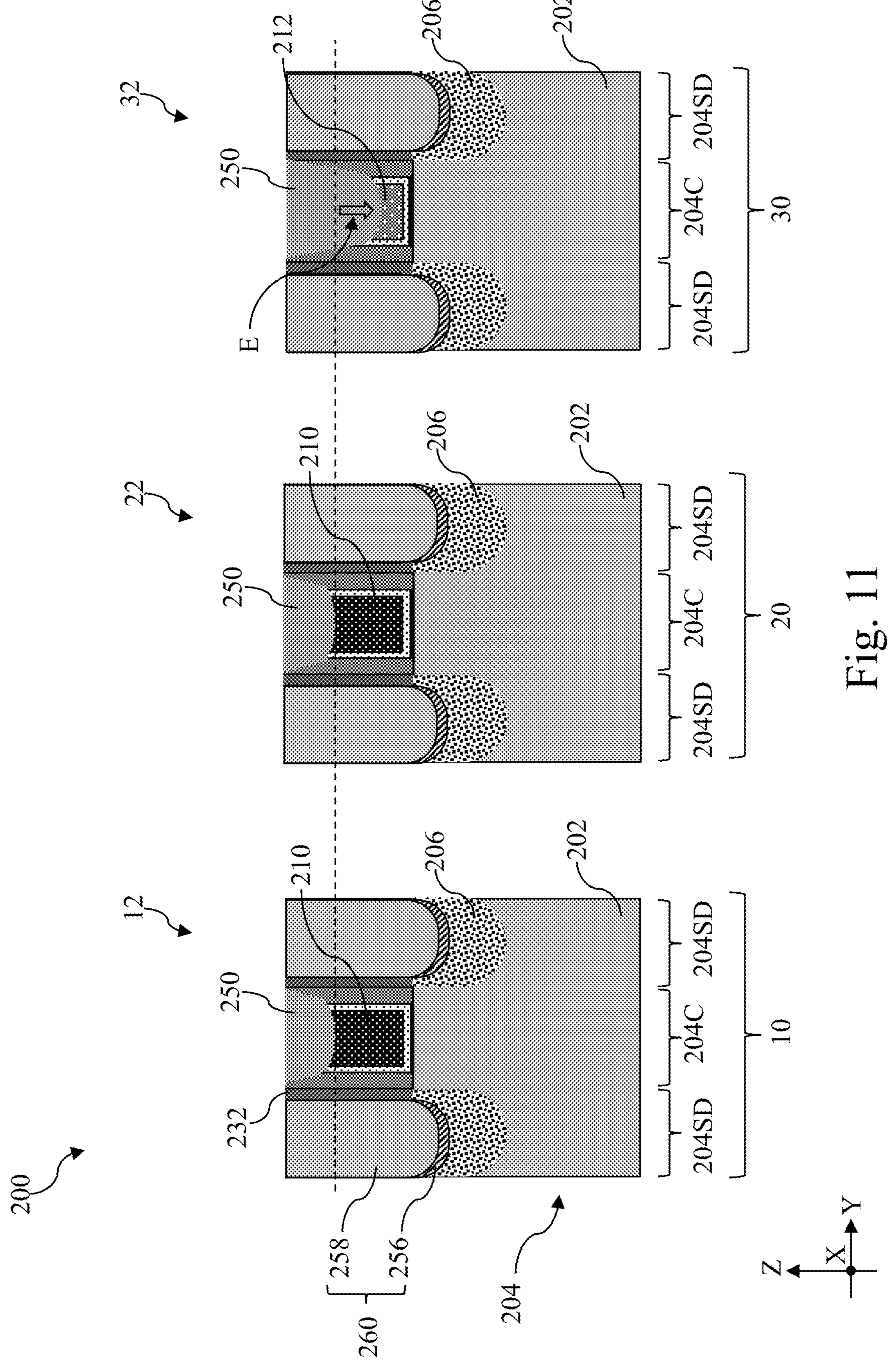

Referring to FIGS. 8 and 11, method 300 includes a block 308 where source/drain contacts 260 are formed. Operations at block 308 are substantially similar to those at block 110, which was described in conjunction with FIG. 7. For that reason, detailed description of operations at block 308 is omitted for brevity. As indicated by the dotted line across the first gate structure 220, the second gate structure 222 and the third gate structure 224 in FIG. 11, the first gate structure 220 and the second gate structure 222 have gate heights greater than that of the third gate structure 224 by a gate height difference E. In the same token, the cap layer 250 over the third gate structure 224 is also thicker than the cap layer 250 over the first gate structure 220 or the second gate structure 222 by the gate height difference E. In some instances, the gate height difference E may be between about 3 nm and about 14 nm.

Figure 12:
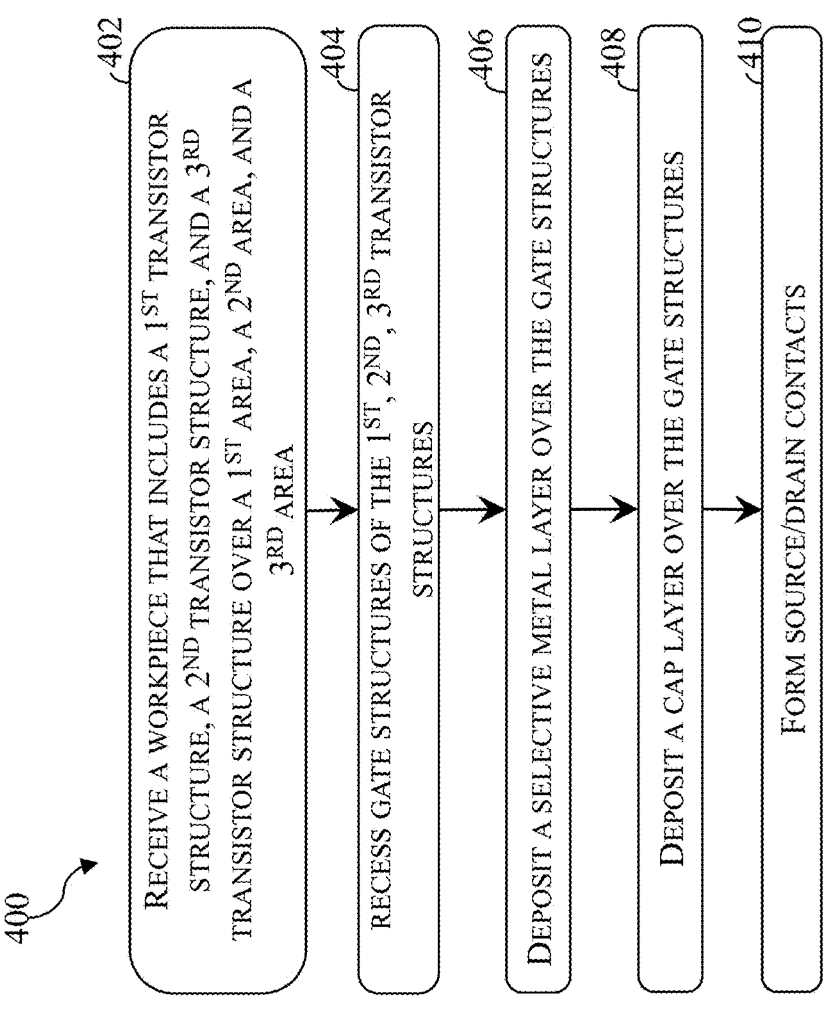
FIG. 12 is a flowchart of a method for fabricating transistors having different threshold voltages, according to various aspects of the present disclosure.

FIG. 12 illustrates a method 400. As will be described below, method 400 includes formation of a selective metal layer 270 before the deposition of the cap layer 250. The selective metal layer 270 is selectively deposited over the recessed gate structures to reduce gate resistance. It has been observed that implementation of the selective metal layer 270 may effectively reduce the threshold voltage for p-type transistors. Implementation of the selective metal layer 270 to n-type transistors tend to produce opposite result.

Referring to FIGS. 12 and 2, method 400 includes a block 402 where a workpiece 200 that includes a first transistor structure 12 over a first area 10, a second transistor structure 22 over a second area 20, and a third transistor structure 32 over a third area 30. Operations at block 402 are substantially similar to those at block 102, which was described in conjunction with FIG. 2. For that reason, detailed description of operations at block 402 is omitted for brevity.

Figure 13:
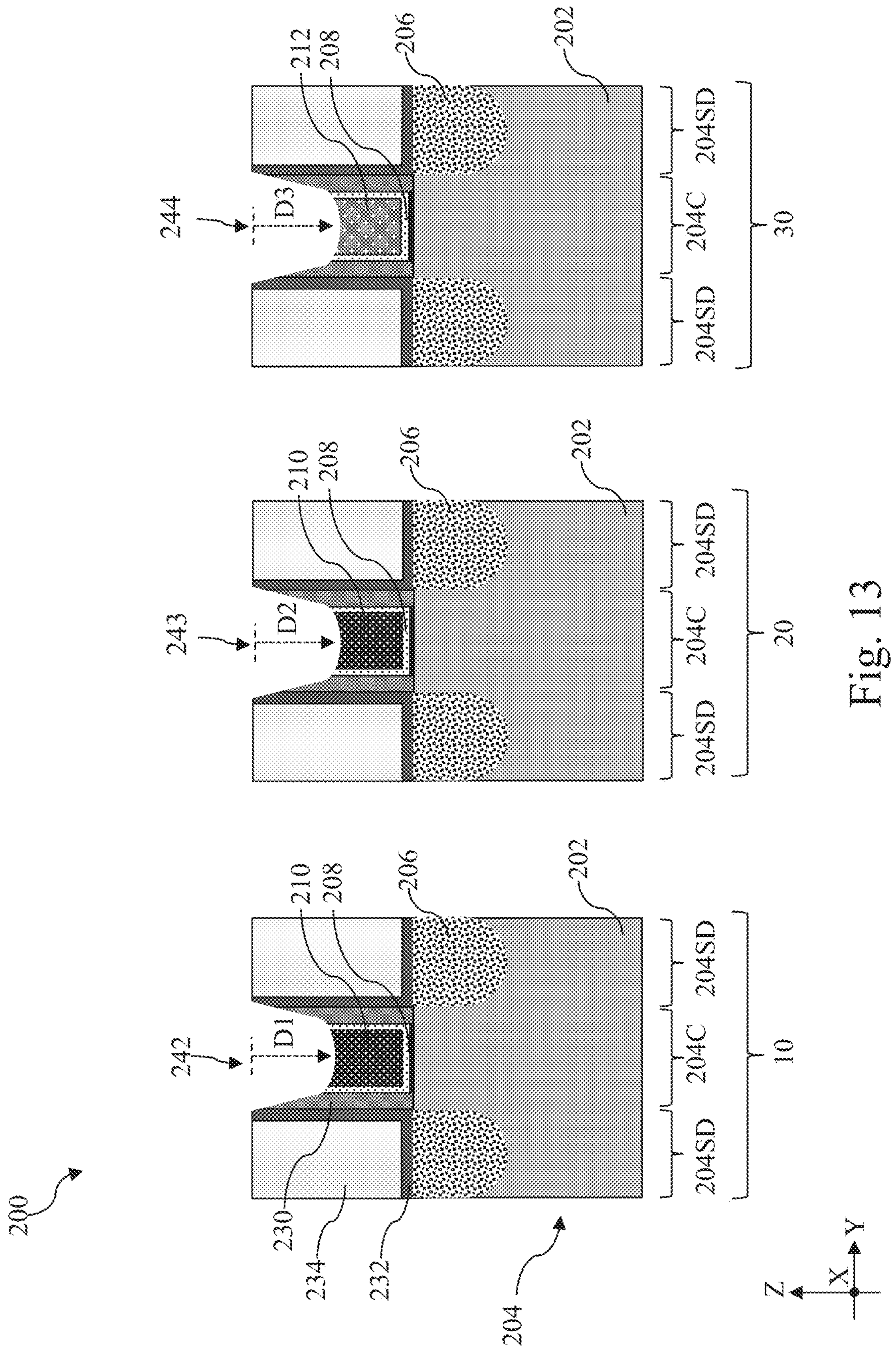
FIGS. 13-16 are fragmentary schematic cross-sectional views of a workpiece at various fabrication stages, such as those associated with the method in FIG. 12, according to various aspects of the present disclosure.

Referring to FIGS. 12 and 13, method 400 includes a block 404 where the first gate structure 220 of the first transistor structure 12, the second gate structure 222 of the second transistor structure 22, and the third gate structure 224 of the third transistor structure 32 are globally recessed to form a first gate recess 242, a second gate recess 243 and a third gate recess 244. Operations at block 404 are substantially similar to those at block 106, which was described in conjunction with FIG. 5. For that reason, detailed description of operations at block 404 is omitted for brevity. Different from what is shown in FIG. 5, because none of the gate structure is first selectively recessed, the first gate recess 242, the second gate recess 243 and the third gate recess 244 in FIG. 13 have the same depth. That is, the first depth D1, the second depth D2 and the third depth D3 in FIG. 13 are substantially the same.

Figure 14:
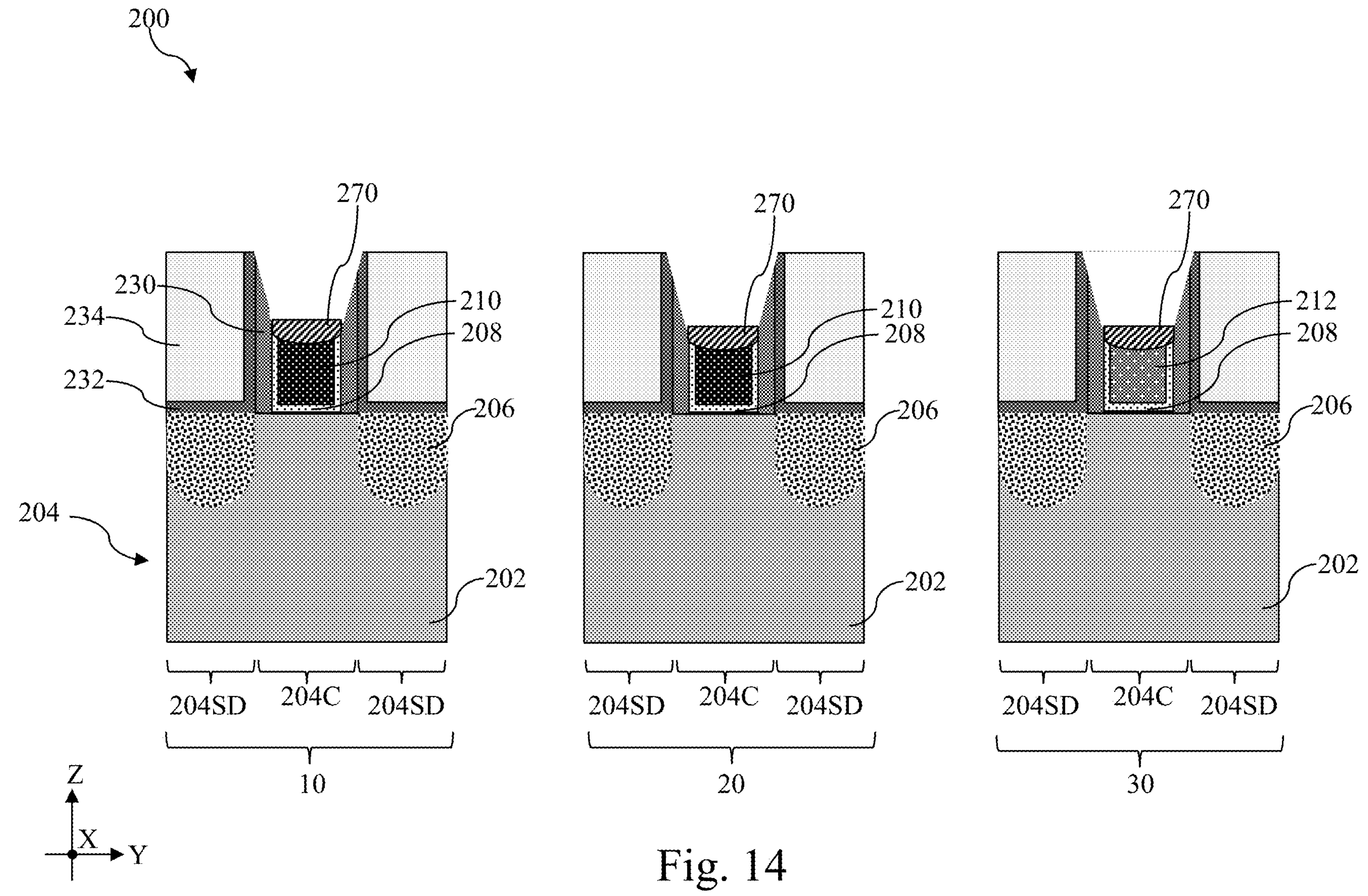

Referring to FIGS. 12 and 14, method 400 includes a block 406 where a selective metal layer 270 is deposited over the first gate structure 220, the second gate structure 222 and the third gate structure 224. In some embodiments, the selective metal layer 270 may include titanium (Ti), tantalum (Ta), aluminum (Al), molybdenum (Mo), tungsten (W), cobalt (Co), copper (Cu), ruthenium (Ru), zirconium (Zr), a combination thereof, or a conductive compound thereof. In some example, the selective metal layer 270 may include a titanium-containing compound such as titanium nitride (TiN) or a tantalum-containing compound such as tantalum nitride (TaN). The selective metal layer 270 may be selectively deposited on conductive surfaces, such as surfaces of the n-type work function layer 210, the p-type work function layer 212, or the metal fill layer (not shown) by atomic layer deposition (ALD) or plasma enhanced ALD (PEALD). For example, when the selective metal layer 270 includes titanium nitride, the deposition of the selective metal layer 270 may include use of tetrakis(dimethylamido) titanium (TDMAT) and ammonia ($NH_3$) or titanium tetrachloride ($TiCl_4$) and ammonia ($NH_3$). In some embodiments, the selective metal layer 270 may have a thickness between about 1 nm about 8 nm. When the thickness of the selective metal layer 270 is smaller than 1 nm, the threshold voltage shifting effect of the selective metal layer 270 may not be detectable. When the thickness of the selective metal layer 270 is greater than 8 nm, the selective metal layer 270 may displace too much the cap layer 250 to provide sufficient protection for the gate structures.

Figure 15:
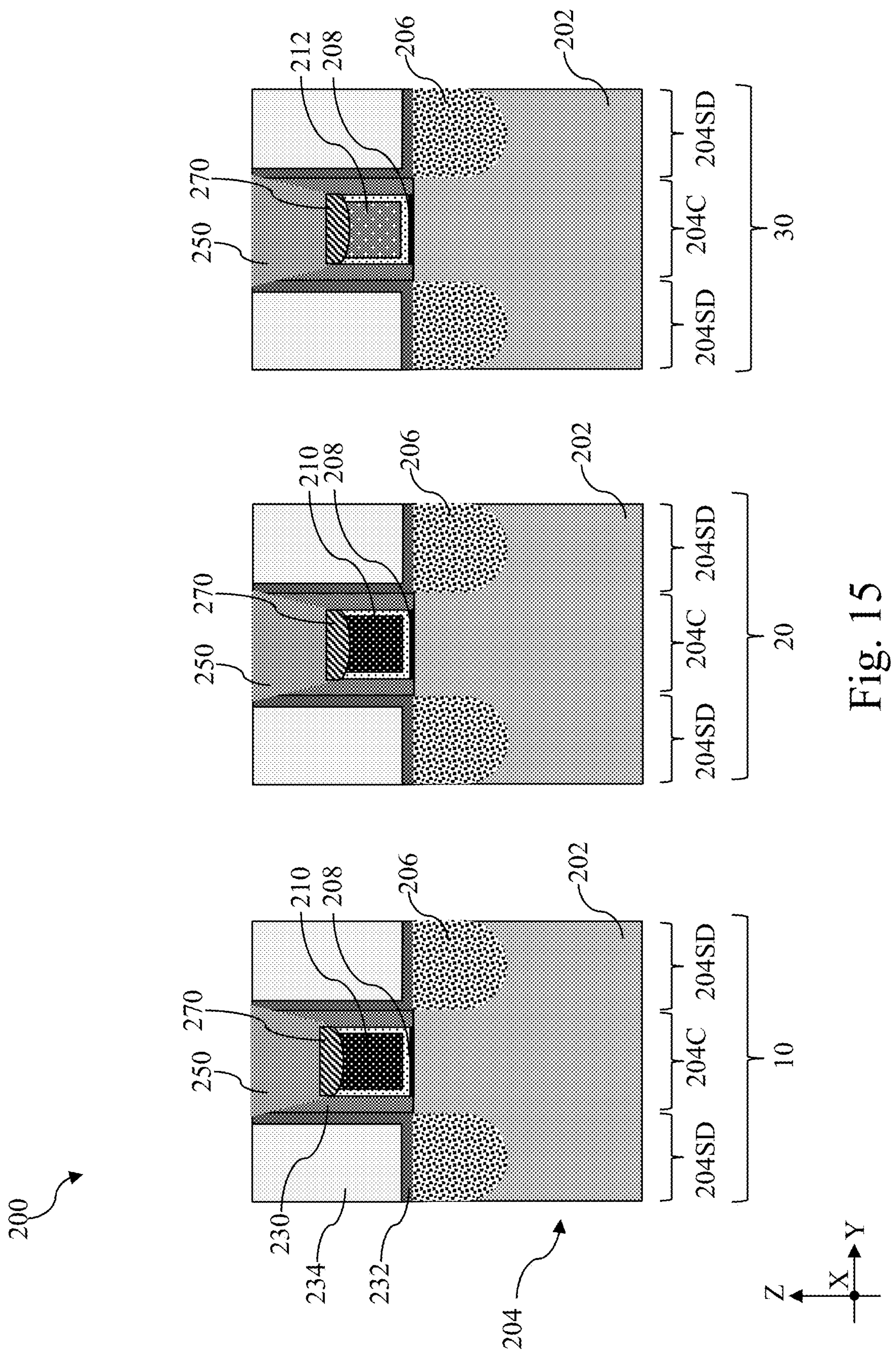

Referring to FIGS. 12 and 15, method 400 includes a block 408 where a cap layer 250 is deposited over the first gate recess 242, the second gate recess 243 and the third gate recess 244. Operations at block 408 are substantially similar to those at block 108, which was described in conjunction with FIG. 6. For that reason, detailed description of operations at block 408 is omitted for brevity. Different from what is shown in FIG. 6, operations at block 408 deposits the cap layer 250 over the selective metal layer 270 over each of the first gate structure 220, the second gate structure 222 and the third gate structure 224.

Figure 16:
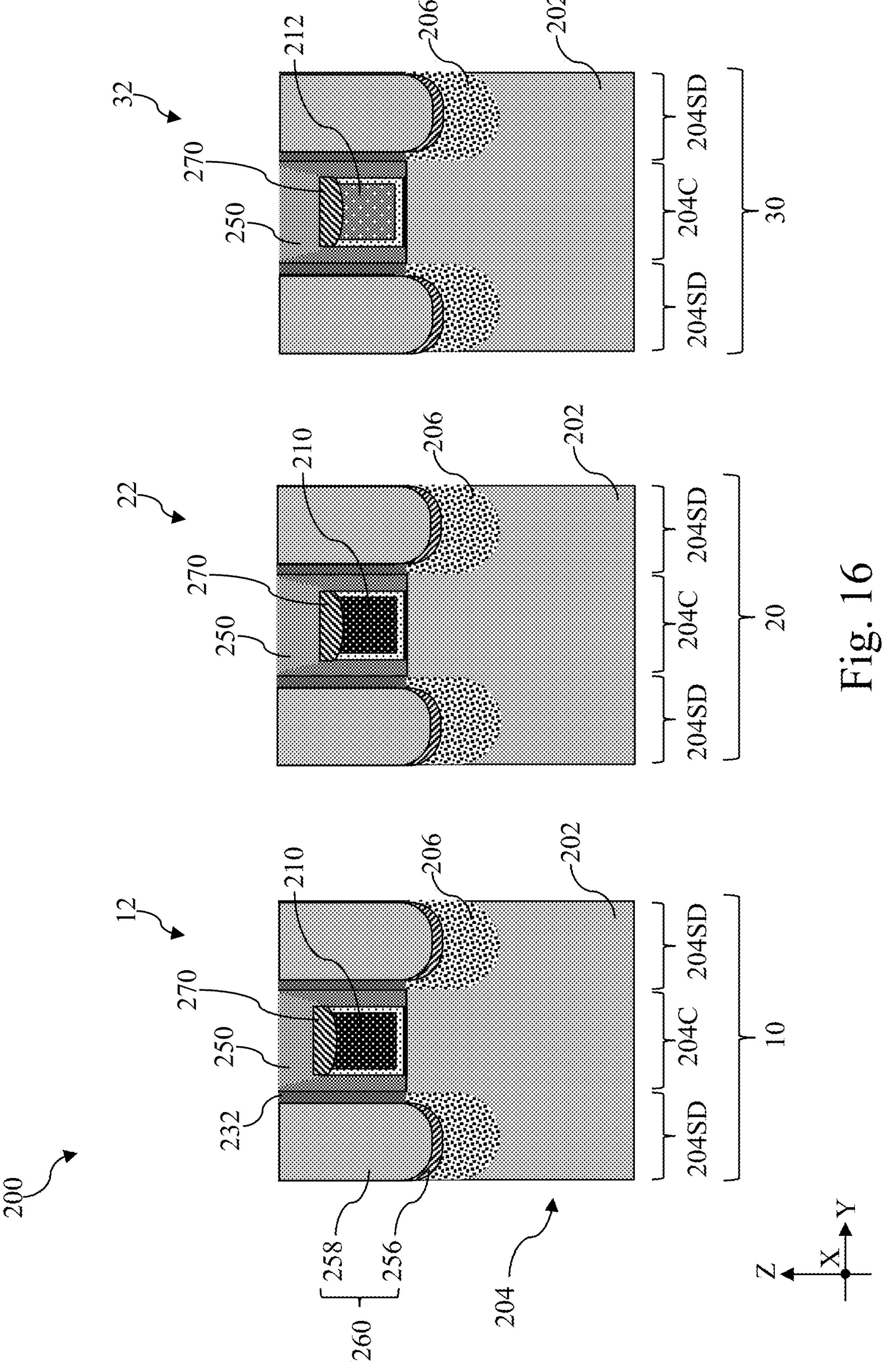

Referring to FIGS. 12 and 16, method 400 includes a block 410 where the source/drain contacts 260 are formed. Operations at block 410 are substantially similar to those at block 110, which was described in conjunction with FIG. 7. For that reason, detailed description of operations at block 410 is omitted for brevity. Different from what is shown in FIG. 7, the first gate structure 220, the second gate structure 222 and the third gate structure 224 in FIG. 16 have the same gate height.

Figure 17:
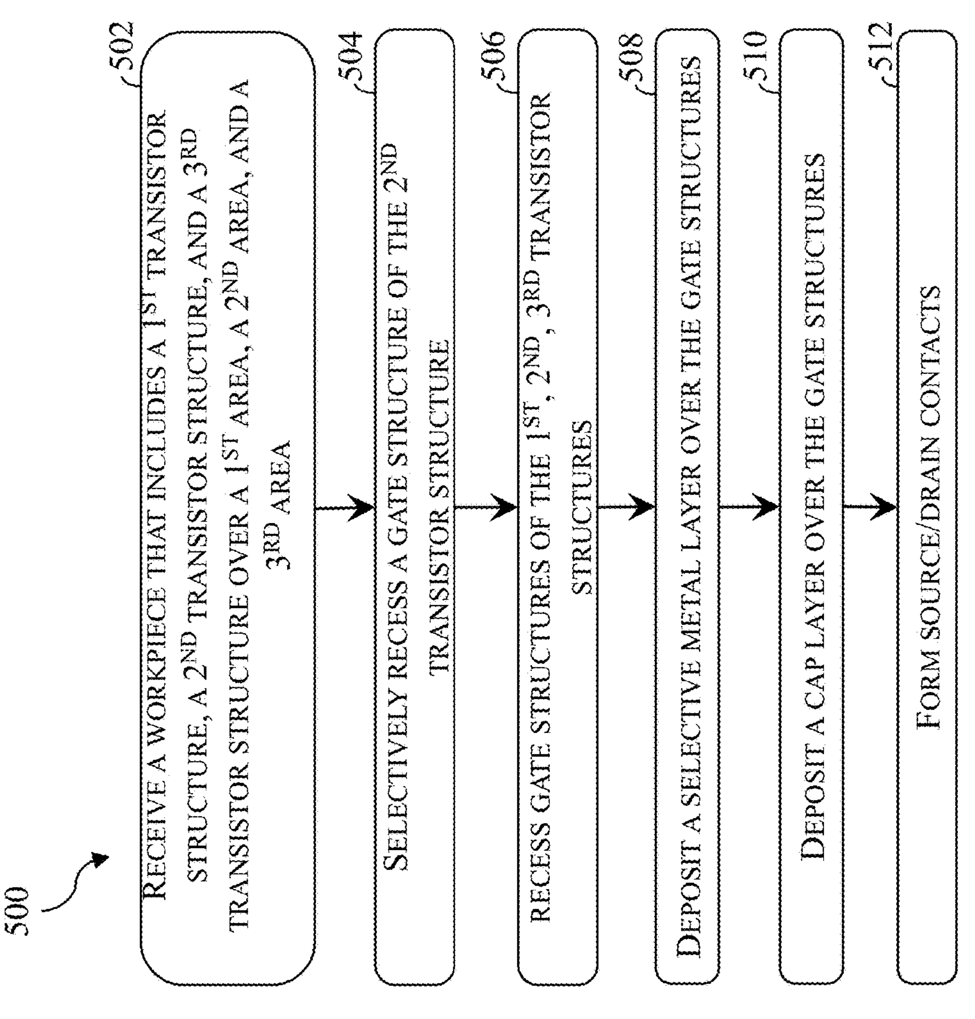
FIG. 17 is a flowchart of a method for fabricating transistors having different threshold voltages, according to various aspects of the present disclosure.

FIG. 17 illustrates a method 500. As will be described below, method 500 incorporates the formation of the selective metal layer 270 described in association with method 400 into method 100.

Referring to FIGS. 17 and 2, method 500 includes a block 502 where a workpiece 200 that includes a first transistor structure 12 over a first area 10, a second transistor structure 22 over a second area 20, and a third transistor structure 32 over a third area 30. Operations at block 502 are substantially similar to those at block 102, which was described in conjunction with FIG. 2. For that reason, detailed description of operations at block 502 is omitted for brevity.

Figure 18:
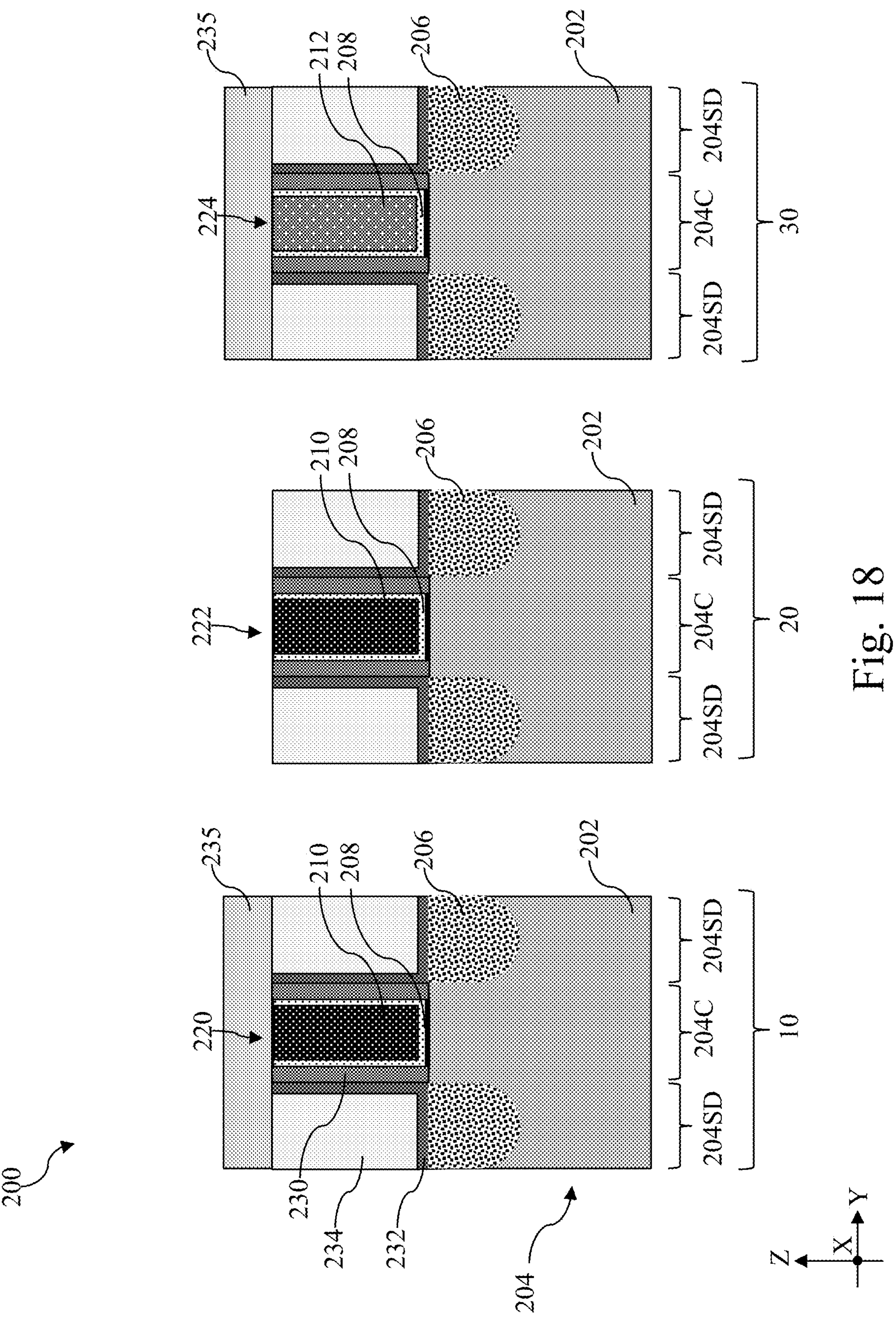
FIGS. 18-23 are fragmentary schematic cross-sectional views of a workpiece at various fabrication stages, such as those associated with the method in FIG. 17, according to various aspects of the present disclosure.
Figure 19:
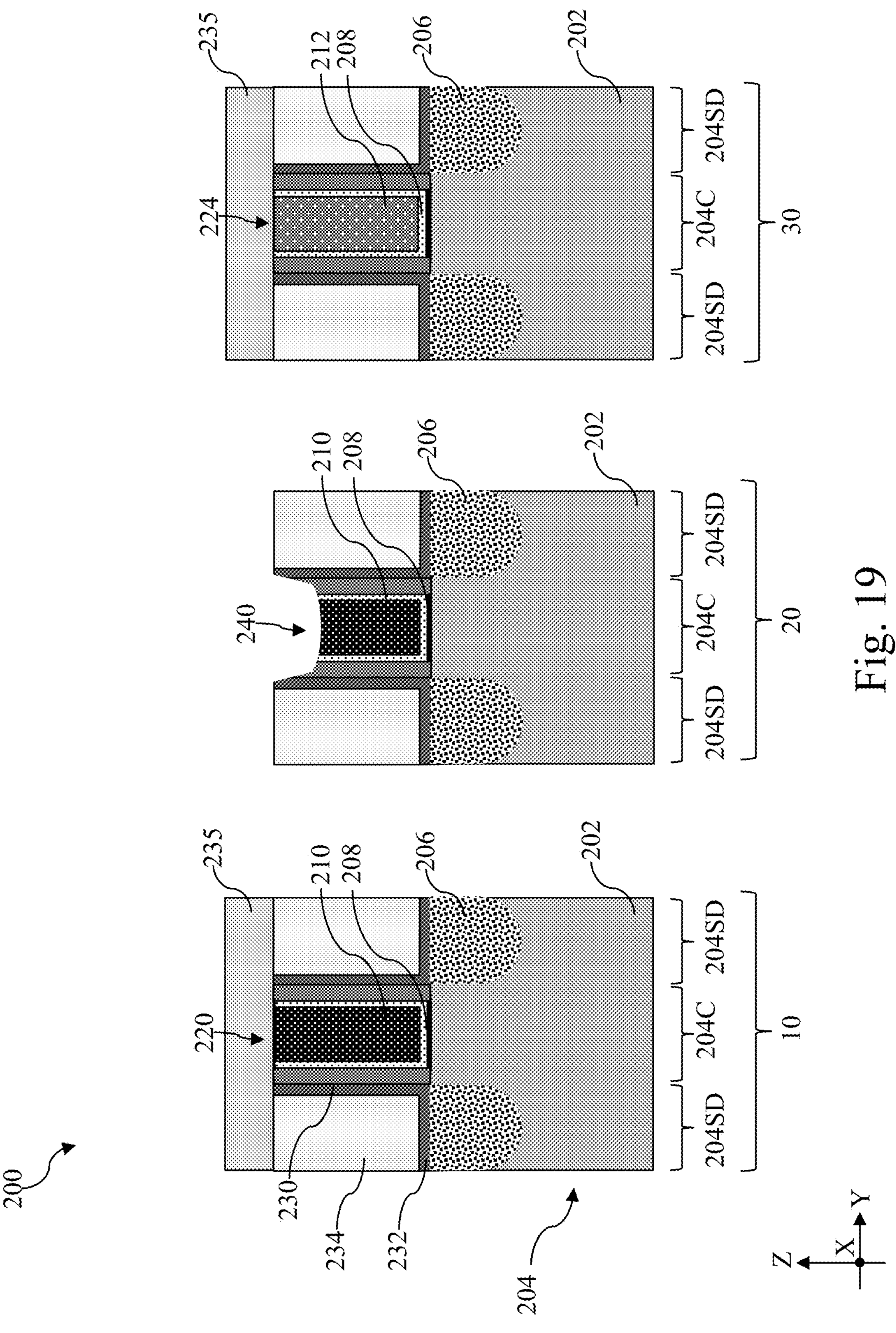

Referring to FIGS. 17, 18 and 19, method 500 includes a block 504 where the second gate structure 222 of the second transistor structure 22 is selectively recessed. Operations at block 504 are substantially similar to those at block 104, which was described in conjunction with FIGS. 3 and 4. For that reason, detailed description of operations at block 504 is omitted for brevity. FIGS. 18 and 19 resemble FIGS. 3 and 4 and the description of FIGS. 3 and 4 substantially apply to FIGS. 18 and 19 as well.

Figure 20:
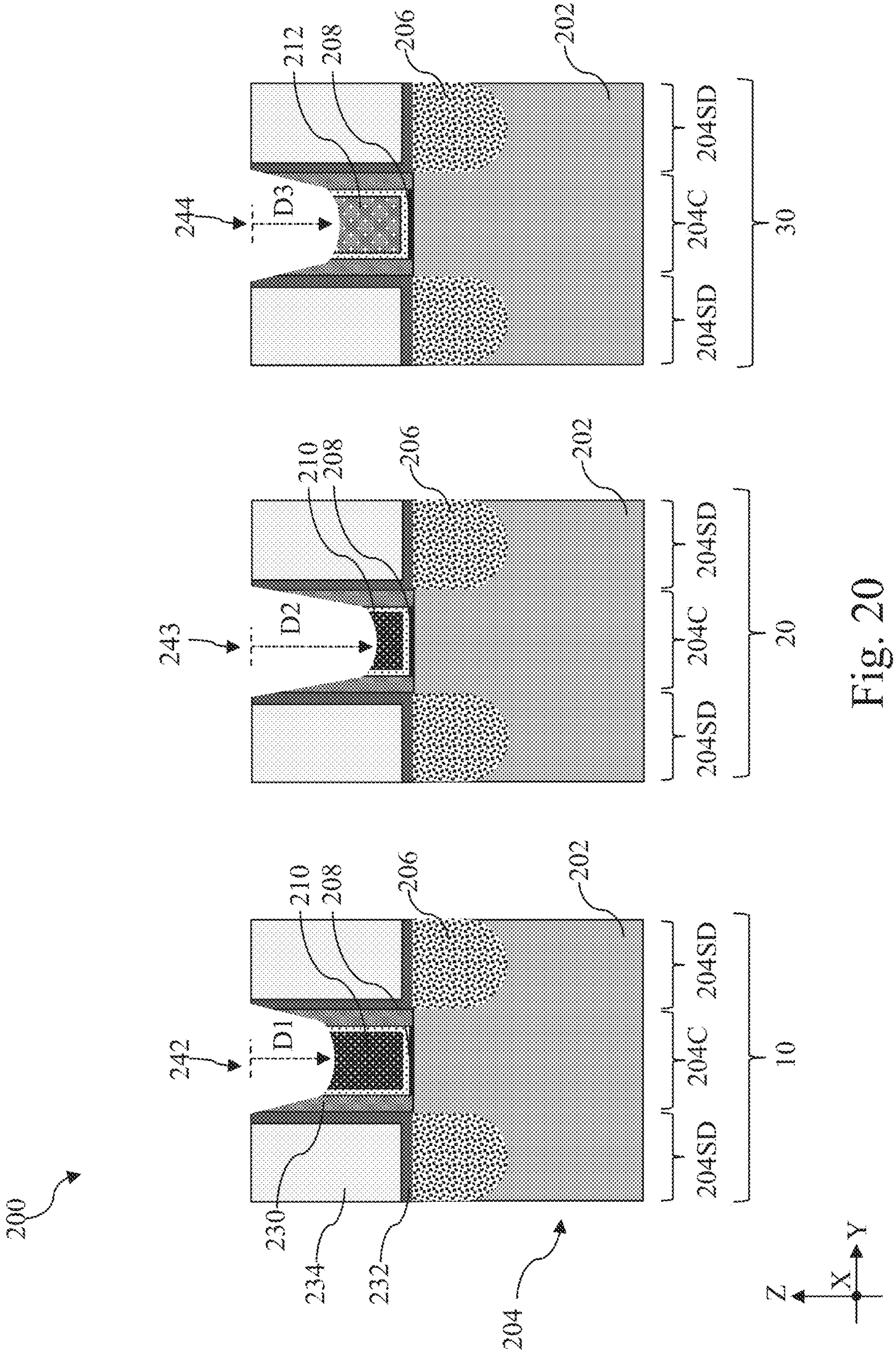

Referring to FIGS. 17 and 20, method 500 includes a block 506 where the first gate structure 220 of the first transistor structure 12, the second gate structure 222 of the second transistor structure 22, and the third gate structure 224 of the third transistor structure 32 are globally recessed to form a first gate recess 242, a second gate recess 243 and a third gate recess 244. Operations at block 506 are substantially similar to those at block 106, which was described in conjunction with FIG. 5. For that reason, detailed description of operations at block 506 is omitted for brevity. FIG. 20 resembles FIG. 5 and the description of FIG. 5 substantially apply to FIG. 20 as well. Notably, the relationship among the first depth D1, the second depth D2 and the third depth D3 in FIG. 5 also applies to counterparts in FIG. 20.

Figure 21:
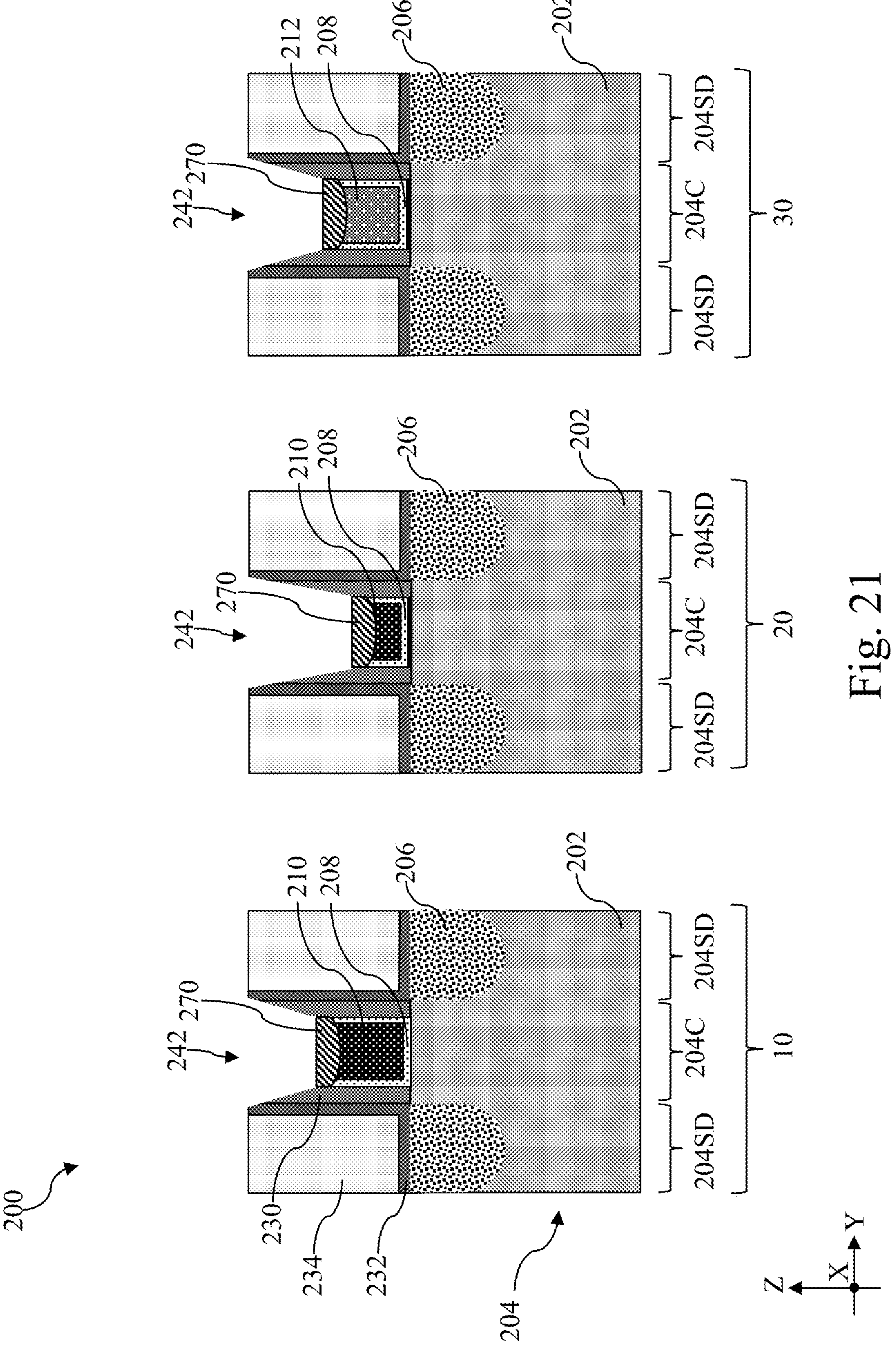

Referring to FIGS. 17 and 21, method 500 includes a block 508 where a selective metal layer 270 is deposited over the first gate structure 220, the second gate structure 222 and the third gate structure 224. Operations at block 508 are substantially similar to those at block 406, which was described in conjunction with FIG. 14. For that reason, detailed description of operations at block 508 is omitted for brevity. It is noted, however, that the first gate structure 220, the second gate structure 222 and the third gate structure 224 in FIG. 21 do not have the same gate heights as in FIG. 14.

Figure 22:
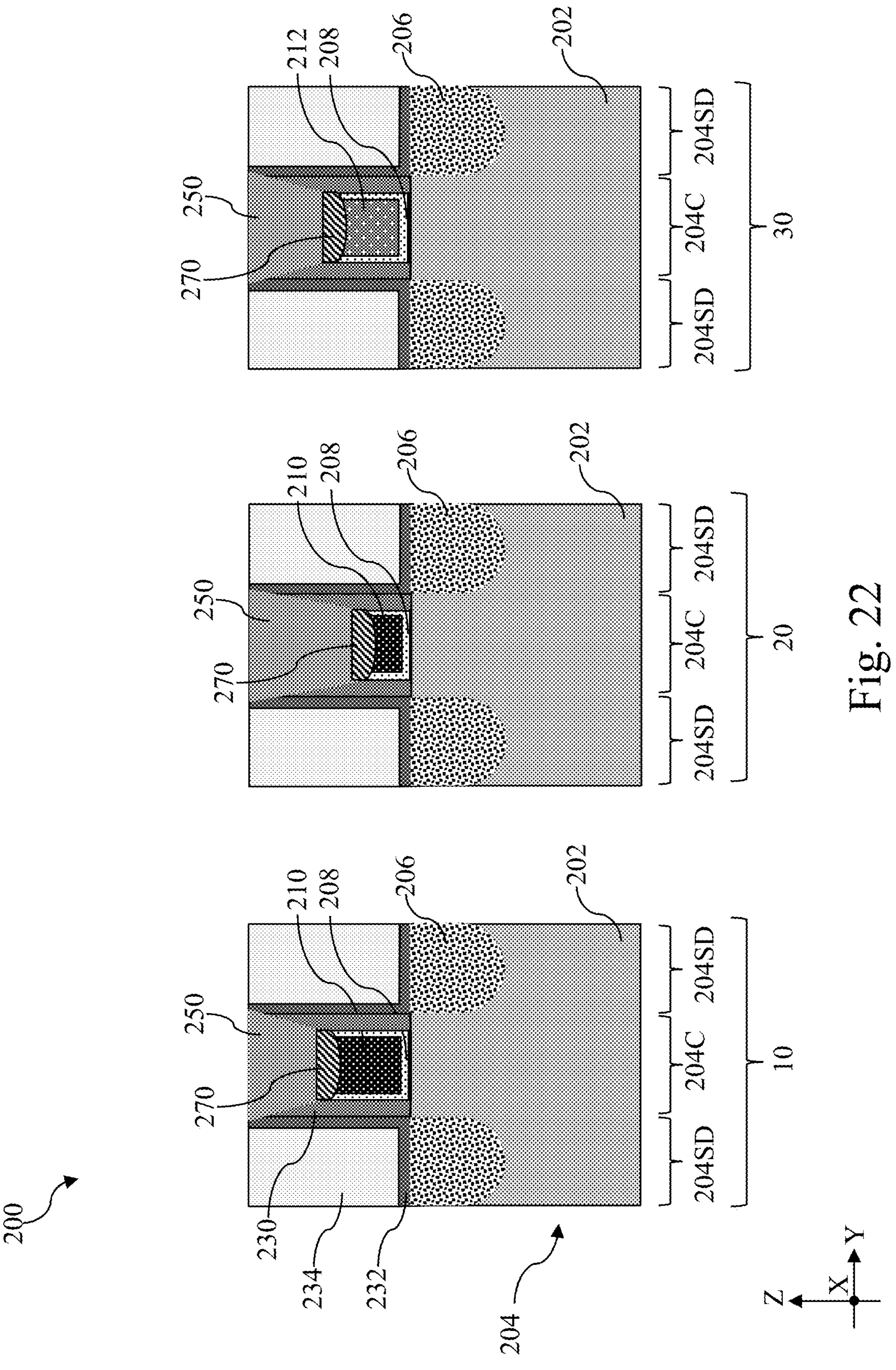

Referring to FIGS. 17 and 22, method 500 includes a block 510 where a cap layer 250 is deposited over the first gate recess 242, the second gate recess 243 and the third gate recess 244. Operations at block 510 are substantially similar to those at block 408, which was described in conjunction with FIG. 15.

Figure 23:
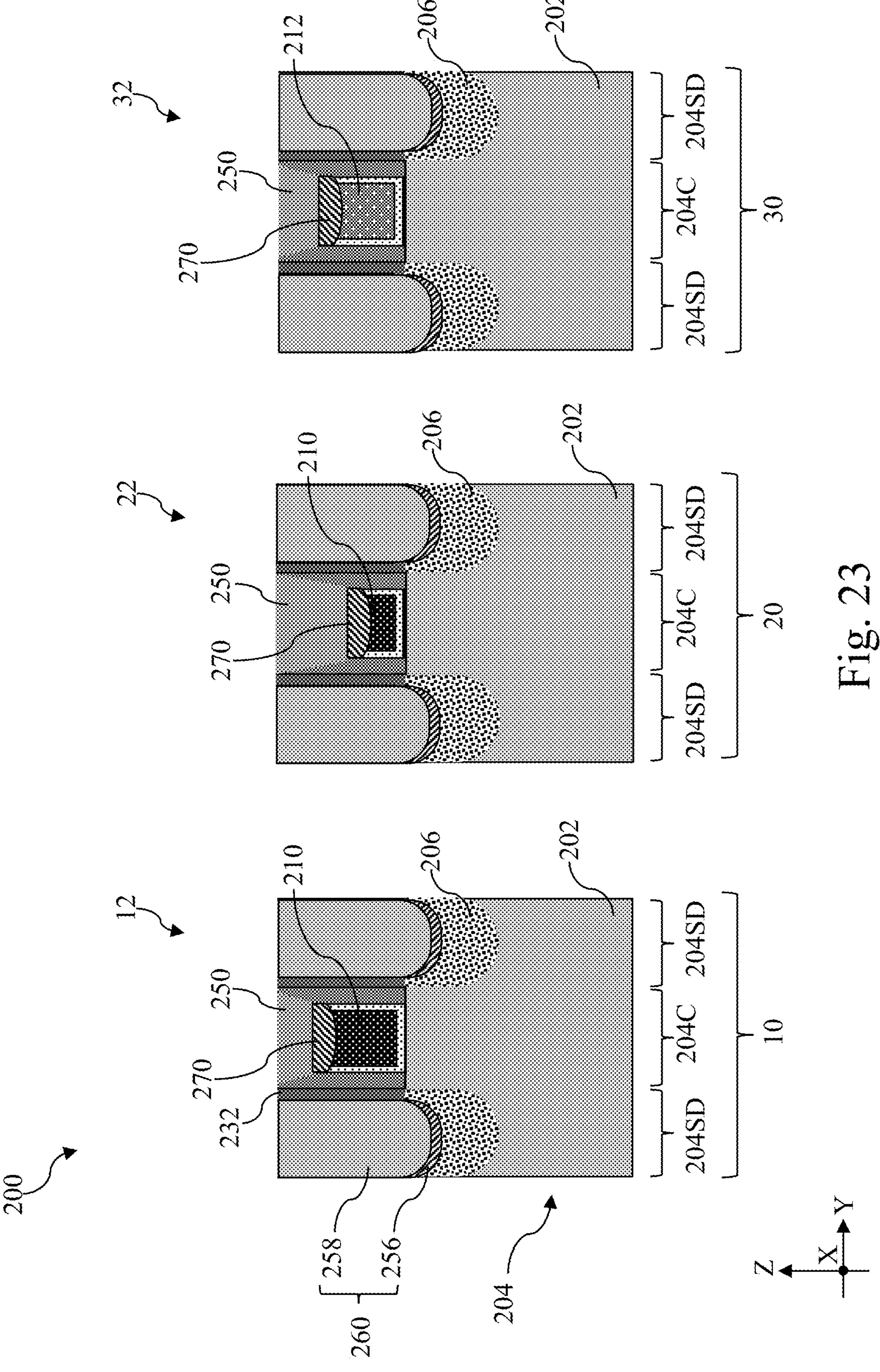

Referring to FIGS. 17 and 23, method 500 includes a block 512 where source/drain contacts 260 are formed. Operations at block 512 are substantially similar to those at block 410, which was described in conjunction with FIG. 16.

Figure 24:
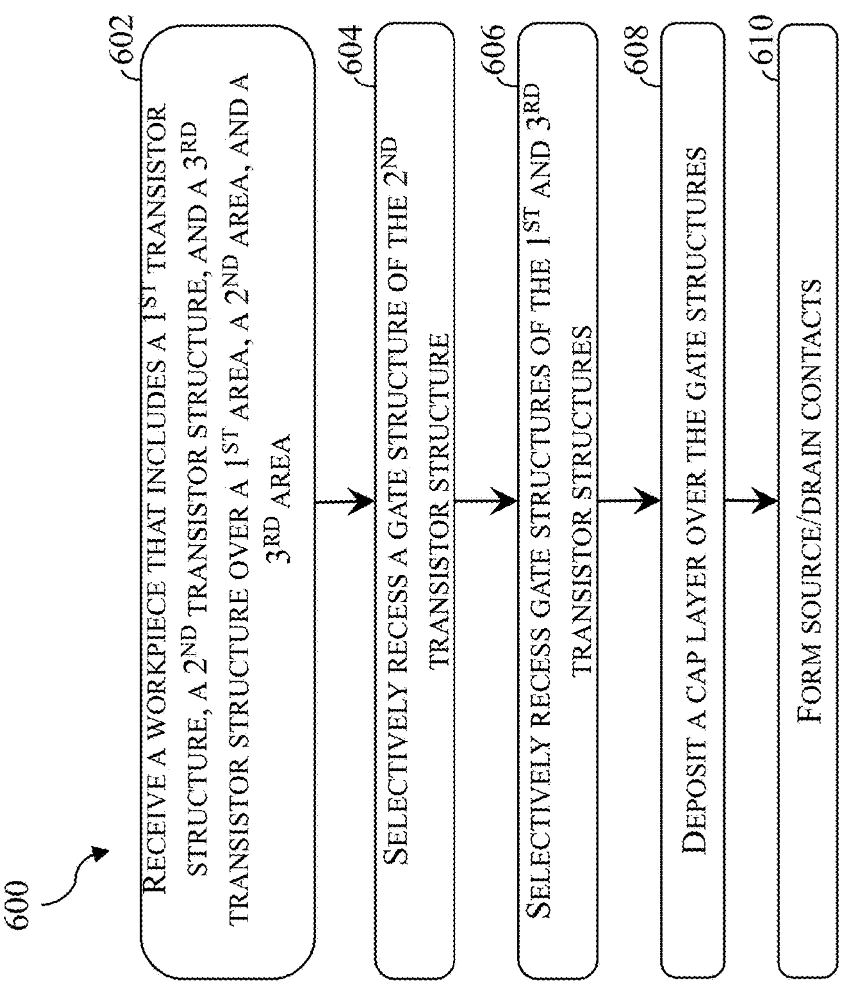
FIG. 24 is a flowchart of a method for fabricating transistors having different threshold voltages, according to various aspects of the present disclosure.

FIG. 24 illustrates a method 600. As will be described below, method 600 include more than one selective gate recess process to separately recess the gate structures to achieve modulation of threshold voltages among different transistor structures.

Referring to FIGS. 24 and 2, method 600 includes a block 602 where a workpiece 200 that includes a first transistor structure 12 over a first area 10, a second transistor structure 22 over a second area 20, and a third transistor structure 32 over a third area 30. Operations at block 602 are substantially similar to those at block 102, which was described in conjunction with FIG. 2. For that reason, detailed description of operations at block 602 is omitted for brevity.

Figure 25:
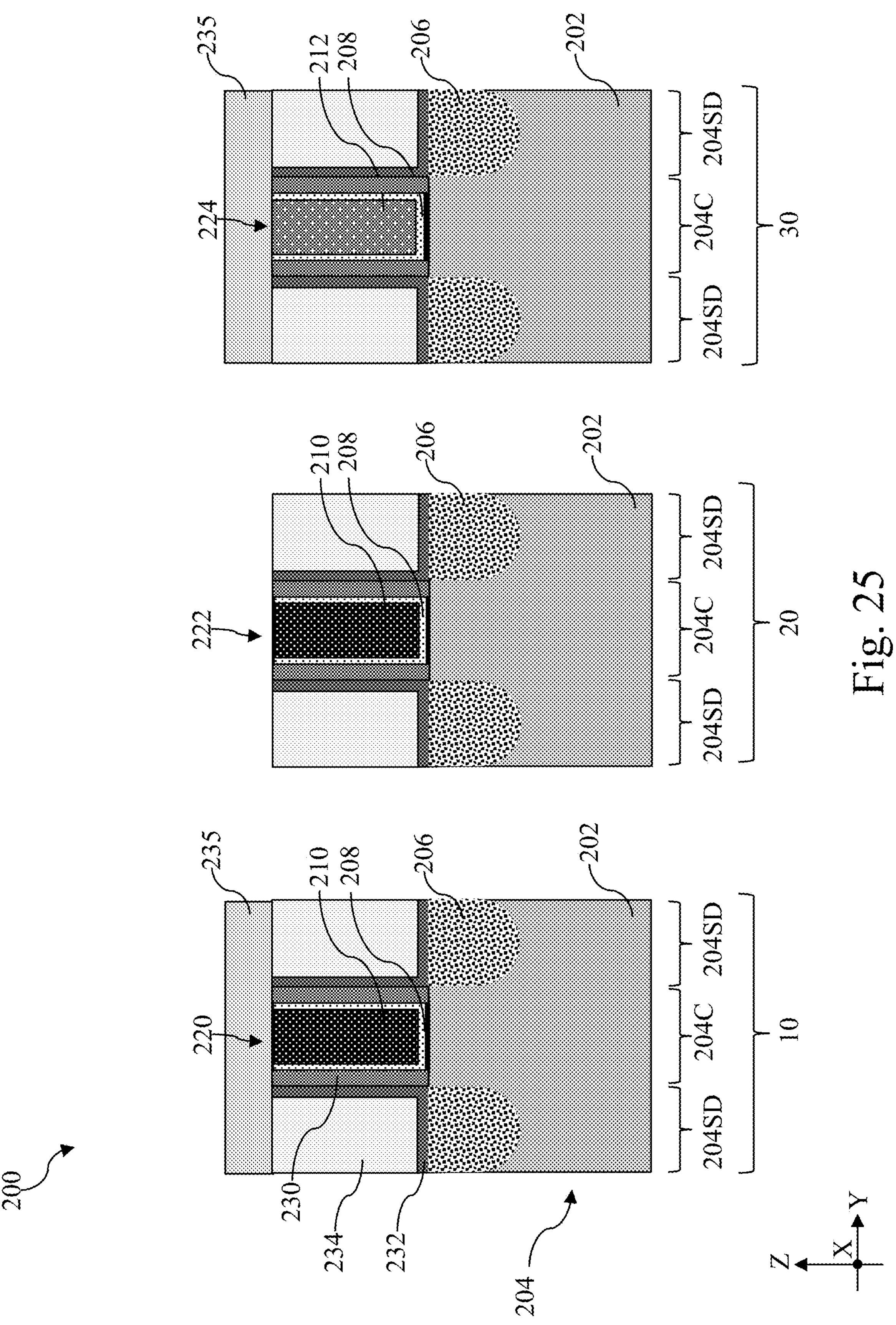
FIGS. 25-30 are fragmentary schematic cross-sectional views of a workpiece at various fabrication stages, such as those associated with the method in FIG. 24, according to various aspects of the present disclosure.
Figure 26:
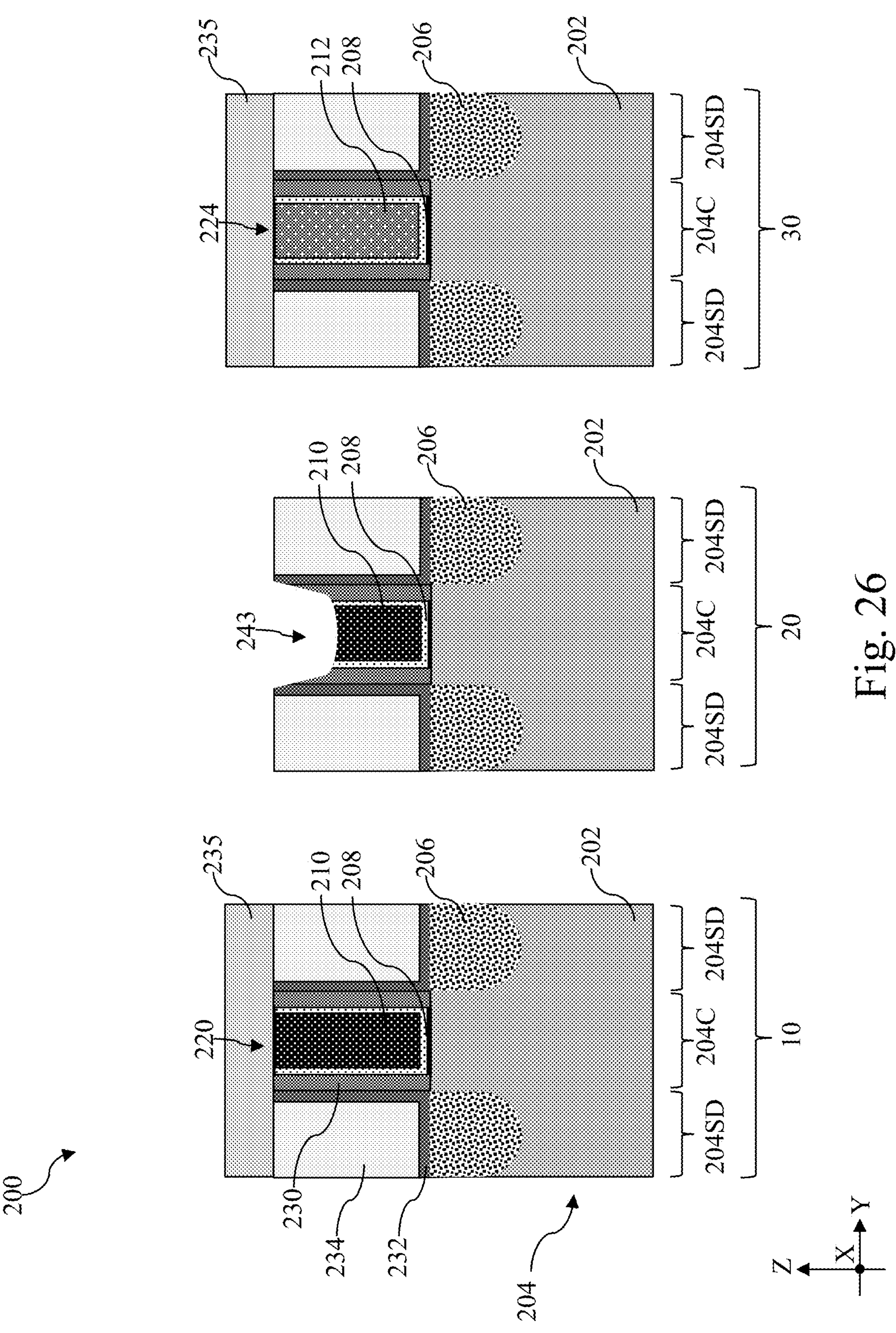

Referring to FIGS. 24, 25 and 26, method 600 includes a block 604 where the second gate structure 222 of the second transistor structure 22 is selectively recessed to form the second gate recess 243. Operations at block 604 are substantially similar to those at block 104, which was described in conjunction with FIGS. 3 and 4. For that reason, detailed description of operations at block 604 is omitted for brevity. FIGS. 25 and 26 resemble FIGS. 3 and 4 and the description of FIGS. 3 and 4 substantially apply to FIGS. 25 and 26 as well. Instead of the pilot recess 240, operations at block 604 form the second gate recess 243 as no further recessing process is intended for the second gate structure 222.

Figure 27:
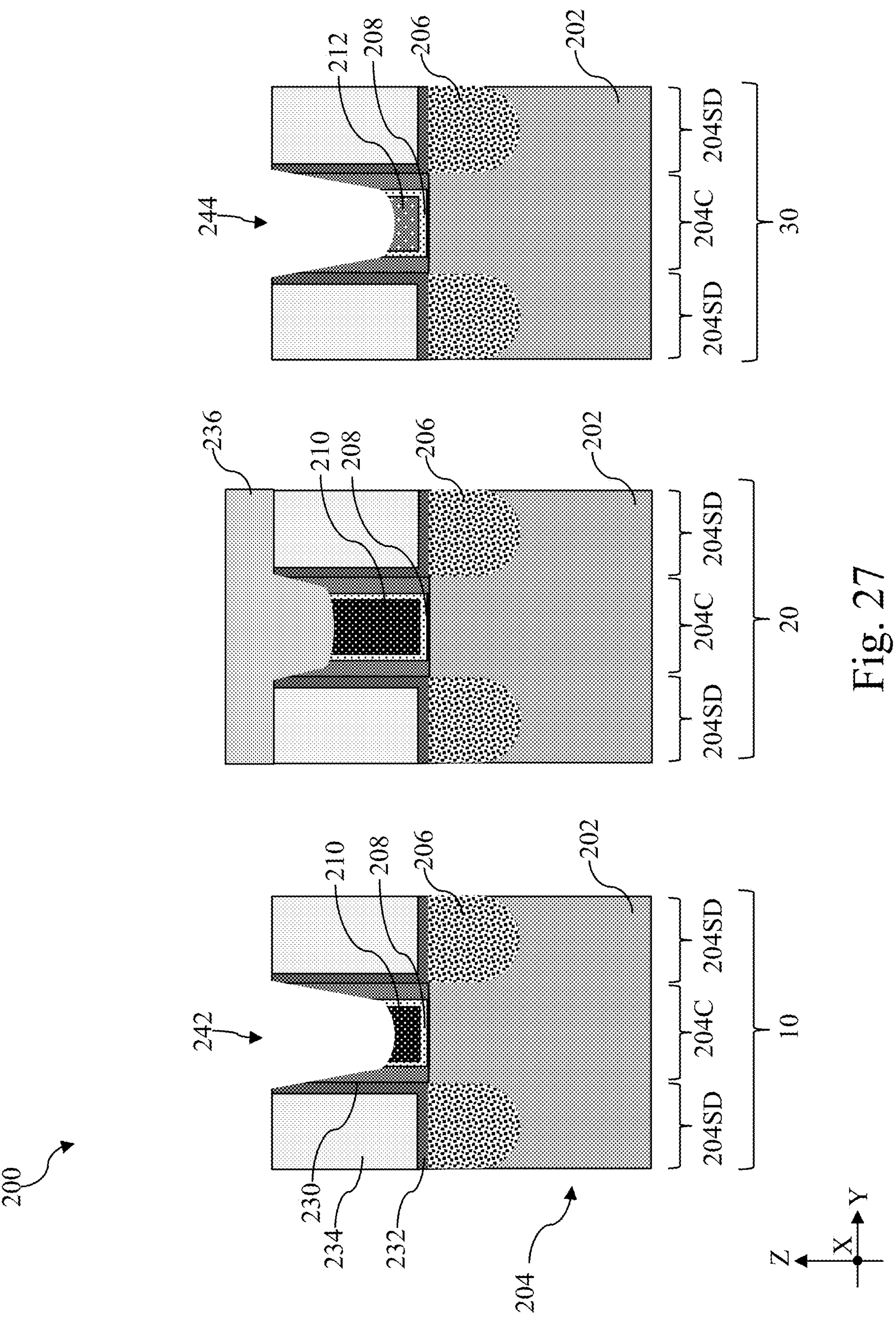
Figure 28:
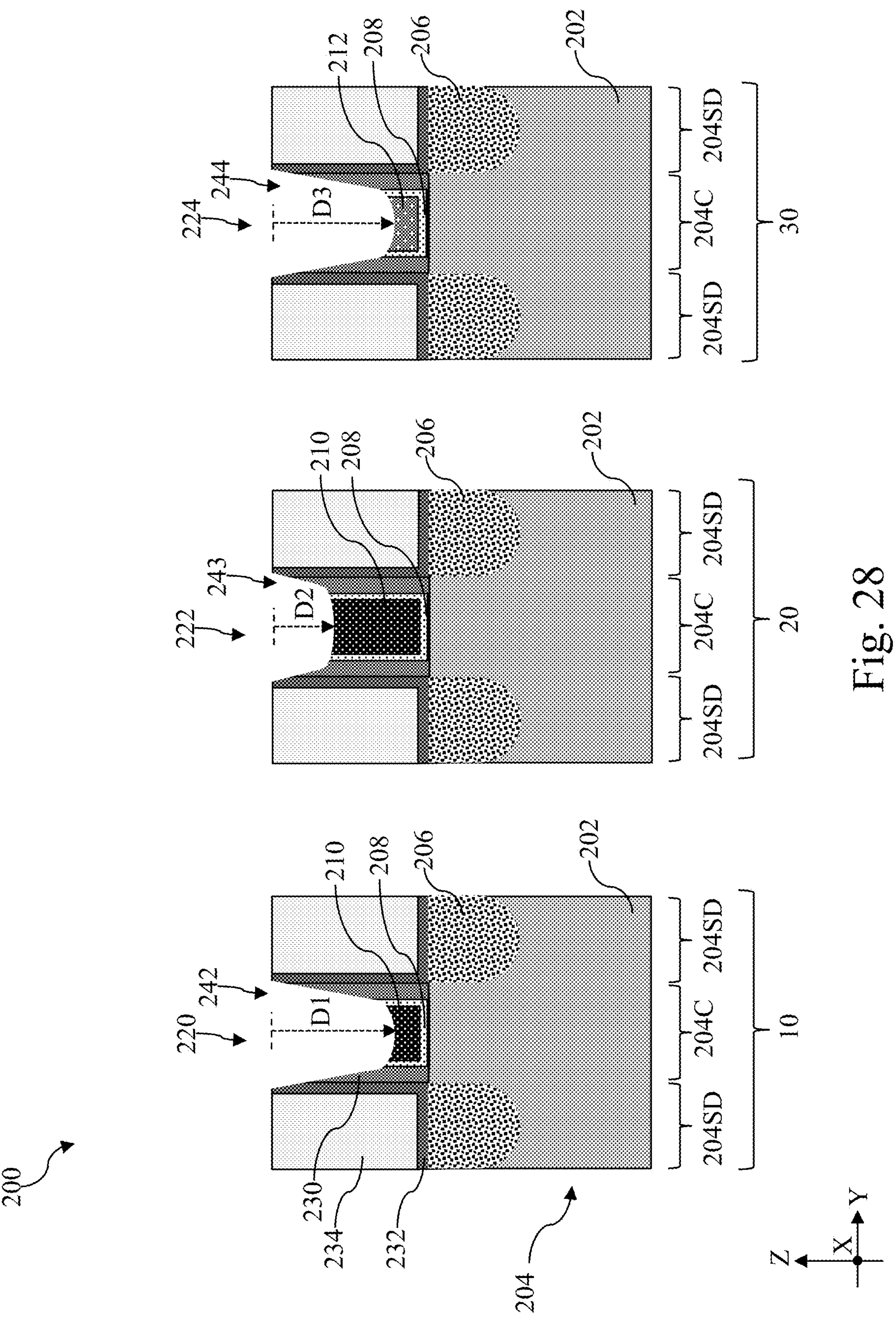

Referring to FIGS. 24, 27 and 28, method 600 includes a block 606 where the first gate structure 220 of the first transistor structure 12 and the third gate structure 224 of the third transistor structure 32 are selectively recessed to form a first gate recess 242 and a third gate recess 244. Like the selective recessing at block 604, the selective recessing at block 606 may include use of photolithography and etching processes. In the embodiments depicted in FIG. 27, a second patterned etch mask 236 is formed over the workpiece 200 to cover the second area 20 while the first area 10 and the third area 30 are exposed. The second patterned etch mask 236 may be a photoresist layer or a combination of a photoresist layer and a hard mask layer. The hard mask layer may include silicon oxide, silicon nitride, or a combination thereof. With the second patterned etch mask 236 in place, the workpiece 200 is subject to a dry etch process that etches the first gate structure 220 and the third gate structure 224 faster than it does the gate spacer layers 230, the CESL 232 and the ILD layer 234, as illustrated in FIG. 27 In some implementations, the dry etch process at block 606 may include a chlorine-containing species (e.g., $BCl_3$, $SiCl_4$, $Cl_2$), a fluorine-containing species (e.g., $CF_4$, or $SF_6$), a bromine-containing species (e.g., HBr), oxygen ($O_2$), or nitrogen ($N_2$). In some example dry etch processes, a flow rate for boron trichloride ($BCl_3$) may be between about 0 standard cubic centimeter per minute (SCCM) and about 1000 SCCM, a flow rate for chorine ($Cl_2$) may be between about 0 SCCM and about 1000 SCCM, a flow rate for hydrogen bromide (HBr) may be between about 0 SCCM and about 400 SCCM, a flow rate for silicon tetrachloride ($SiCl_4$) may be between about 0 SCCM and about 100 SCCM, a flow rate for oxygen ($O_2$) may be between about 0 SCCM and about 100 SCCM, a flow rate for nitrogen ($N_2$) may be between about 0 SCCM and about 100 SCCM, a flow rate for carbon tetrafluoride ($CF_4$) may be between about 0 SCCM and about 100 SCCM, and a flow rate for sulfur hexafluoride ($SF_6$) may be between about 0 SCCM and about 50 SCCM. In some implementations, a radio frequency (RF) power for the dry etch process at block 606 may be between 300 W and about 1800 W and a bias power for the dry etch process may be between about 0 W and about 100 W. As shown in FIG. 27, the recessing at block 606 forms a first gate recess 242 over the first gate structure 220 and a third gate recess 244 over the third gate structure 224. After the formation of first gate recess 242 and the third gate recess 244, the second patterned etch mask 236 over the second area 20 is removed by, for example, ashing or selective etching.

In some embodiments represented in FIG. 28, the selective recessing at block 606 is performed such that the first gate recess 242 and the third gate recess 244 are deeper than the second gate recess 243. In FIG. 28, the first gate recess 242 has a first depth D1, the second gate recess 243 has a second depth D2 and the third gate recess 244 has a third depth D3. In the depicted embodiments, the second depth D2 is smaller than the first depth D1 or the third depth D3 and the first depth D1 may be very similar to the third depth D3 as the recessing at block 606 etches the n-type work function layer 210 and the p-type work function layer 212 at substantially the same rate. Conversely, due to the greater first depth D1, a height of the second gate structure 222 is made greater than a height of the first gate structure 220 or the third gate structure 224. In terms of consumption of work function layer, the first gate structure 220 and the third gate structure 224 is subject to additional etching. As a result, a threshold-voltage-determining species in the first gate structure 220, such as aluminum, is consumed more. As between the first transistor structure 12 and the second transistor structure 22, which are both n-type transistor structures, the first transistor structure 12 may have a higher threshold voltage due to the additional consumption of aluminum in the first gate structure 220.

Figure 29:
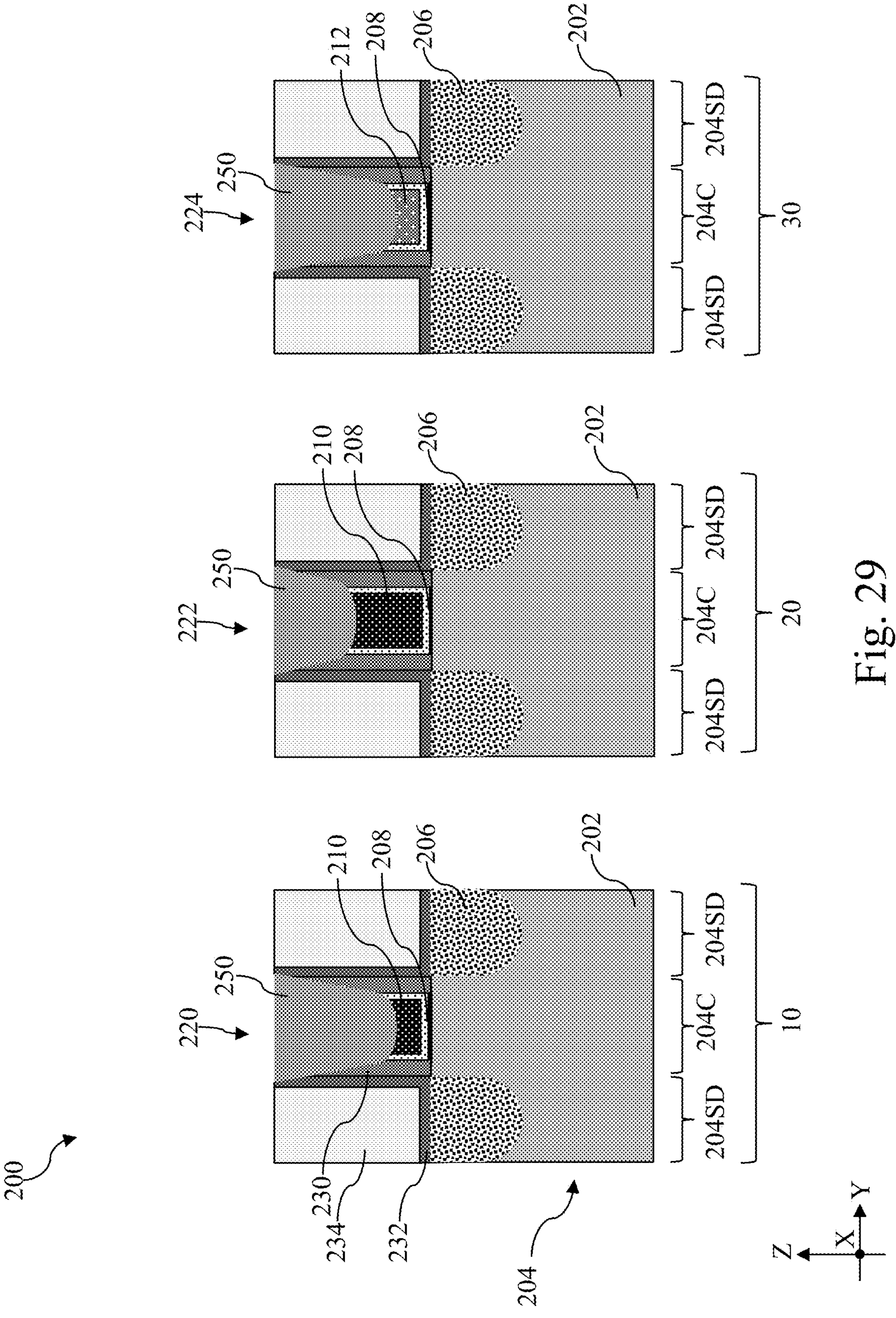

Referring to FIGS. 24 and 29, method 600 includes a block 608 where a cap layer 250 is deposited over the first gate recess 242, the second gate recess 243 and the third gate recess 244. Operations at block 608 are substantially similar to those at block 108, which was described in conjunction with FIG. 6. For that reason, detailed description of operations at block 608 is omitted for brevity. FIG. 29 resembles FIG. 6 and the description of FIG. 29 substantially applies to FIG. 29 as well. As shown in FIG. 29, the cap layer 250 over the first gate structure 220 and the third gate structure 224 is thicker than the cap layer 250 over the second gate structure 222.

Figure 30:
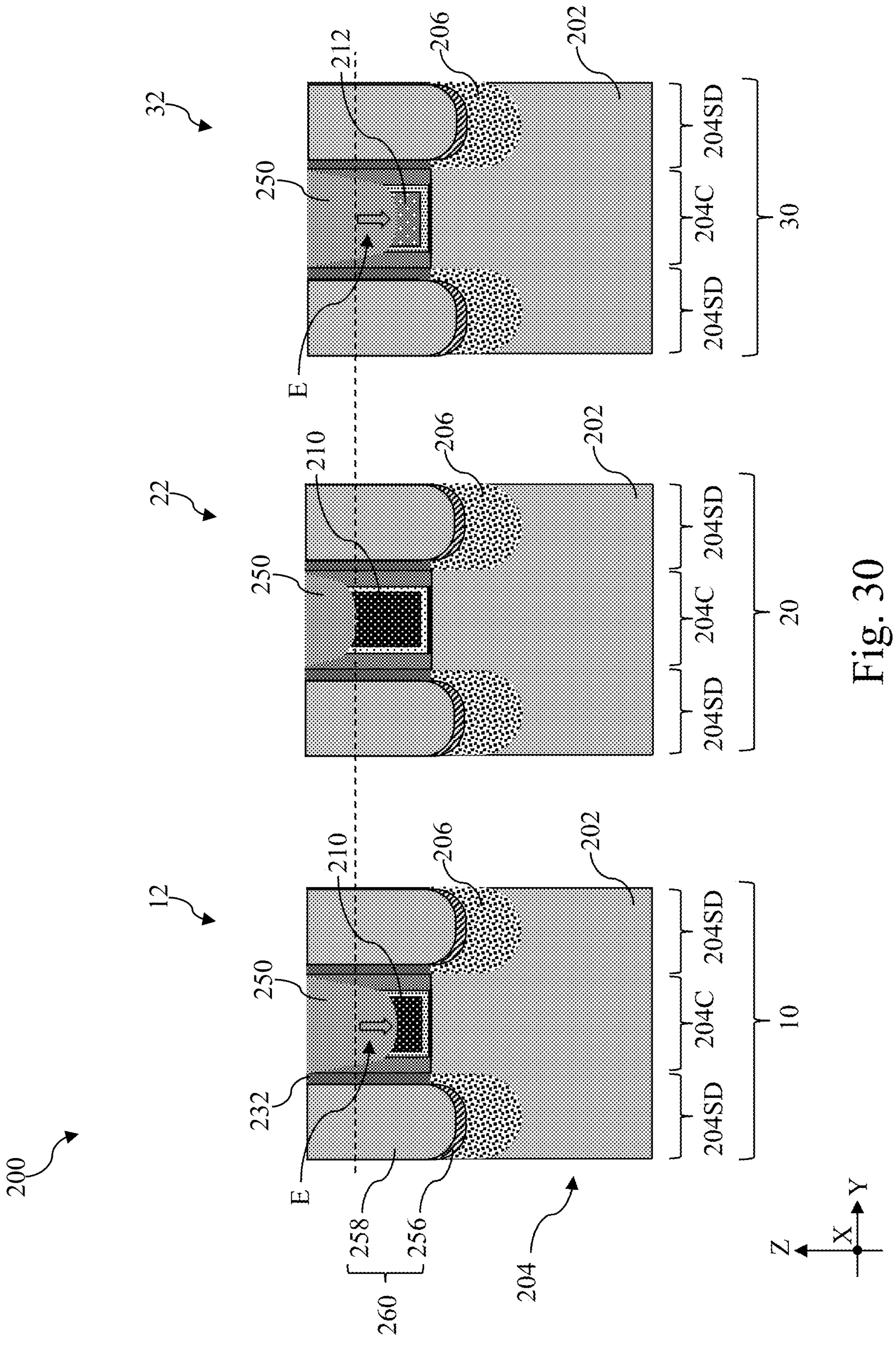

Referring to FIGS. 24 and 30, method 600 includes a block 610 where the source/drain contacts 260 are formed. Operations at block 610 are substantially similar to those at block 110, which was described in conjunction with FIG. 7. For that reason, detailed description of operations at block 610 is omitted for brevity. FIG. 30 resembles FIG. 7 and the description of FIG. 7 substantially applies to FIG. 30 as well. As indicated by the dotted line across the first gate structure 220, the second gate structure 222 and the third gate structure 224, the second gate structure 222 has a gate height greater than those of the first gate structure 220 and the third gate structure 224 by a gate height difference E.

Figure 31:
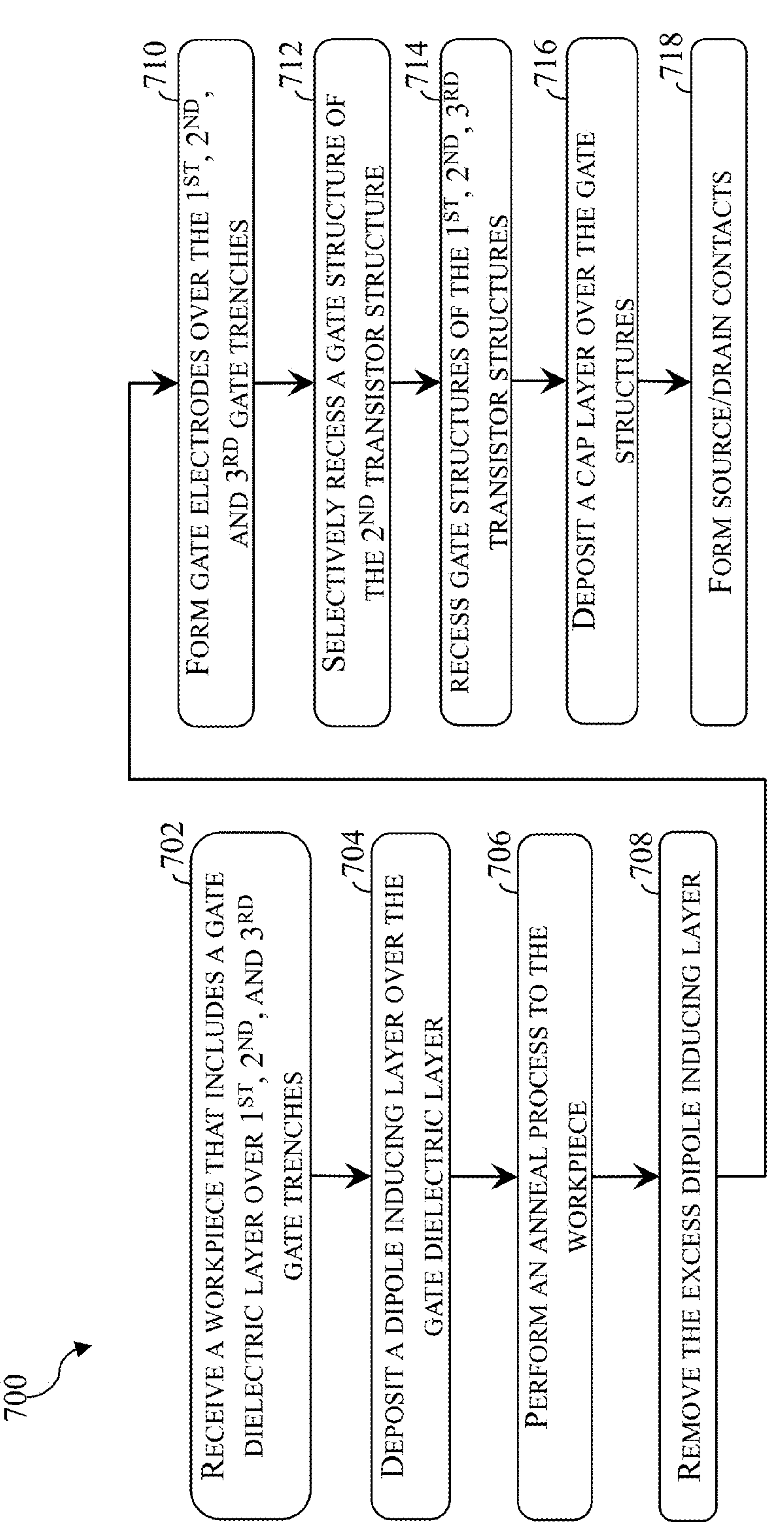
FIG. 31 is a flowchart of a method for fabricating transistors having different threshold voltages, according to various aspects of the present disclosure.
Figure 32:
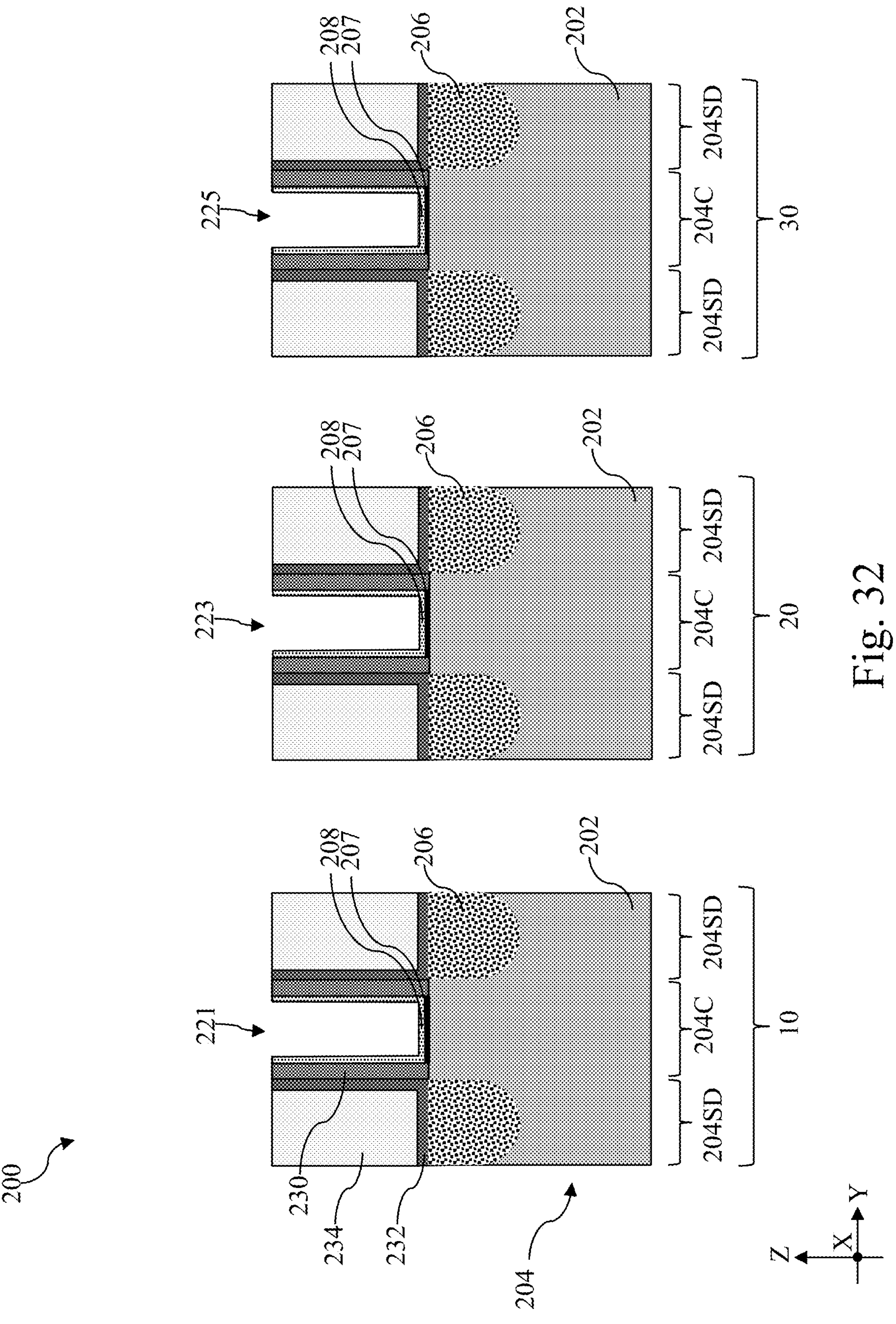
FIGS. 32-40 are fragmentary schematic cross-sectional views of a workpiece at various fabrication stages, such as those associated with the method in FIG. 31, according to various aspects of the present disclosure.

Referring to FIGS. 31 and 32, method 700 includes a block 702 where a workpiece 200 that includes a first transistor structure 12 over a first area 10, a second transistor structure 22 over a second area 20, and a third transistor structure 32 over a third area 30. The workpiece 200 illustrated in FIG. 32 is similar to that shown in FIG. 2 in many aspect. However, unlike the workpiece 200 in FIG. 2, the workpiece 200 in FIG. 32 does not include the n-type work function layer 210 or the p-type work function layer 212 formed over the channel regions 204C in the first area 10, the second area 20 and the third area 30. Instead, the workpiece 200 in FIG. 32 includes a first gate trench 221 over the first area 10, a second gate trench 223 over the second area 20, and a third gate trench 225 over the third area 30. Each of the first gate trench 221, the second gate trench 223 and the third gate trench 225 exposes the gate dielectric layer 208, which is disposed on the interfacial layer 207.

Figure 33:
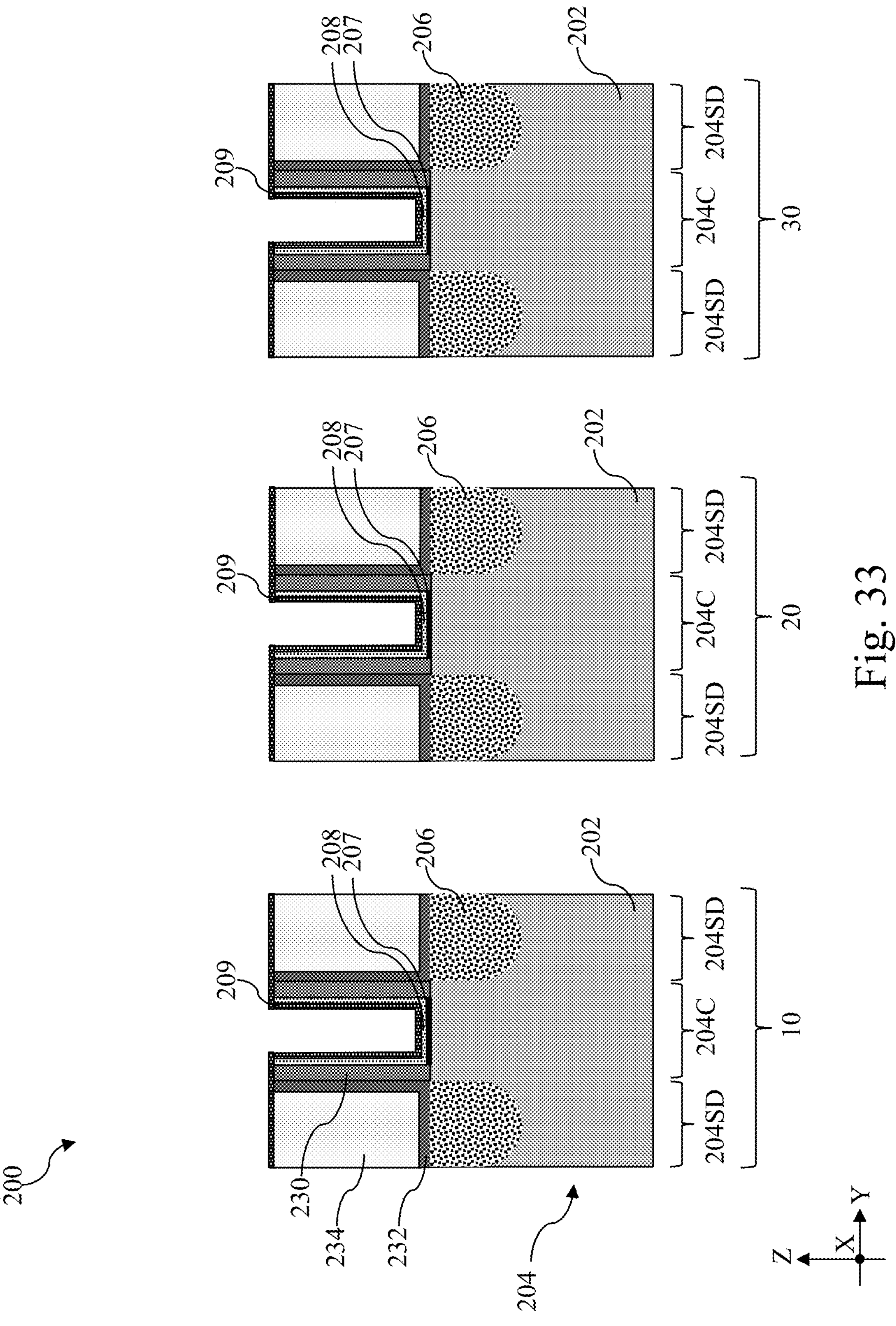

Referring to FIGS. 31 and 33, method 700 includes a block 704 where a dipole inducing layer 209 is deposited over the gate dielectric layer 208. In some embodiments, the dipole inducing layer 209 includes aluminum oxide, zirconium oxide, zinc oxide, yttrium oxide, or lanthanum oxide. Out of these materials, aluminum oxide and zirconium oxide may create a dipole moment that tends to lower threshold voltage for p-type devices while zinc oxide, yttrium oxide, or lanthanum oxide may create a dipole moment that tends to lower threshold voltage for n-type devices. The dipole inducing layer 209 may be deposited using ALD, remote plasma ALD (RPALD), or CVD. In some instances, the dipole inducing layer 209 may have a thickness between about 10 Å and about 60 Å. As illustrated in FIG. 32, the dipole inducing layer 209 may be conformally deposited over surfaces of the gate dielectric layer 208, the ILD layer 234, the CESL 232, and the gate spacer layers 230.

Figure 34:
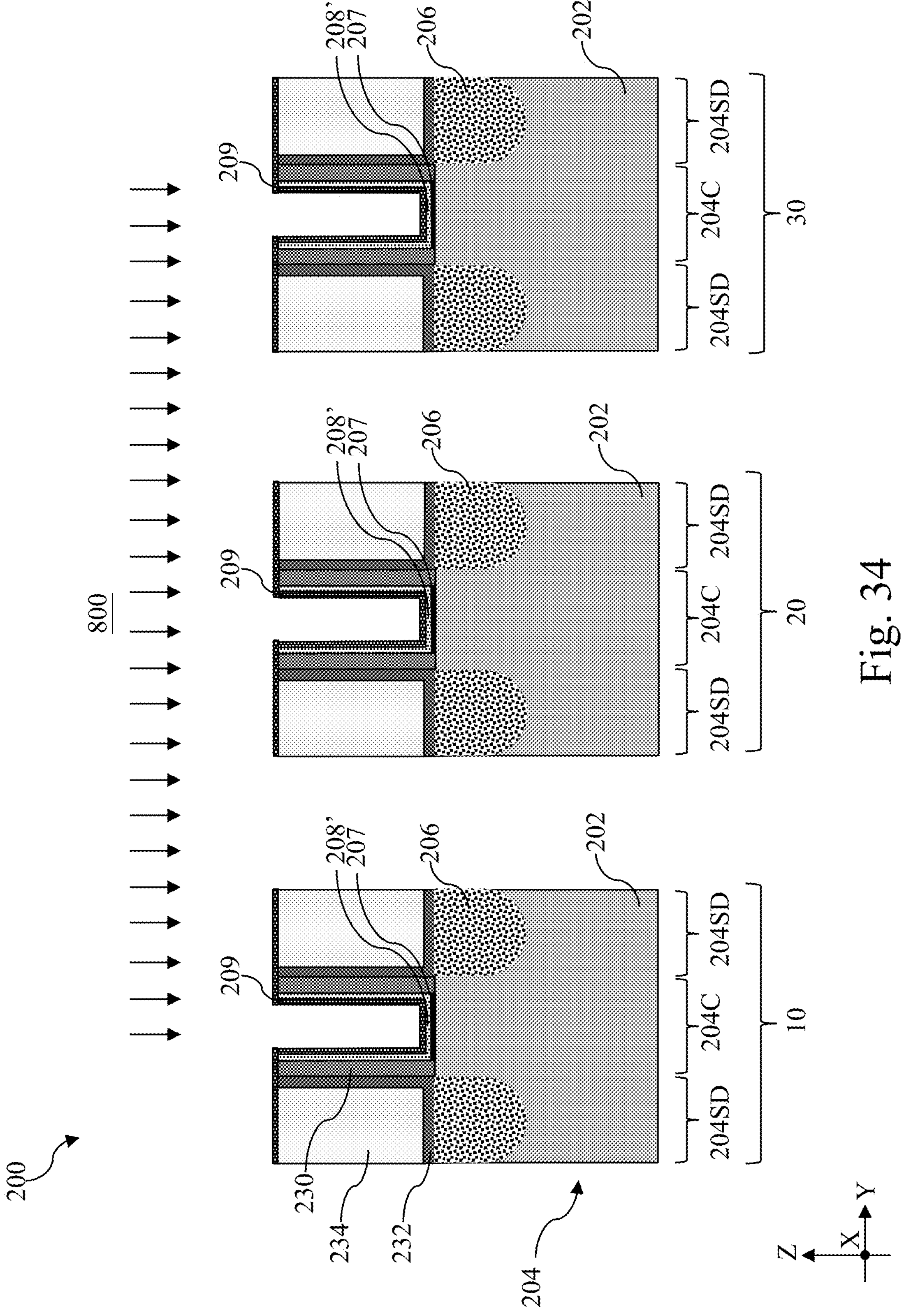

Referring to FIGS. 31 and 34, method 700 includes a block 706 where an anneal process 800 is performed to the workpiece 200. In some embodiments, the anneal process 800 includes a temperature between about 500° C. and about 900° C. to cause diffusion from the dipole inducing layer 209 into the gate dielectric layer 208. The anneal process 800 may be a rapid thermal anneal (RTA) process, a laser spike anneal process, a flash anneal process, or a furnace anneal process. After the anneal process 800 is performed, the gate dielectric layer 208 becomes dipole gate dielectric layer 208'.

Referring to FIGS. 31 and 34, method 700 includes a block 708 where excess dipole inducing layer 209 is removed. At block 708, to make room for the n-type work function layer 210 and the p-type work function layer 212, excess dipole inducing layer 209 is removed after the anneal process 800 at block 706. In some embodiments, the excess dipole inducing layer 209 may be removed using a dry etch process or a wet etch process. An excess wet etch process may include use of phosphoric acid. An example dry etch process may include use of boron trichloride ($BCl_3$), chlorine ($Cl_2$), or nitrogen ($N_2$).

Figure 35:
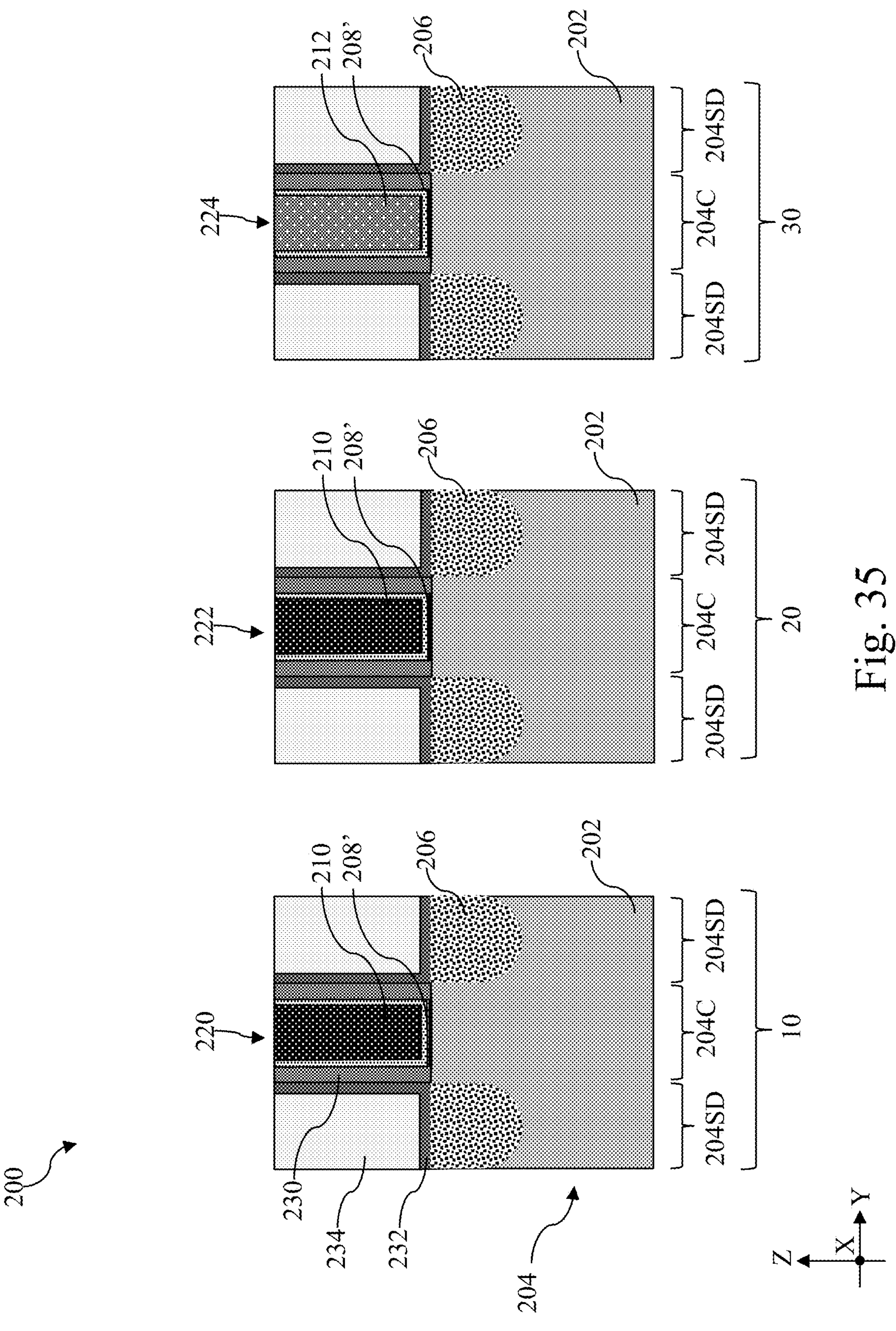

Referring to FIGS. 31 and 35, method 700 includes a block 710 where gate electrodes are formed over the first gate trench 221, the second gate trench 223, and the third gate trench 225. In some embodiments represented in FIG. 35, the n-type work function layer 210 is deposited over the first gate trench 221 and the second gate trench 223 and the p-type work function layer 212 is deposited over the third gate trench 225. As a result, the first gate structure 220 and the second gate structure 222 include the n-type work function layer 210 and the third gate structure 224 includes the p-type work function layer 212. The n-type work function layer 210 may include titanium aluminum (TiAl), titanium aluminum nitride (TiAlN), tantalum aluminum carbide (TaAlC), titanium aluminum carbide (TiAlC), silicon-doped tantalum aluminum carbide (TaAlC:Si), silicon-doped titanium aluminum carbide (TiAlC:Si) or a combination thereof. The p-type work function layer 212 may include titanium nitride (TiN), tantalum nitride (TaN), tantalum carbonitride (TaCN), tungsten carbonitride (WCN), titanium silicon nitride (TiSiN), tantalum silicon nitride (TaSiN), or tantalum carbide (TaC). While not explicitly shown, each of the first gate structure 220, the second gate structure 222 and the third gate structure 224 may further include a metal fill layer over the n-type work function layer 210 or the p-type work function layer 212. The metal fill layer may include aluminum (Al), tungsten (W), nickel (Ni), titanium (Ti), ruthenium (Ru), cobalt (Co), platinum (Pt), other refractory metals, or other suitable metal materials or a combination thereof. The metal fill layer and the respective work function layer may be collectively referred to as a gate electrode.

Figure 36:
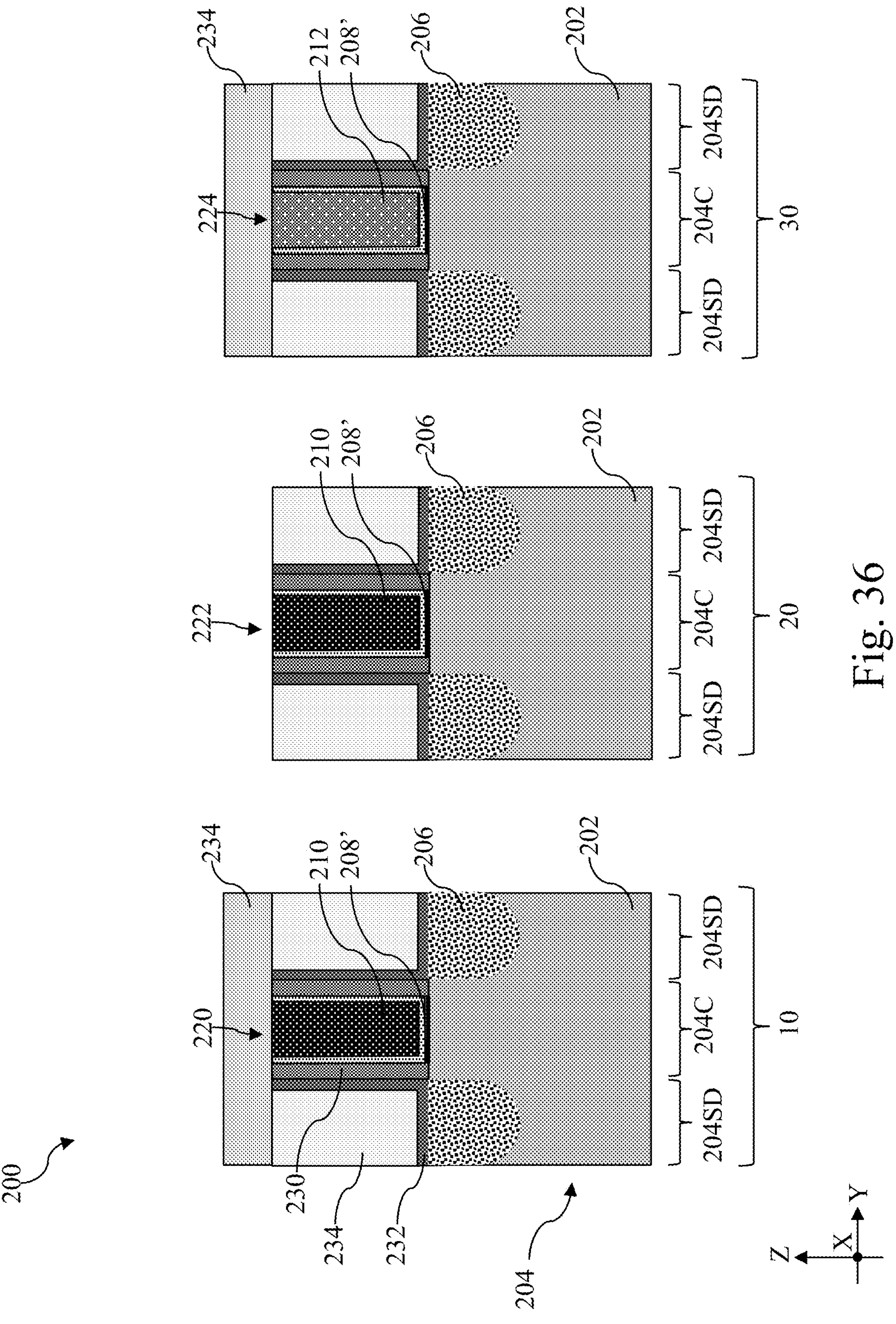
Figure 37:
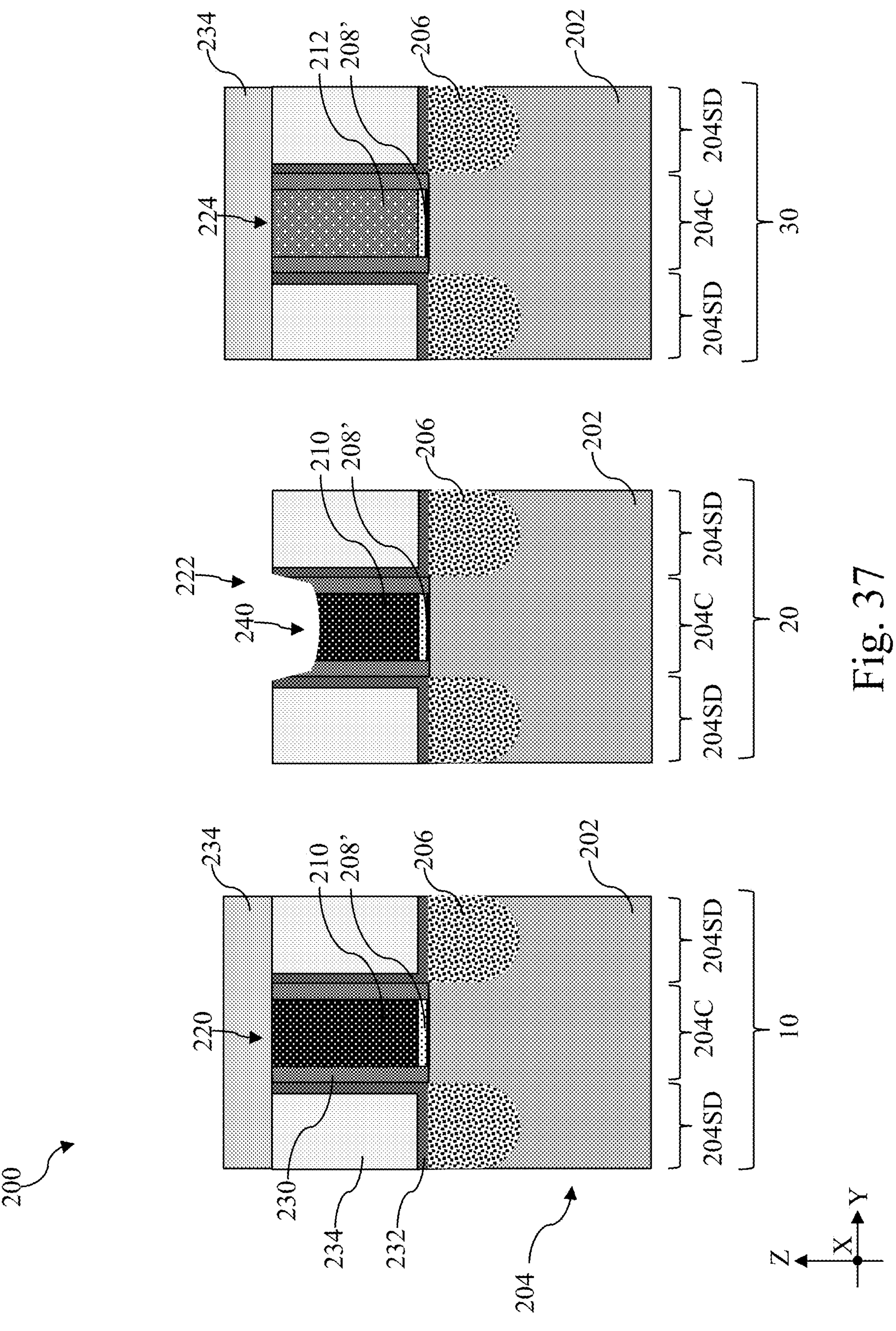

Referring to FIGS. 31, 36 and 37, method 700 includes a block 712 where the second gate structure 222 of the second transistor structure 22 is selectively recessed. Operations at block 712 are substantially similar to those at block 104, which was described in conjunction with FIGS. 3 and 4. For that reason, detailed description of operations at block 712 is omitted for brevity. FIGS. 36 and 37 resemble FIGS. 3 and 4 and the description of FIGS. 3 and 4 substantially apply to FIGS. 36 and 37 as well. It is noted that each of the first gate structure 220, the second gate structure 222 and the third gate structure 224 in FIG. 37 includes the dipole gate dielectric layer 208'.

Figure 38:
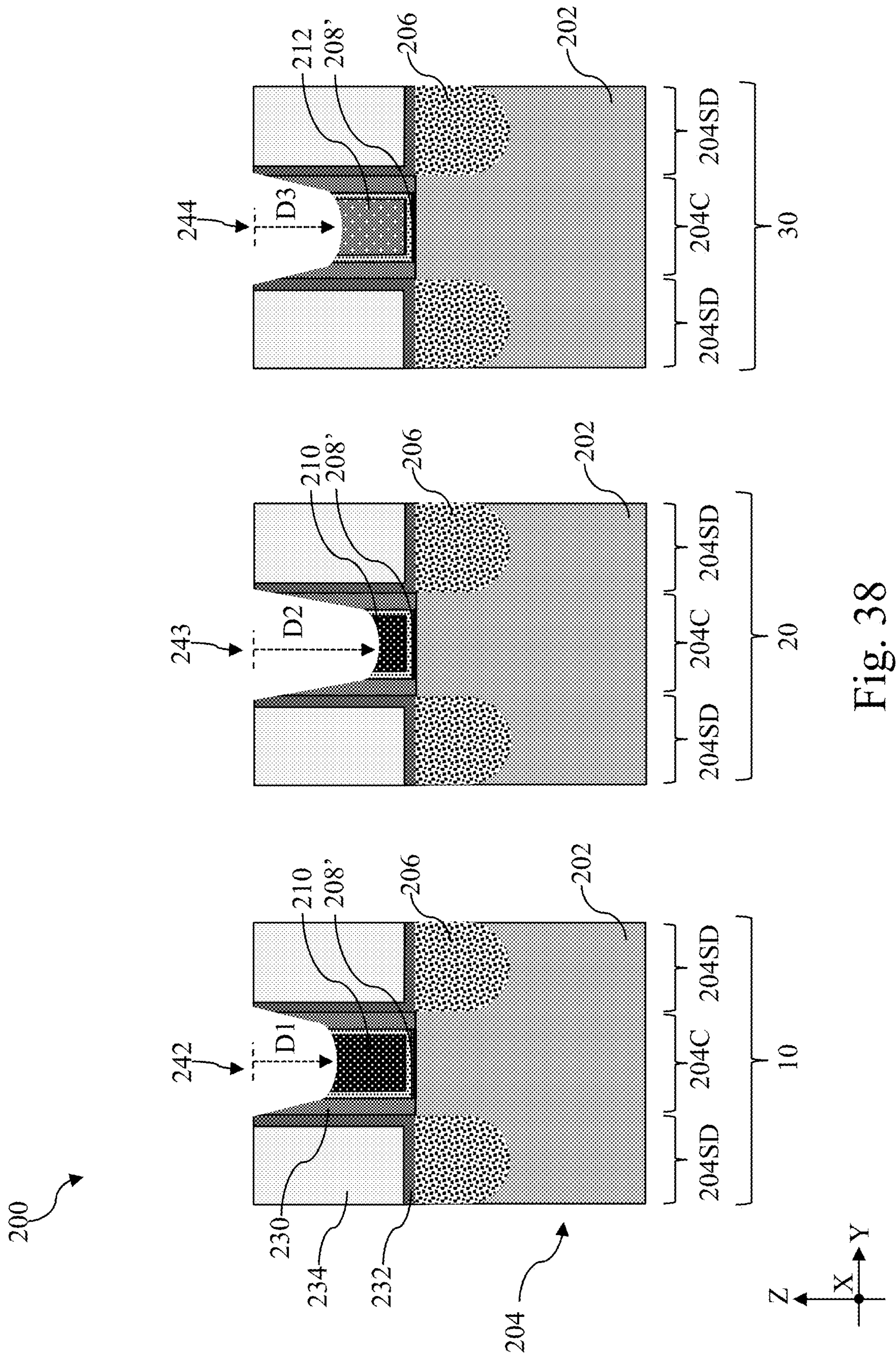

Referring to FIGS. 31 and 38, method 700 includes a block 714 where the first gate structure 220 of the first transistor structure 12, the second gate structure 222 of the second transistor structure 22, and the third gate structure 224 of the third transistor structure 32 are globally recessed to form a first gate recess 242, a second gate recess 243 and a third gate recess 244. Operations at block 714 are substantially similar to those at block 106, which was described in conjunction with FIG. 5. For that reason, detailed description of operations at block 714 is omitted for brevity. Different from what is shown in FIG. 5, each of the first gate structure 220, the second gate structure 222 and the third gate structure 224 in FIG. 37 includes the dipole gate dielectric layer 208'.

Figure 39:
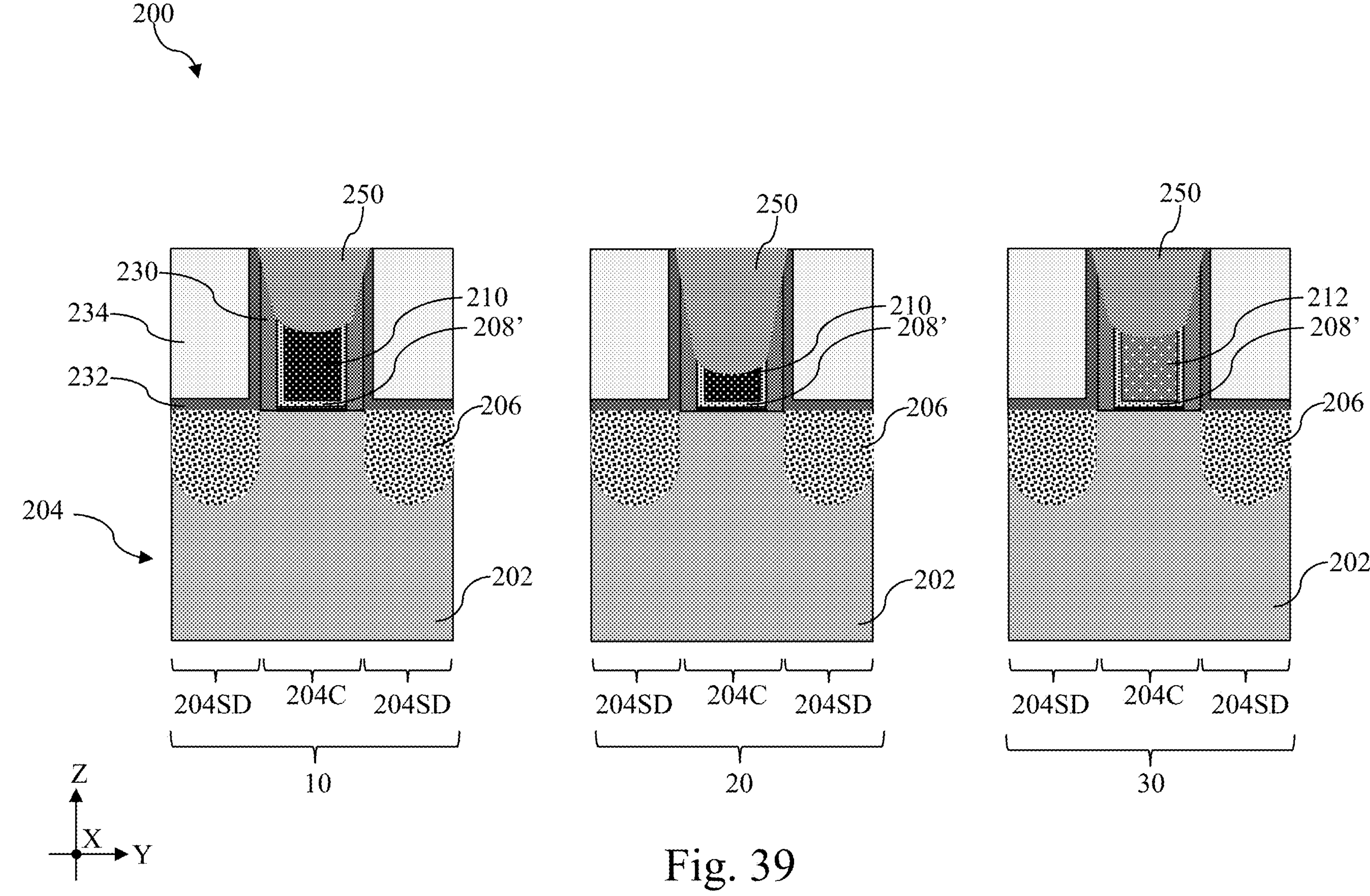

Referring to FIGS. 31 and 39, method 700 includes a block 716 where a cap layer 250 is deposited over the first gate recess 242, the second gate recess 243 and the third gate recess 244. Operations at block 716 are substantially similar to those at block 108, which was described in conjunction with FIG. 6. For that reason, detailed description of operations at block 716 is omitted for brevity. FIG. 39 resembles FIG. 6 and the description of FIG. 6 substantially applies to FIG. 39 as well.

Figure 40:
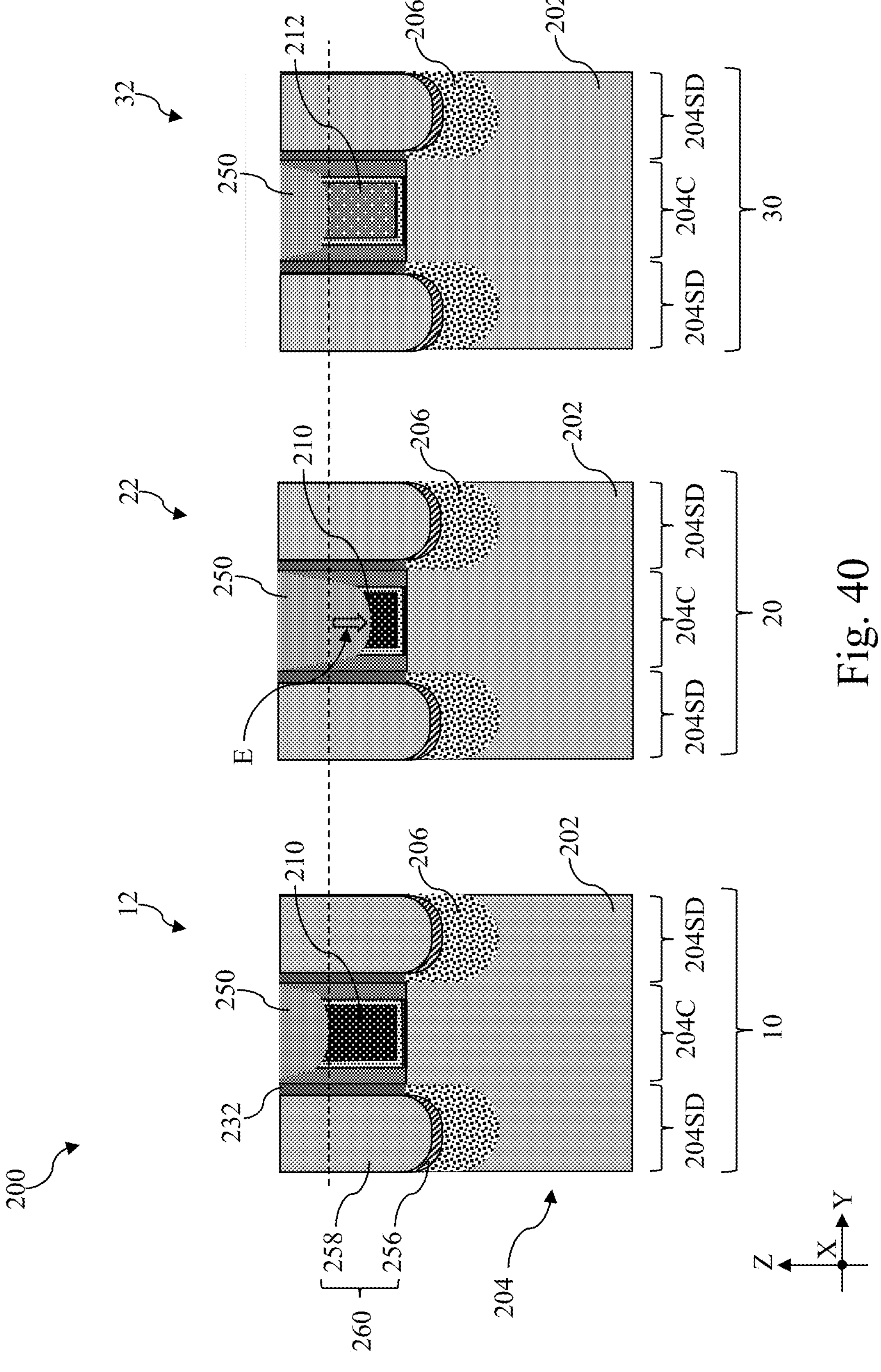

Referring to FIGS. 31 and 40, method 700 includes a block 718 where the source/drain contacts 260 are formed. Operations at block 718 are substantially similar to those at block 110, which was described in conjunction with FIG. 7. For that reason, detailed description of operations at block 718 is omitted for brevity. FIG. 40 resembles FIG. 7 and the description of FIG. 7 substantially applies to FIG. 40 as well. As indicated by the dotted line across the first gate structure 220, the second gate structure 222 and the third gate structure 224, the second gate structure 222 has a gate height smaller than those of the first gate structure 220 and the third gate structure 224 by a gate height difference E. In some instances, the gate height difference E may be between about 3 nm and about 14 nm.

Figure 41:
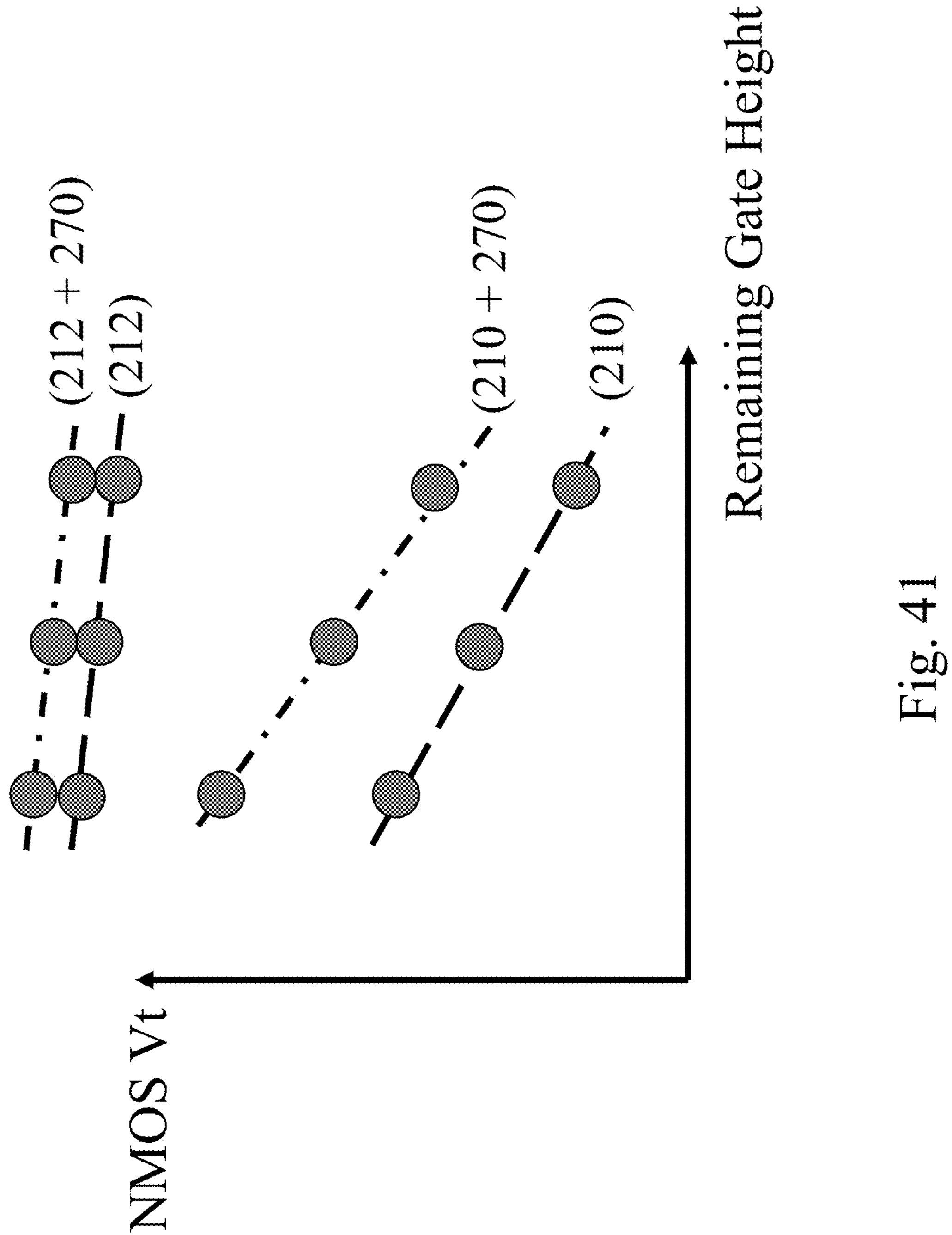
FIG. 41 illustrates a line chart summarizing effects of remaining gate heights and presence of the selective metal layer on threshold voltages (Vts) of n-type metal oxide transistors (NMOS).
Figure 42:
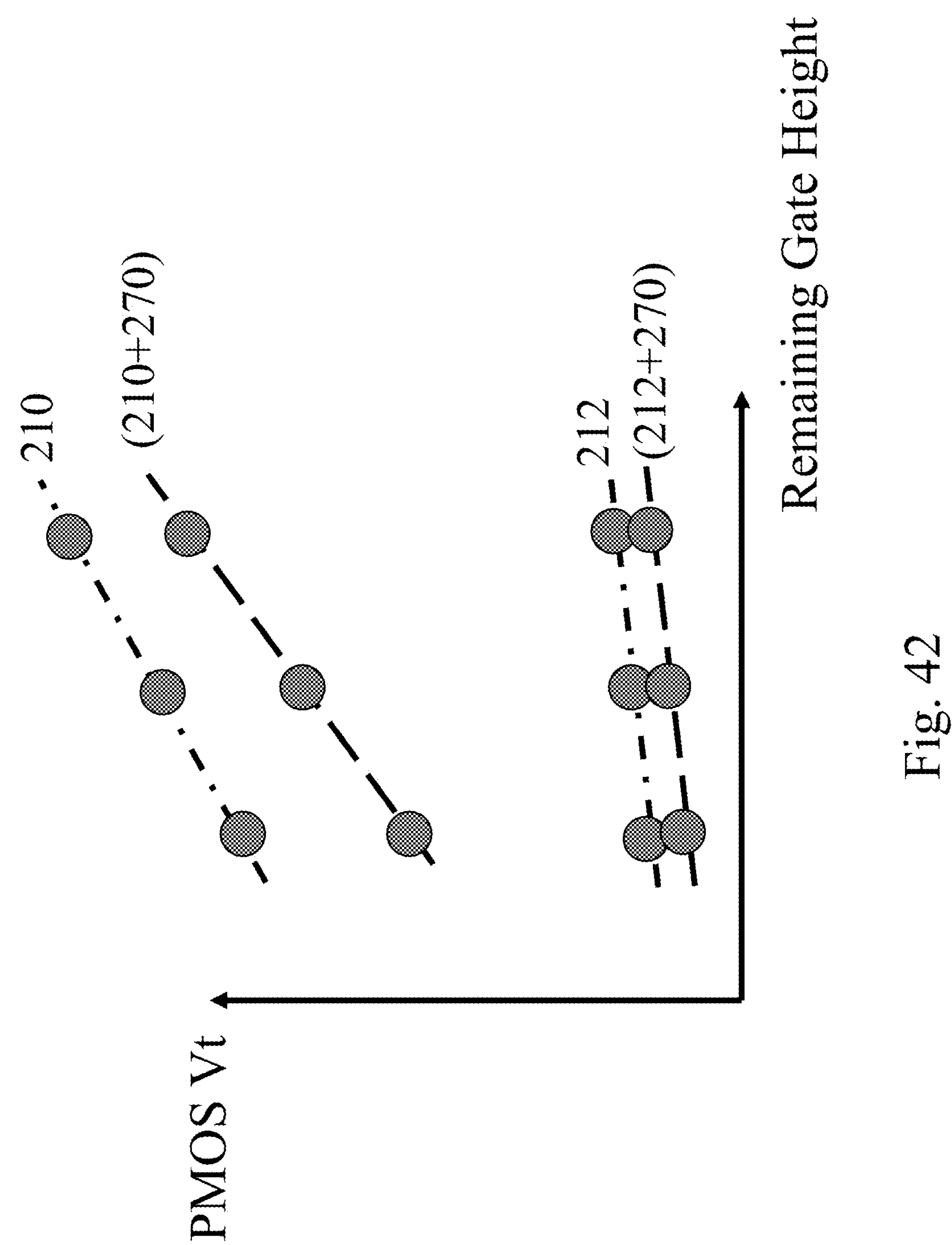
FIG. 42 illustrates a line chart summarizing effects of remaining gate heights and presence of the selective metal layer on threshold voltages (Vts) of p-type metal oxide transistors (NMOS).

Effects of gate heights and presence of the selective metal layer 270 with respect to the n-type work function layer 210 or the p-type work function layer 212 may be summarized in the line charts in FIGS. 41 and 42. Reference is first made to FIG. 41. When the goal is to provide NMOS (i.e., n-type FinFETs or n-type MBC transistors) having different threshold voltages, the remaining gate height of a gate structure having the n-type work function layer 210 is proportional to threshold voltage reduction. The presence of the selective metal layer 270 over the n-type work function layer 210 has the effect of increasing the threshold voltages. When the p-type work function layer 212 is used in the gate structures, the threshold voltage is increased. When the selective metal layer 270 is formed over the p-type work function layer 212, the threshold voltage of the NMOS is increased even more. It is noted that in general, the recessing of the n-type work function layer or the p-type work function layer has the effect of increasing the threshold voltage level of the NMOS.

Reference is then made to FIG. 42. When the goal is to provide PMOS (i.e., p-type FinFETs or p-type MBC transistors) having different threshold voltages, the remaining gate height of a gate structure having the p-type work function layer 212 is proportional to threshold voltage increase. The presence of the selective metal layer 270 over the p-type work function layer 212 has the effect of reducing the threshold voltages. When the n-type work function layer 210 is used in the gate structures, the threshold voltage is increased. When the selective metal layer 270 is formed over the n-type work function layer 210, the threshold voltage of the PMOS is increased even more. It is noted that in general, the recessing of the n-type work function layer or the p-type work function layer has the effect of reducing the threshold voltage level of the PMOS.

Figure 43:
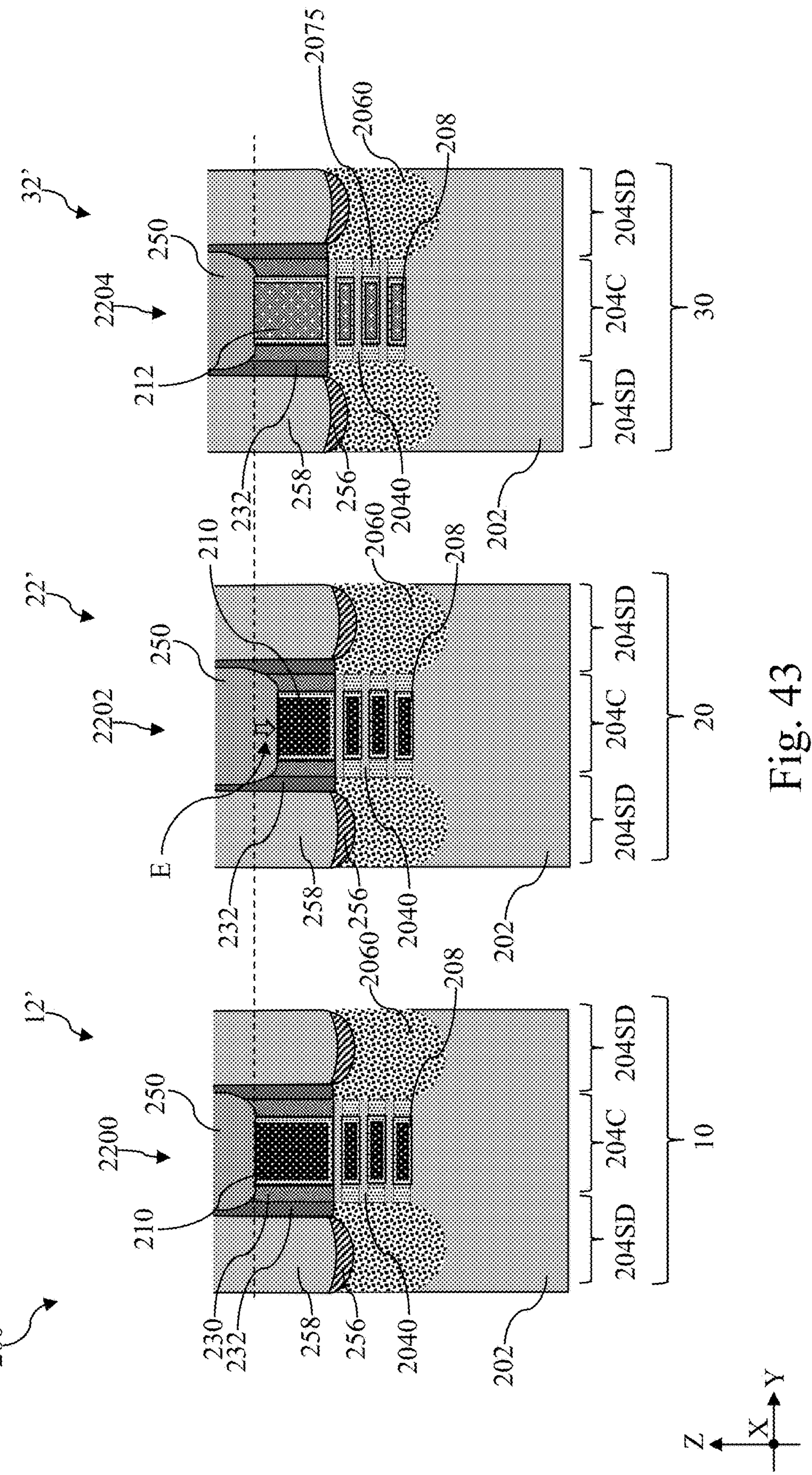
FIG. 43 representatively illustrates how all embodiments of the present disclosure may be readily implementable to MBC transistors.

While operations in methods 100, 300, 400, 500, 600, and 700 are described with reference to FinFETs, it should be understood that the various methods and processes may be applied to MBC transistors. For example, FIG. 43 illustrates a first MBC transistor 12', a second MBC transistor 22', and a third MBC transistor 32' that are formed using method 100. The first MBC transistor 12' includes a first MBC gate structure 2200 wrapping around each of the nanostructures 2040. The nanostructures 2040 are vertically stacked over the channel region 204C in the first area 10. Along the Y direction, the nanostructures 2040 extend between two MBC source/drain features 2060. Along the Y direction, the first MBC gate structure 2200 is spaced apart from the MBC source/drain features 2060 by a plurality of inner spacer features 2075. The second MBC transistor 22' includes a second MBC gate structure 2202 wrapping around each of the nanostructures 2040. The nanostructures 2040 are vertically stacked over the channel region 204C in the second area 20. Along the Y direction, the nanostructures 2040 extend between two MBC source/drain features 2060. Along the Y direction, the second MBC gate structure 2202 is spaced apart from the MBC source/drain features 2060 by a plurality of inner spacer features 2075. The third MBC transistor 32' includes a third MBC gate structure 2204 wrapping around each of the nanostructures 2040. The nanostructures 2040 are vertically stacked over the channel region 204C in the third area 30. Along the Y direction, the nanostructures 2040 extend between two MBC source/drain features 2060. Along the Y direction, the third MBC gate structure 2204 is spaced apart from the MBC source/drain features 2060 by a plurality of inner spacer features 2075. Each of the first MBC gate structure 2200, the second MBC gate structure 2202 and the third MBC gate structure 2204 includes a gate dielectric layer 208 wrapping around each of the nanostructures 2040. As indicated by the dotted line across the first MBC gate structure 2200, the second MBC gate structure 2202 and the third MBC gate structure 2204, the second MBC gate structure 2202 has a gate height smaller than those of the first MBC gate structure 2200 and the third MBC gate structure 2204 by a gate height difference E. In some instances, the gate height difference E may be between about 3 nm and about 14 nm.

The present disclosure provides for many different embodiments. In one embodiment, a semiconductor structure is provided. The semiconductor structure includes a substrate, a first active region, a second active region and a third active region over the substrate, a first gate structure over a channel region of the first active region, a second gate structure over a channel region of the second active region, a third gate structure over a channel region of the third active region, a first cap layer over the first gate structure, a second cap layer over the second gate structure, and a third cap layer over the third gate structure. A height of the second gate structure is smaller than a height of the first gate structure or a height of the third gate structure.

In some embodiments, the first gate structure and the second gate structure include an n-type work function metal layer and the third gate structure includes a p-type work function metal layer. In some implementations, the n-type work function metal layer includes TiAlC, TaAlC, silicon-doped TiAlC, or silicon-doped TaAlC and the p-type work function metal layer includes TiN, TaN, WCN, TiSiN, or TaSiN. In some instances, the semiconductor structure further includes a first selective metal layer disposed between the first gate structure and the first cap layer, a second selective metal layer disposed between the second gate structure and the second cap layer, and a third selective metal layer disposed between the third gate structure and the third cap layer. Te first selective metal layer, the second selective metal layer and the third selective metal layer include Ti, Ta, Al, Mo, W, Co, Cu, Ru, Mo, or Zr. In some embodiments, the first cap layer, the second cap layer and the third cap layer include silicon oxide, silicon nitride, silicon carbonitride, silicon oxycarbonitride, silicon oxycarbide, aluminum oxide, zirconium silicate, hafnium silicate, hafnium oxide, or zirconium oxide. In some embodiments, the semiconductor structure further includes a first gate dielectric layer disposed between the first active region and the n-type metal layer, and a second gate dielectric layer disposed between the third active region and the p-type metal layer. In some instances, the first gate dielectric layer includes lanthanum, zinc, or yttrium and the second gate dielectric layer includes aluminum or zirconium. In some embodiments, a thickness of the third cap layer is greater than a thickness of the first cap layer or a thickness of the second cap layer.

In another embodiment, a method is provided. The method includes receiving a workpiece that includes a first active region, a second active region and a third active region over a substrate, a first gate structure over a channel region of the first active region, a second gate structure over a channel region of the second active region, and a third gate structure over a channel region of the third active region, selectively recessing the second gate structure, after the selectively recessing, recessing the first gate structure, the second gate structure, and the third gate structure to form a first gate recess over the first gate structure, a second gate recess over the second gate structure, and a third gate recess over the third gate structure, after the recessing, depositing a dielectric cap layer over the first gate recess, the second gate recess, and the third gate recess, and after the depositing, planarizing the workpiece to reduce a thickness of the dielectric cap layer.

In some embodiments, the selectively recessing the second gate structure includes forming a patterned photoresist layer over the first gate structure and the second gate structure while the second gate structure is exposed, and etching the second gate structure using the patterned photoresist layer as an etch mask. In some implementations, each of the first gate structure and the second gate structure includes an n-type work function metal layer and the third gate structure includes a p-type work function metal layer. In some instances, the n-type work function metal layer includes TiAlC, TaAlC, silicon-doped TiAlC, or silicon-doped TaAl and the p-type work function metal layer includes TiN, TaN, WCN, TiSiN, or TaSiN. In some instances, the dielectric cap layer includes silicon oxide, silicon nitride, silicon carbonitride, silicon oxycarbonitride, silicon oxycarbide, aluminum oxide, zirconium silicate, hafnium silicate, hafnium oxide, or zirconium oxide. In some embodiments, the method further includes before the depositing of the dielectric cap layer, depositing a selective metal layer over the first gate recess, a second gate recess, and the third gate recess. The selective metal layer includes Ti, Ta, Al, Mo, W, Co, Cu, Ru, Mo, or Zr. In some instances, the recessing includes use of $BCl_3$, $Cl_2$, HBr, $SiCl_4$, $O_2$, $N_2$, $CF_4$, or $SF_6$. In some implementations, the recessing includes a power between about 300 W and about 1800 W. In some embodiments, the recessing includes a bias power between about 0 W and about 100 W.

In yet another embodiment, a method is provided. The method includes receiving a workpiece that includes a first gate structure over a first area, the first gate structure including a first work function metal layer, a second gate structure over a second area, the second gate structure including the first work function metal layer, and a third gate structure over a third area, the third gate structure including a second work function metal layer, recessing the first gate structure, the second gate structure, and the third gate structure to form a first gate recess, a second gate recess, and a third gate recess, after the recessing, depositing a dielectric cap layer over the first gate recess, the second gate recess, and the third gate recess, and after the depositing, planarizing the workpiece to reduce a thickness of the dielectric cap layer. The recessing includes etching the third gate structure faster such that the third gate recess is deeper than the first gate recess or the second gate recess.

In some embodiments, the first work function metal layer includes TiAlC, TaAlC, silicon-doped TiAlC, or silicon-doped TaAlC and the second work function metal layer includes TiN, TaN, WCN, TiSiN, or TaSiN. In some instances, the method may further include before the depositing of the dielectric cap layer, depositing a selective metal layer over the first gate recess, a second gate recess, and the third gate recess. The selective metal layer includes Ti, Ta, Al, Mo, W, Co, Cu, Ru, Mo, or Zr.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:

receiving a workpiece comprising:

a first active region, a second active region and a third active region over a substrate, a first gate structure over a channel region of the first active region, a second gate structure over a channel region of the second active region, and a third gate structure over a channel region of the third active region;

selectively recessing the second gate structure;

after the selectively recessing, recessing the first gate structure, the second gate structure, and the third gate structure to form a first gate recess over the first gate structure, a second gate recess over the second gate structure, and a third gate recess over the third gate structure;

after the recessing, depositing a dielectric cap layer over the first gate recess, the second gate recess, and the third gate recess; and after the depositing, planarizing the workpiece to reduce a thickness of the dielectric cap layer, wherein the first gate structure comprises a gate dielectric layer and a first work function layer over the gate dielectric layer, wherein the second gate structure comprises the gate dielectric layer and a second work function layer over the gate dielectric layer, wherein the third gate structure comprises the gate dielectric layer and a third work function layer over the gate dielectric layer, wherein a composition of the third work function layer is different from a composition of the first work function layer or a composition of the second work function layer, wherein each of the first work function layer and the second work function layer is an n-type work function metal layer, wherein the third work function layer is a p-type work function metal layer.

2. The method of claim 1, wherein the selectively recessing the second gate structure comprises:

forming a patterned photoresist layer over the first gate structure and the third gate structure while the second gate structure is exposed; and etching the second gate structure using the patterned photoresist layer as an etch mask.

3. The method of claim 1, wherein the n-type work function metal layer comprises TiAlC, TaAlC, silicon-doped TiAlC, or silicon-doped TaAlC, wherein the p-type work function metal layer comprises TiN, TaN, WCN, TiSiN, or TaSiN.

4. The method of claim 1, wherein the dielectric cap layer comprises silicon oxide, silicon nitride, silicon carbonitride, silicon oxycarbonitride, silicon oxycarbide, aluminum oxide, zirconium silicate, hafnium silicate, hafnium oxide, or zirconium oxide.

5. The method of claim 1, further comprising:

before the depositing of the dielectric cap layer, depositing a selective metal layer over the first gate recess, the second gate recess, and the third gate recess, wherein the selective metal layer comprises Ti, Ta, Al, Mo, W, Co, Cu, Ru, Mo, or Zr, wherein each of the first gate structure, the second gate structure and the third gate structure are disposed between two gate spacers, wherein the selectively recessing and the recessing etches the two gate spacers at a slower rate such that top surfaces of the two gate spacers are higher than top surfaces of the first work function layer, the second work function layer and the third work function layer, wherein, after the depositing of the selective metal layer, a top surface of the selective metal layer is lower than the top surfaces of the two gate spacers.

6. The method of claim 1, wherein the recessing comprises use of $BCl_3$, $Cl_2$, HBr, $SiCl_4$, $O_2$, $N_2$, $CF_4$, or $SF_6$.

7. The method of claim 6, wherein the recessing comprises a power between about 300 W and about 1800 W.

8. The method of claim 6, wherein the recessing comprises a bias power between about OW and about 100 W.

9. The method of claim 1, wherein a depth of the second gate recess is greater than a depth of the first gate recess or a depth of the third gate recess.

10. A method, comprising:

receiving a workpiece comprising:

a first active region, a second active region and a third active region over a substrate, a first gate structure over a channel region of the first active region, a second gate structure over a channel region of the second active region, a third gate structure over a channel region of the third active region, and a pair of gate spacers disposed along sidewalls of each of the first gate structure, the second gate structure, and the third gate structure;

selectively recessing the second gate structure to form a pilot recess;

after the selectively recessing of the second gate structure, recessing the first gate structure, the second gate structure and the third gate structure to form a first gate recess over the first gate structure, extend the pilot recess to form a second gate recess over the second gate structure, and form a third gate recess over the third gate structure, wherein the recessing etches the pair of gate spacers at a slower rate such that top surfaces of the pair of gate spacers are higher than top surfaces of the first gate structure, the second gate structure and the third gate structure;

depositing a selective metal layer over the first gate recess, the second gate recess and the third gate recess such that a top surface of the selective metal layer is lower than the top surfaces of the pair of gate spacers;

depositing a dielectric cap layer over the selective metal layer; and after the depositing, planarizing the workpiece, wherein the first gate structure comprises a gate dielectric layer and a first work function layer over the gate dielectric layer, wherein the second gate structure comprises the gate dielectric layer and a second work function layer over the gate dielectric layer, wherein the third gate structure comprises the gate dielectric layer and a third work function layer over the gate dielectric layer, wherein each of the first work function layer and the second work function layer is an n-type work function metal layer, wherein the third work function layer is a p-type work function metal layer.

11. The method of claim 10, wherein a depth of the second gate recess is greater than a depth of the first gate recess or a depth of the third gate recess.

12. The method of claim 11, wherein the depth of the first gate recess is similar to the depth of the third gate recess.

13. The method of claim 10, wherein the selectively recessing of the second gate structure comprises:

forming a first patterned photoresist layer over the first gate structure and the third gate structure while the second gate structure is exposed; and etching the second gate structure using the first patterned photoresist layer as an etch mask.

14. The method of claim 10, wherein the n-type work function metal layer comprises TiAlC, TaAlC, silicon-doped TiAlC, or silicon-doped TaAlC, wherein the p-type work function metal layer comprises TiN, TaN, WCN, TiSiN, or TaSiN.

15. The method of claim 10, wherein the dielectric cap layer comprises silicon oxide, silicon nitride, silicon carbonitride, silicon oxycarbonitride, silicon oxycarbide, aluminum oxide, zirconium silicate, hafnium silicate, hafnium oxide, or zirconium oxide.

16. The method of claim 10, wherein the selective metal layer comprises Ti, Ta, Al, Mo, W, Co, Cu, Ru, Mo, or Zr.

17. The method of claim 10, wherein the selective metal layer comprises a thickness between about 1 nm and about 8 nm.

18. A method, comprising:

receiving a workpiece comprising:

a first active region, a second active region and a third active region over a substrate, a gate dielectric layer over a channel region of the first active region, a channel region of the second active region, and a channel region of the third active region, a first source/drain feature over a source/drain region of the first active region, a second source/drain feature over a source/drain region of the second active region, and a third source/drain feature over a source/drain region of the third active region, and an interlayer dielectric (ILD) layer over the first source/drain feature, the second source/drain feature, and the third source/drain feature;

depositing a dipole inducing layer over the gate dielectric layer and the ILD layer such that the dipole inducing layer interfaces a top surface of the ILD layer;

after the depositing of the dipole inducing layer, performing an anneal process to the workpiece;

after the performing of the anneal process, removing excess of the dipole inducing layer;

after the removing, depositing a gate electrode layer over the gate dielectric layer over the channel region of the first active region, the channel region of the second active region, and the channel region of the third active region;

selectively recessing the gate electrode layer and the gate dielectric layer over the channel region of the second active region to form a pilot recess;

after the selectively recessing, recessing the gate electrode layer and the gate dielectric layer over the channel region of the first active region, the channel region of the second active region, and the channel region of the third active region to form a first gate recess, a second gate recess, and form a third gate recess, respectively;

depositing a dielectric cap layer over the first gate recess, the second gate recess and the third gate recess; and after the depositing, planarizing the workpiece, wherein the dipole inducing layer comprises aluminum oxide, zirconium oxide, zinc oxide, yttrium oxide, or lanthanum oxide.

19. The method of claim 18, wherein a depth of the second gate recess is greater than a depth of the first gate recess or a depth of the third gat recess.

20. The method of claim 18, wherein the dielectric cap layer comprises silicon oxide, silicon nitride, silicon carbonitride, silicon oxycarbonitride, silicon oxycarbide, aluminum oxide, zirconium silicate, hafnium silicate, hafnium oxide, or zirconium oxide.

* * * * *